US009748267B2

(12) United States Patent
Zhang et al.

(10) Patent No.: US 9,748,267 B2
(45) Date of Patent: Aug. 29, 2017

(54) THREE DIMENSIONAL NAND DEVICE WITH CHANNEL CONTACTING CONDUCTIVE SOURCE LINE AND METHOD OF MAKING THEREOF

(71) Applicant: SANDISK TECHNOLOGIES LLC, Plano, TX (US)

(72) Inventors: Yanli Zhang, San Jose, CA (US); Go Shoji, Yokkaichi (JP); Johann Alsmeier, San Jose, CA (US); Jayavel Pachamuthu, San Jose, CA (US); Yingda Dong, San Jose, CA (US); Jiahui Yuan, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/256,114

(22) Filed: Sep. 2, 2016

(65) Prior Publication Data

US 2016/0372482 A1 Dec. 22, 2016

Related U.S. Application Data

(62) Division of application No. 14/317,274, filed on Jun. 27, 2014, now Pat. No. 9,455,263.

(51) Int. Cl.

*H01L 21/336* (2006.01)
*H01L 29/66* (2006.01)

(Continued)

(52) U.S. Cl.

CPC .. *H01L 27/11582* (2013.01); *H01L 21/28282* (2013.01); *H01L 27/1157* (2013.01);

(Continued)

(58) Field of Classification Search

CPC ...................... H01L 27/1157; H01L 27/11529

(Continued)

(56) References Cited

U.S. PATENT DOCUMENTS 5,915,167 A 6/1999 Leedy
7,005,350 B2 2/2006 Walker et al.

(Continued)

FOREIGN PATENT DOCUMENTS

WO WO02/15277 A2 2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Calvin Lee

(74) *Attorney, Agent, or Firm* — The Marbury Law Group PLLC

(57) ABSTRACT

A NAND memory cell region of a NAND device includes a conductive source line that extends substantially parallel to a major surface of a substrate, a first semiconductor channel that extends substantially perpendicular to a major surface of the substrate, and a second semiconductor channel that extends substantially perpendicular to the major surface of the substrate. At least one of a bottom portion and a side portion of the first semiconductor channel contacts the conductive source line and at least one of a bottom portion and a side portion of the second semiconductor channel contacts the conductive source line.

25 Claims, 86 Drawing Sheets

(51) Int. Cl.

| | |
|---|---|
| ***H01L 27/11582*** | (2017.01) |
| ***H01L 27/11529*** | (2017.01) |
| ***H01L 27/1157*** | (2017.01) |
| ***H01L 27/11565*** | (2017.01) |
| ***H01L 21/28*** | (2006.01) |
| ***H01L 27/11556*** | (2017.01) |
| ***H01L 29/788*** | (2006.01) |

(52) U.S. Cl.
CPC .. *H01L 27/11529* (2013.01); *H01L 27/11556* (2013.01); *H01L 27/11565* (2013.01); *H01L 29/7883* (2013.01)

(58) Field of Classification Search
USPC ....... 438/268, 212, 209, 192, 173, 156, 138; 257/328
See application file for complete search history.

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,696,559 | B2 | 4/2010 | Arai et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,349,681 | B2 | 1/2013 | Alsmeier et al. |
| 8,394,716 | B2 | 3/2013 | Hwang et al. |
| 8,878,278 | B2 * | 11/2014 | Alsmeier ............... G11C 16/04 257/314 |
| 9,455,263 | B2 * | 9/2016 | Zhang ............... H01L 27/11529 257/328 |
| 2007/0210338 | A1 | 9/2007 | Orlowski |
| 2007/0252201 | A1 | 11/2007 | Kito et al. |
| 2009/0230449 | A1 | 9/2009 | Sakaguchi et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0199897 | A1 | 8/2012 | Chang et al. |
| 2012/0273872 | A1 | 11/2012 | Lim et al. |
| 2013/0214344 | A1 | 8/2013 | Lim et al. |
| 2013/0248974 | A1 | 9/2013 | Alsmeier et al. |
| 2013/0264631 | A1 | 10/2013 | Alsmeier et al. |
| 2015/0149413 | A1 | 5/2015 | Lee et al. |
| 2015/0179660 | A1 | 6/2015 | Yada et al. |
| 2015/0380418 | A1 | 12/2015 | Zhang et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

Notification Concerning Transmittal of International Preliminary Report on Patentability from the International Bureau for International Patent Application No. PCT/US2015/035779, mailed Jan. 5, 2017, 15 pages.

* cited by examiner

Level A
Level B
150
120
100a
100
102
103
1b
70
X
X'
Y
Y'
1
2
3
3a
3b
7
9
11
19

THREE DIMENSIONAL NAND DEVICE WITH CHANNEL CONTACTING CONDUCTIVE SOURCE LINE AND METHOD OF MAKING THEREOF

This application is a divisional of U.S. patent application Ser. No. 14/317,274, filed on Jun. 27, 2014, now U.S. Pat. No. 9,455,263 issued Sep. 27, 2016, the disclosure of which is incorporated herein in its entirety by reference.

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string are formed by a relatively difficult and time consuming process involving repeated formation of memory openings and etching of a portion of the substrate, which results in a large diameter memory opening. Use of a substrate having a relatively high electrical resistance as the source line can result in reduced cell read current, variable resistance based on the location of the memory opening, and increased source line noise.

SUMMARY

An embodiment relates to a memory cell region for a NAND device which includes a conductive source line that extends substantially parallel to a major surface of a substrate; a first semiconductor channel that extends substantially perpendicular to a major surface of the substrate; and a second semiconductor channel that extends substantially perpendicular to the major surface of the substrate; wherein at least one of a bottom portion and a side portion of the first semiconductor channel contacts the conductive source line and at least one of a bottom portion and a side portion of the second semiconductor channel contacts the conductive source line.

Another embodiment relates to a memory block comprising a substrate; a conductive source line that extends substantially parallel to a major surface of the substrate; an array comprising at least one row of monolithic three dimensional NAND strings; a first dielectric filled trench located on a first side of the array; a second dielectric filled trench located on a second side of the array opposite to the first side of the array; and a plurality of drain lines located over the array. A first source electrode is located in the first dielectric filled trench and extending substantially perpendicular to the major surface of the substrate, wherein a bottom portion of the first source electrode contacts the conductive source line; and a second source electrode is located in the second dielectric filled trench and extending substantially perpendicular to the major surface of the substrate, wherein a bottom portion of the second source electrode contacts the conductive source line. Each NAND string comprises a semiconductor channel extending substantially parallel to a major surface of the substrate, a tunnel dielectric located adjacent to an end portion of the semiconductor channel, a charge storage region located adjacent to the tunnel dielectric, a blocking dielectric located adjacent to the charge storage region, a source side select gate electrode, a gate insulating layer, a drain side select gate electrode, and a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The conductive source line is continuous in the array. At least one of a bottom portion and a side portion of the semiconductor channel contacts the conductive source line.

Another embodiment relates to a method of making a semiconductor device, comprising forming a conductive source line that extends substantially parallel to a major surface of a substrate; forming a stack of alternating layers of a first material and a second material over the conductive source line; etching the stack to form a plurality of memory openings in the stack to expose the conductive source line, wherein the plurality of memory openings extend substantially perpendicular to the major surface of the substrate; forming a plurality of charge storage regions; forming a tunnel dielectric over the charge storage regions; and forming a plurality of semiconductor channels over the tunnel dielectric in the respective plurality of memory openings in contact with the conductive source line.

Another embodiment relates to a method of making a semiconductor device, comprising forming a sacrificial source line that extends substantially parallel to a major surface of a substrate; forming a stack of alternating layers of a first material and a second material over the sacrificial source line; etching the stack to form a plurality of memory openings in the stack to expose the sacrificial source line, wherein the plurality of memory openings extend substantially perpendicular to the major surface of the substrate; forming a plurality of charge storage regions; forming a tunnel dielectric over the charge storage regions; forming a plurality of semiconductor channels over the tunnel dielectric in the respective plurality of memory openings in contact with the sacrificial source line; removing the sacrificial source line to form a source line recess; and forming a conductive source line in the source line recess in contact with the plurality of semiconductor channels.

BRIEF DESCRIPTION OF THE DRAWINGS

FIG. 1A is a side cross sectional view of the device along line Y-Y' in FIG. 1B, while FIG. 1B is a side cross sectional view of the device along line X-X' in FIG. 1A.

FIG. 1C is a side cross sectional view of the device along line Y-Y' in FIG. 1D, while FIG. 1D is a side cross sectional view of the device along line X-X' in FIG. 1C.

FIG. 2B is a side cross sectional view of the device along line B-B' in FIG. 2A, while FIG. 2C is a side cross sectional view of the device along line W-W' in FIG. 2A.

DETAILED DESCRIPTION

The embodiments of the invention provide a memory cell region for a NAND device having a substrate and a conductive source line extending substantially parallel to the substrate, where the semiconductor channel extends substantially perpendicular to the conductive source line and the bottom side and/or sidewall of the semiconductor channel contact the conductive source line. The embodiments of the invention provide a source line with decreased and uniform resistance for improved cell current, improved voltage distribution, and reduced noise, compared to lower performance prior art memory cell regions containing polysilicon channels that do not contact source lines but instead rely on the substrate to provide the electrical connection between the source line and the polysilicon channels. In addition, the methods of making the structure feature a self-aligned process integration advantage. This leads to a more efficient and robust fabrication process.

In various embodiments, the memory cell region is part of a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figures 1A, 1B, 1C, 1D:
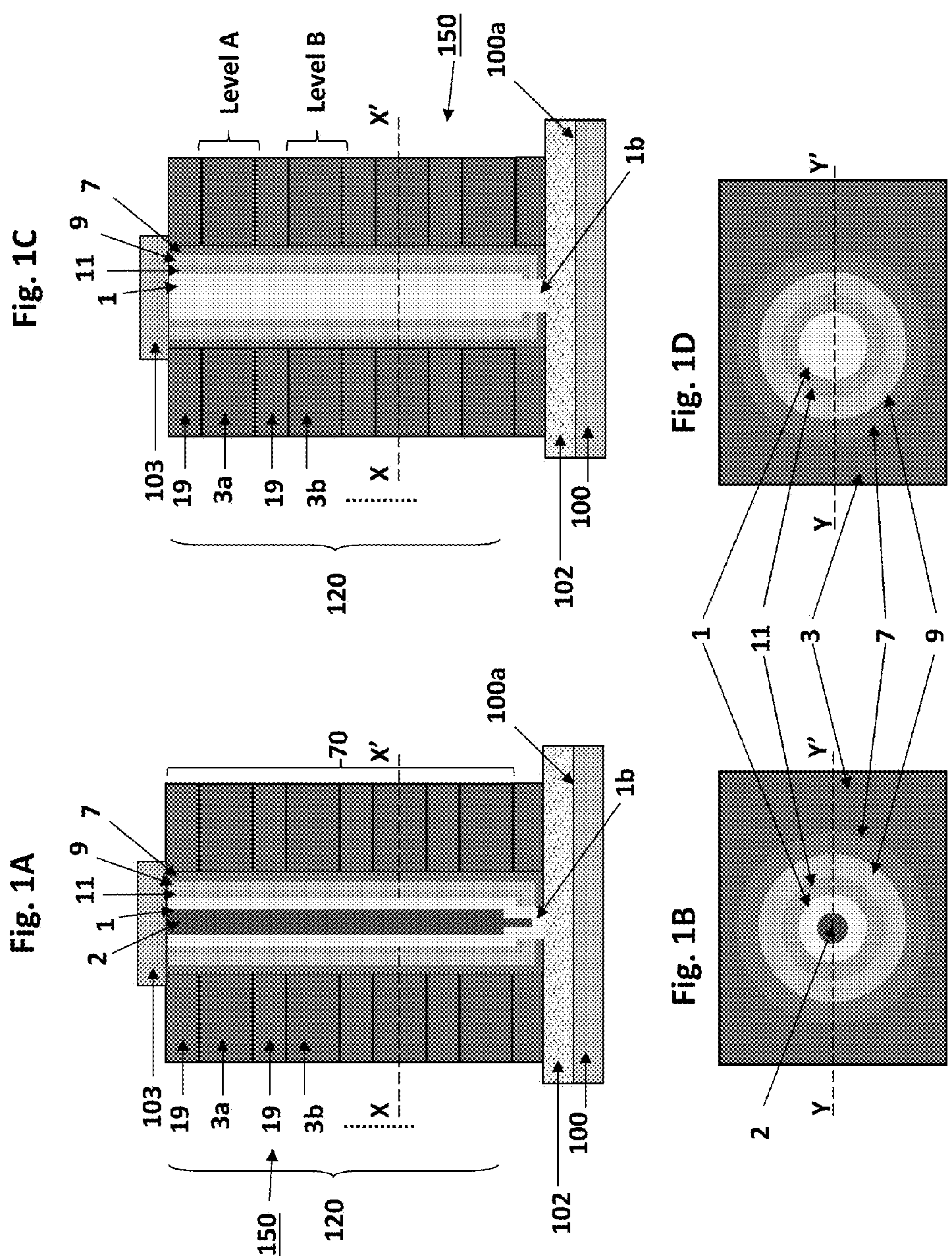
FIGS. 1A-1B are respectively side cross sectional and top cross sectional views of a NAND string of one embodiment.
FIGS. 1C-1D are respectively side cross sectional and top cross sectional views of a NAND string of another embodiment.

In some embodiments, the monolithic three dimensional NAND string 150 comprises memory device levels 70, as shown in FIG. 1A. The memory device levels 70 include a semiconductor channel 1 having at least one end portion extending substantially perpendicular to a major surface 100*a* of a substrate 100, as shown in FIGS. 1A, 1C, 1E, and 1F. For example, the semiconductor channel 1 may have a pillar shape in the memory device levels 70 and the entire pillar-shaped semiconductor channel in the memory device levels 70 extends substantially perpendicularly to the major surface of the substrate 100, as shown in FIGS. 1A, 1C, 1E, and 1F. In these embodiments, the source/drain lines of the device can include a first line 102 formed under and a second line 103 formed over the semiconductor channel 1, as shown in FIGS. 1A, 1C, 1E, and 1F.

Figure 1F:
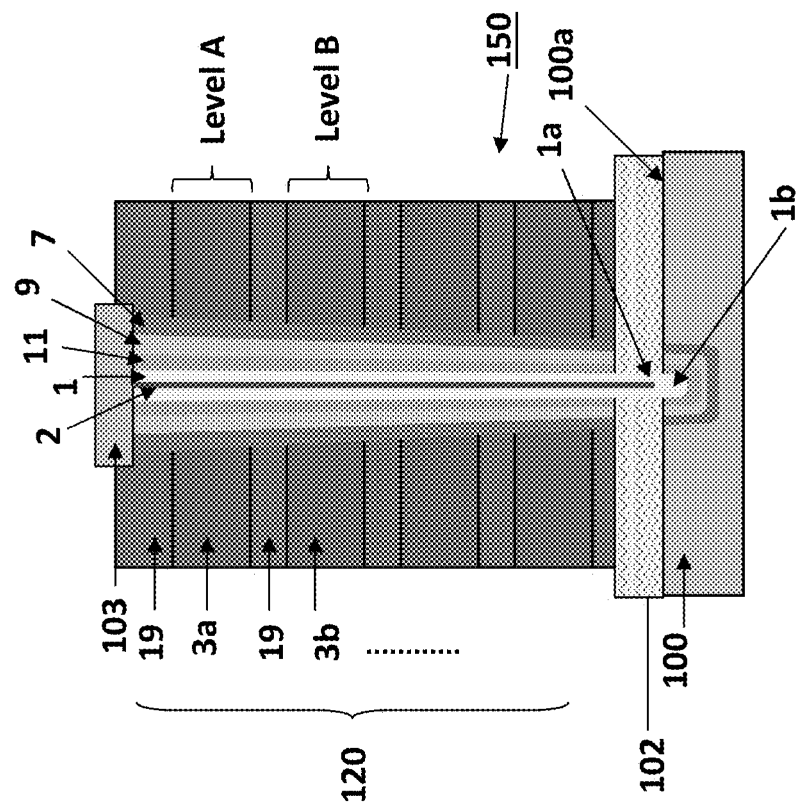
FIG. 1F is a side cross sectional view of a NAND string of another embodiment.
Figure 1E:
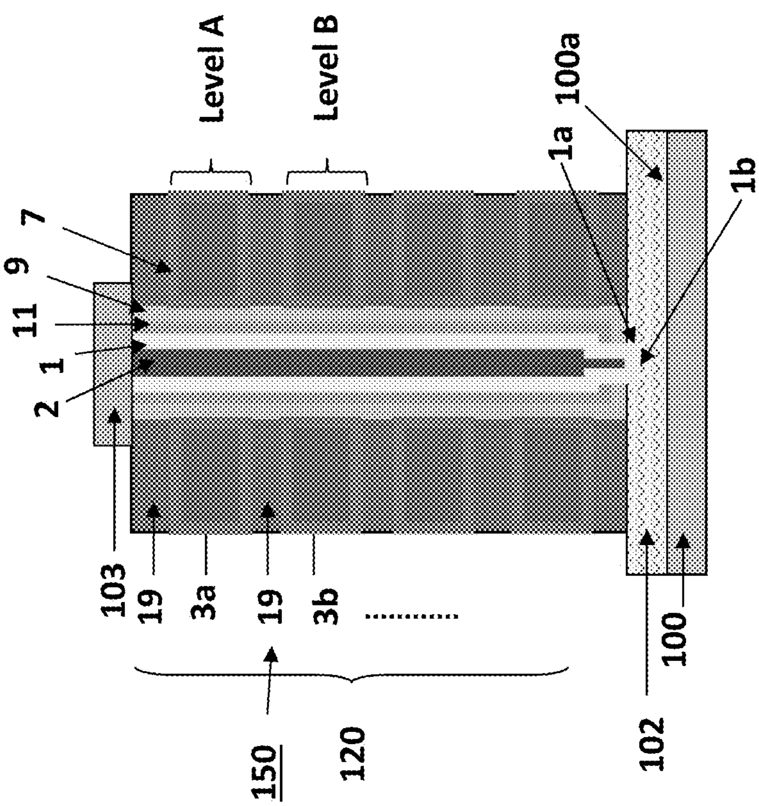
FIG. 1E is a side cross sectional view of a NAND string of another embodiment.

In some embodiments, the semiconductor channel 1 may be a filled feature, as shown in FIGS. 1C and 1D. In some other embodiments, the semiconductor channel 1 may be hollow, for example a hollow substantially cylindrical shape (e.g., tapered cylinder with increasing diameter, such as a hollow truncated cone, as shown in FIG. 1F, or a cylinder with a substantially uniform diameter as a function of height throughout most of the channel, with an optional narrow bottom portion 1*b*, as shown in FIGS. 1A, 1C, and 1E) filled with an insulating fill material 2, as shown in FIGS. 1A, 1B, 1E, and 1F. In these embodiments, an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The channels 1 are electrically connected to source line 102 having at least one end portion extending substantially parallel to the major surface 100*a* of the substrate 100, as shown in FIGS. 1A, 1C, 1E, and 1F. For example, the source line 102 may have a planar shape and the entire planar-shaped source line extends substantially parallel to the major surface of the substrate 100, as shown in FIGS. 1A, 1C, 1E, and 1F. In various embodiments, the semiconductor channel 1 comprises amorphous silicon or polysilicon having a first conductivity type (e.g., p-type), the source line 102 comprises single crystal silicon or polysilicon having a second conductivity type (e.g., n-type) and a higher doping concentration than the semiconductor channel 1, and the substrate 100 comprises a single crystal silicon substrate having a lower doping concentration than the source line 102. For example, the upper portion of the substrate 100 may include a well of the first conductivity type (e.g., p-well) below the source line 102.

In some embodiments, a bottom side 1*b* of the channel 1 contacts the source line 102, as shown in FIGS. 1A and 1C. In other embodiments, a sidewall 1*a* of the channel 1 contacts the source line 102 and the channel 1 extends past the source line 102 such that the bottom side 1*b* is located within the substrate 100, as shown in FIG. 1F. In other embodiments, a sidewall 1*a* and a bottom side 1*b* of the channel 1 contacts the source line 102, as shown in FIG. 1E.

The sidewall 1*a* of the semiconductor channel 1 comprises a first semiconductor section which extends vertically (i.e., substantially perpendicular to the major surface 100*a* of the substrate 100, e.g., at an angle of 60-120°, such as 80-100°, for example 90°). Preferably, the sidewall 1*a* comprises an epitaxial silicon rail having straight or tapered sidewalls, as shown in FIGS. 1E and 1F, respectively. Thus, the sidewalls 1*a* may be perpendicular to the major surface 100*a* of the substrate 100 or they may be inclined at an angle of 60-89 degrees with respect to the major surface 100*a* of the substrate 100. For a tapered sidewall 1*a*, as shown in FIG. 1F, a portion closer to the substrate 100 is preferably narrower than a portion extending farther from the substrate 100. Preferably, the sidewall 1*a* comprises doped silicon in at least a portion contacting the source line 102, a shown in FIGS. 1E and 1F. Preferably, the doped silicon comprises doped silicon source regions 1*s*, as shown in FIG. 68B.

The bottom side 1*b* of the semiconductor channel 1 comprises a second semiconductor section which extends horizontally (i.e., parallel to the major surface 100*a* of the substrate 100). Preferably, as shown in FIGS. 1A, 1C, 1E, and 1F, the bottom side 1*b* comprises an epitaxial silicon pillar having a cylindrical, truncated cone or inverse truncated cone shape. A truncated cone has a smaller diameter on top then on the bottom. An inverse truncated cone has a smaller diameter on the bottom than on the top, as shown in FIG. 1F. Preferably, the bottom side 1*b* comprises doped silicon in at least a portion contacting the source line 102, a shown in FIGS. 1A, 1C, and 1E.

Preferably, at least the top major surface 100*a* of the substrate 100 comprises single crystal silicon. The entire substrate 100 preferably comprises a single crystal silicon substrate, such as a silicon wafer. Alternatively, the substrate may comprise a single crystal silicon layer which forms the top major surface 100*a* located over a silicon wafer or another supporting material.

The channel 1 is electrically connected to the drain line 103 which is schematically shown in FIGS. 1A, 1C, 1E, and 1F. More detailed description of the drain line 103 will be provided with respect to FIGS. 2-4 below.

The monolithic three dimensional NAND strings 150 in memory device levels 70 further comprise a plurality of control gate electrodes 3, as shown in FIGS. 1A-1D. The control gate electrodes 3 may comprise a portion having a strip shape extending substantially parallel to the major surface 100*a* of the substrate 100. The plurality of control gate electrodes 3 comprise at least a first control gate electrode 3*a* located in a first device level (e.g., memory device level A) and a second control gate electrode 3*b* located in a second device level (e.g., memory device level B) located over the major surface 100*a* of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride, alloys thereof or combination of these materials.

A blocking dielectric 7 is located adjacent to the control gate(s) 3. In some embodiments, the blocking dielectric is located adjacent to the control gate 3 and parallel to the channel 1, as shown in FIGS. 1A, 1C, and 1F. In other embodiments, the blocking dielectric 7 may surround the control gate 3, as shown in FIG. 1E. The blocking dielectric 7 may comprise one or more layer having plurality of blocking dielectric segments located in contact with a respective one of the plurality of control gate electrodes 3. Alternatively, the blocking dielectric may comprises one or more continuous layers which extend the entire length of the memory cell portion of the NAND string.

The monolithic three dimensional NAND string also comprise a charge storage region 9. The charge storage region 9 may comprise one or more continuous layers which extend the entire length of the memory cell portion of the NAND string. Alternatively, the charge storage region may comprise a plurality of discrete charge storage regions or segments 9 located between the blocking dielectric 7 and the channel 1.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the charge storage region 9 may comprise an insulating charge trapping material, such as a silicon nitride layer or silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1. The tunnel dielectric layer 11 may comprise a silicon oxide. For example, the tunnel dielectric layer 11 may be a silicon dioxide layer, or a silicon dioxide/silicon nitride/silicon dioxide multi-layer.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

Figure 2C:
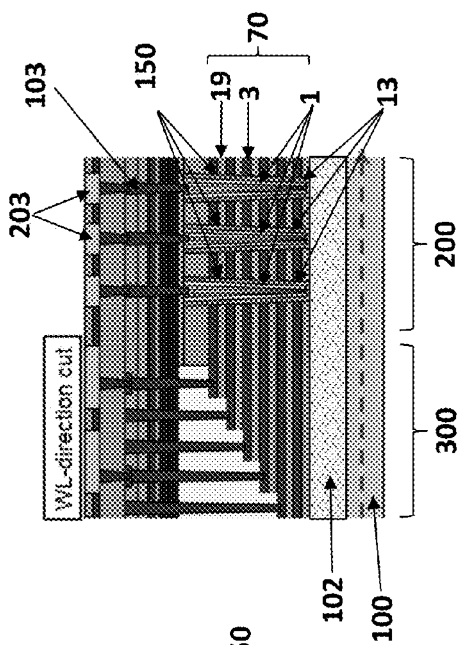
FIGS. 2B and 2C are side cross sectional views of the memory block of FIG. 2A along the bit line and word line directions, respectively.
Figure 2B:
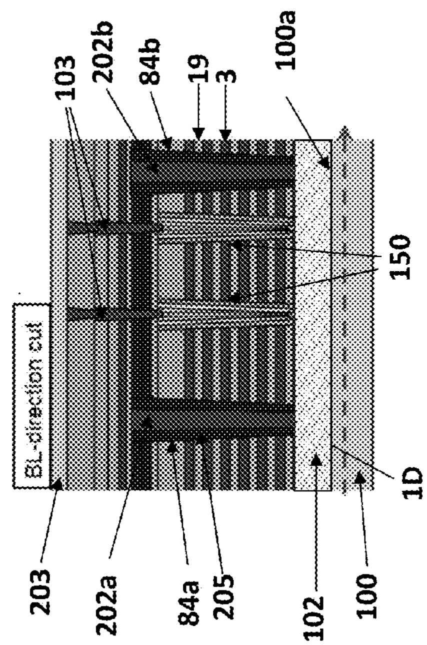
Figure 2A:
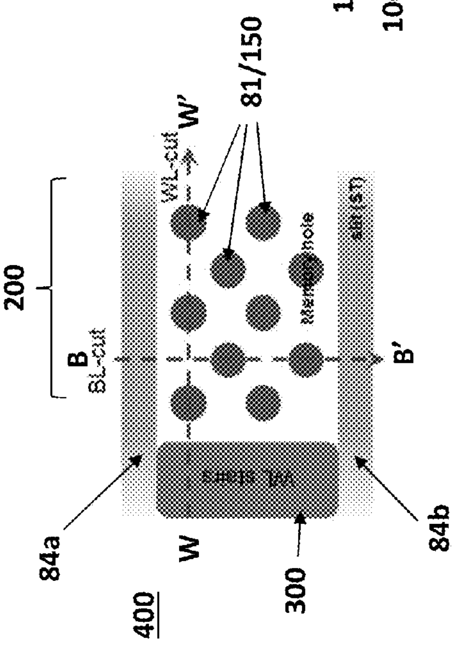
FIG. 2A is a top cross sectional view of a memory block of an embodiment of the invention.

FIGS. 2A to 2C illustrate a memory block 400 containing an array of a plurality of vertical NAND strings 150 according to one embodiment of the invention. Each string includes the memory device levels 70, respectively, as shown in FIG. 2C. FIGS. 2A and 2C show the location of memory region 200 containing the stepped word line contact region 300.

FIG. 2A is a top cross sectional view of a memory block of an embodiment of the invention. FIGS. 2B and 2C are side cross sectional views of the memory block of FIG. 2A along the bit line and word line directions, respectively. FIG. 2B is a side cross sectional view of the device along line B-B' in FIG. 2A, while FIG. 2C is a side cross sectional view of the device along line W-W' in FIG. 2A.

Drain electrodes 203 are located over the NAND memory cell region in memory device levels 70. As discussed above, each NAND string 150 contains a NAND memory cell region in the memory device levels 70 which includes the semiconductor channel 1 which extends substantially perpendicular to the major surface 100*a* of the substrate 100. A bottom side 1*b* and/or sidewall 1*a* of the semiconductor channel 1 contact the source line 102.

The device contains a plurality of control gate electrodes 3 that extend substantially parallel to the major surface 100*a* of the substrate 100 in the memory device levels 70 from the memory region 200 to the stepped word line contact region 300. The portions of the control gate electrodes 3 which extend into region 300 may be referred to as "word lines" herein. The drain electrode 203 electrically contacts an upper portion of the semiconductor channel 1 via drain lines 103.

Furthermore, each NAND string 150 contains at least one memory film 13 which is located adjacent to the semiconductor channel 1 in the memory device levels 70, as shown in FIG. 2C. Specifically, the memory film 13 is located between the semiconductor channel 1 and the plurality of control gate electrodes 3. The memory film 13 contains the tunnel dielectric 11, the charge storage region(s) 9 (e.g., a charge trapping layer or floating gates), and the blocking dielectric 7.

In one embodiment which will be described in more detail below, the tunnel dielectric 11 comprises a silicon oxide layer which extends perpendicular to the major surface 100*a* of the substrate 100, and the charge trapping layer 9 comprises a silicon nitride layer which extends perpendicular to the major surface 100*a* of the substrate 100 and which contacts the tunnel dielectric 11. The blocking dielectric 7 comprises a first silicon oxide layer which is patterned into regions which extend perpendicular to the major surface 100*a* of the substrate 100 and which contacts the charge trapping layer 9.

Figure 3A:
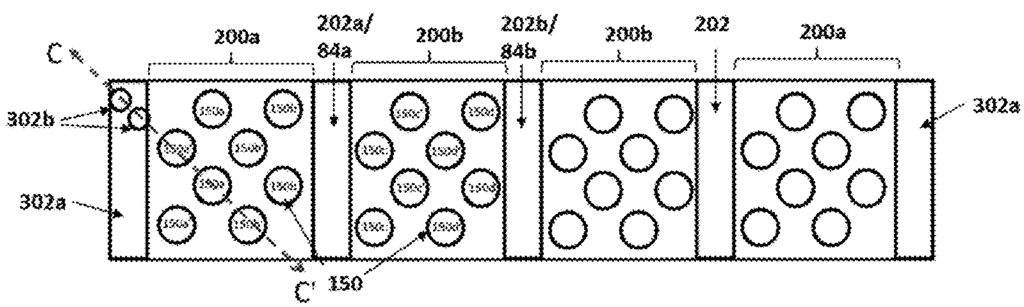
FIG. 3A is a top cross sectional view of a memory block.

FIGS. 2A and 3A illustrate a top view of a memory block 400. The memory block includes an array of NAND strings including at least one row of monolithic three dimensional NAND strings 150 described above, a first dielectric filled trench 84*a* located on a first side of the array, and a second dielectric filled trench 84*b* located on a second side of the array opposite to the first side of the array.

The array NAND strings may include any number of rows of NAND strings 150. For example, the array shown in FIG. 2A comprises at least a 4×4 array of NAND strings. In other words, the array shown in these figures has four rows of NAND strings, and there are at least four NAND strings in each row. The rows of NAND strings extend in the word line direction (e.g., along line W-W' in FIG. 2A). Thus, the array in the block 400 comprises first, second, third and fourth rows of NAND strings 150 extending in the word line direction. As shown in FIG. 2A, the semiconductor channels in the first and the third rows of NAND strings are preferably offset from respective semiconductor channels in the second and fourth rows of NAND strings along the word line direction. In general, the semiconductor channels in the odd numbered rows of NAND strings are offset from respective semiconductor channels in the even numbered rows of NAND strings along the word line direction.

Figure 4A:
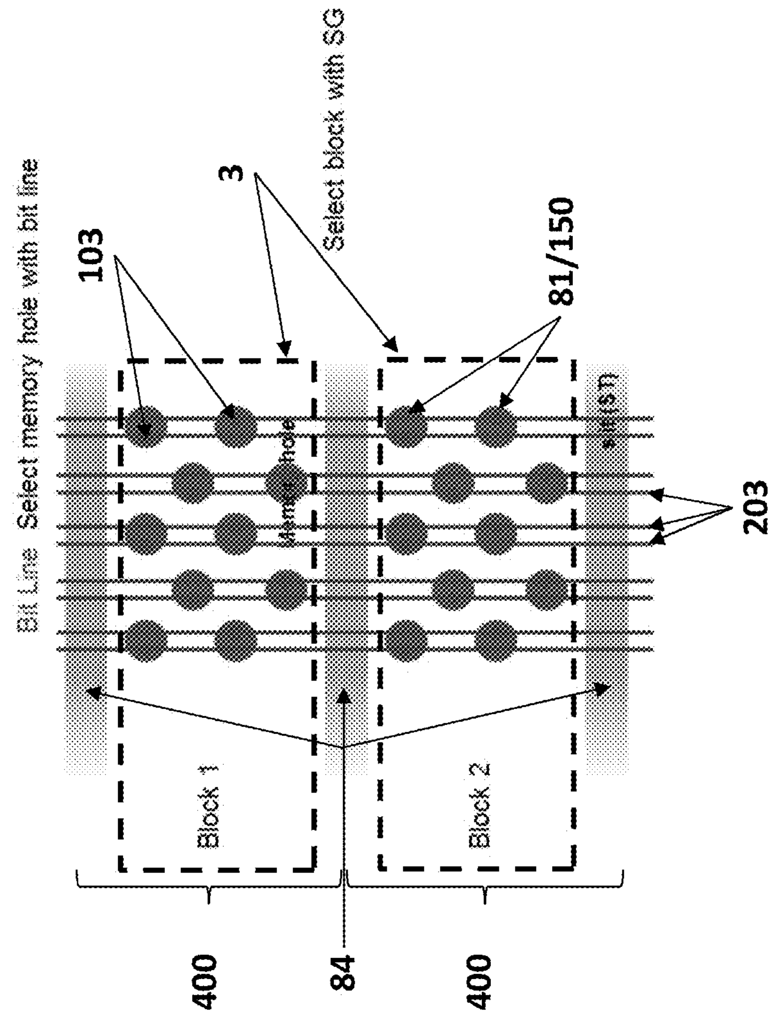
FIGS. 4A, 4B, and 4C are schematic top views of a memory device containing plural memory blocks according to embodiments of the invention.
Figure 4C:
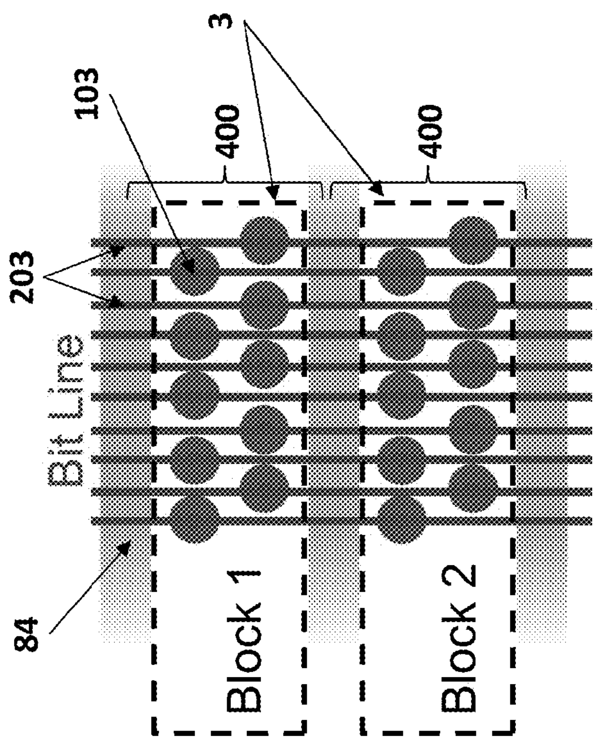
Figure 4B:
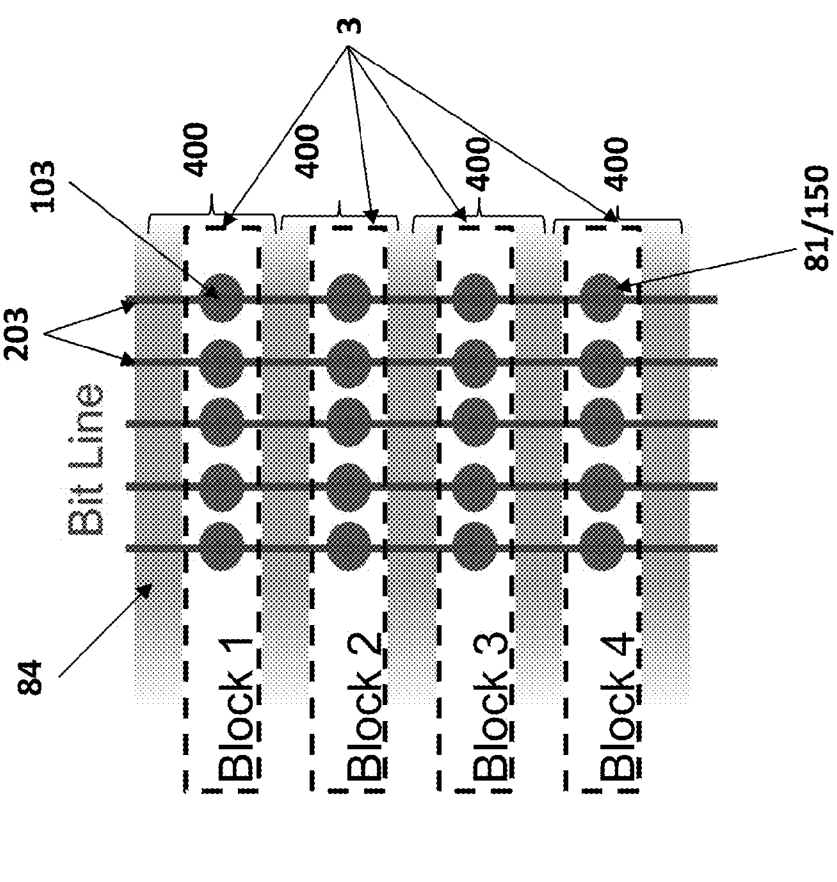

In alternative embodiments, each memory block 400 may have an array with fewer than 4 rows of NAND strings, such as only one row of NAND strings, as shown in FIG. 4B or two rows of NAND strings, as shown in FIG. 4C. Alternatively, the array in each block may have more than 4 rows, such as 5 to 20 rows of NAND strings, where each row contains 4 to 100 NAND strings.

As shown in FIG. 2B, the first semiconductor channel 1 in each of the first and the second rows of NAND strings 150 comprises a bottom side 1*b* which contacts the first source line 102, which in turn contacts the first source electrode 202*a* (e.g., the left side source electrode in FIG. 2B which corresponds to the source electrode positioned in the "upper" trench 84*a* in FIG. 2A) and the second source electrode 202*b* (e.g., the right side source electrode in FIG. 2B which corresponds to the source electrode positioned in the "lower" trench 84*b* in FIG. 2A).

As shown in FIG. 2C, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the block 400. In other words, the memory openings 81 do not completely sever the continuous electrical and physical path in the control gate electrodes from one trench 84 to the opposite trench 84 in each block.

Figure 3B:
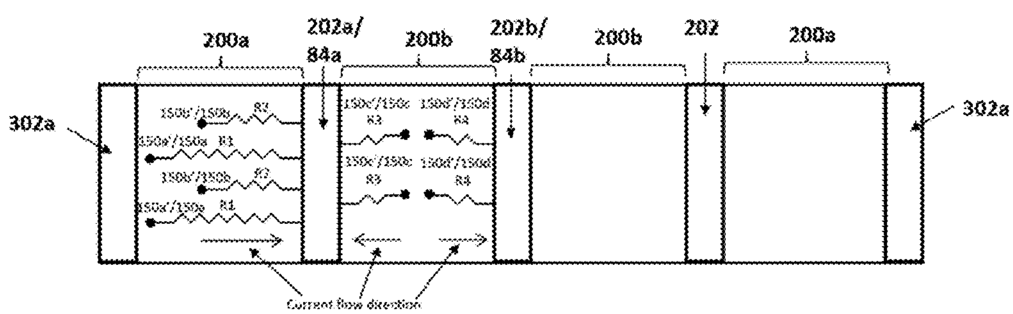
FIG. 3B is a schematic representation of the resistance and current flow between memory openings and the source line of the memory block of FIG. 3A.
Figure 3C:
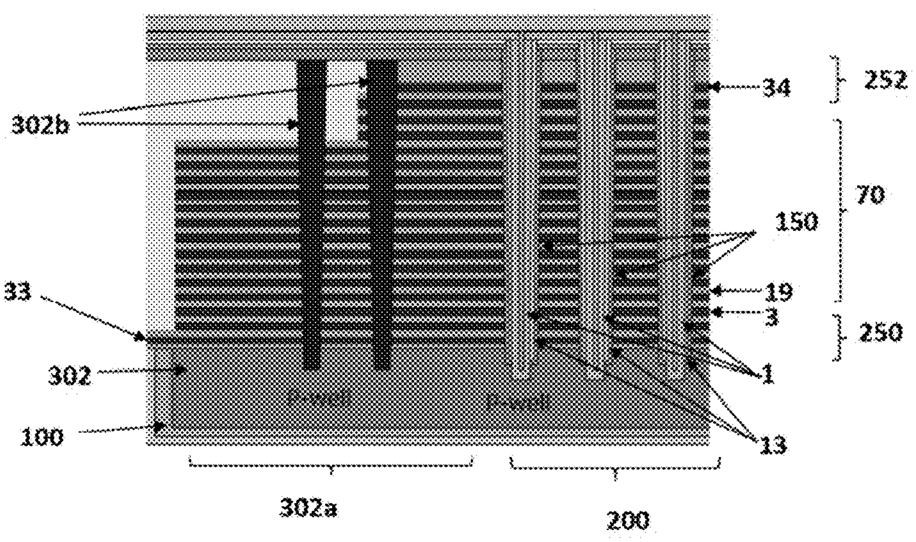
FIG. 3C is a side cross sectional view of the device along line C-C' in FIG. 3A.

As illustrated in FIG. 3A, a memory region 200*a* between a p-well contact region 302*a* and a source electrode 202*a*, and a memory region 200*b* between source electrodes 202*a* and 202*b* each contain a plurality of NAND strings 150. The p-well contact region 302*a* is a region where contact(s) 302*b* (e.g., electrically conductive or heavily doped semiconductor electrode(s)) to the p-well 302 in the substrate 100 are located, as shown in FIG. 3C. In FIG. 3A, NAND strings having the same distance from the nearest source electrode are given the same part number. FIG. 3B is a schematic representation of the resistance between NAND strings and the source electrode, and the current flow direction.

The memory region 200*a* includes NAND strings 150*a*, 150*a*', 150*b*, and 150*b*'. As shown in FIG. 3B, current flows from 150*a*' to 150*a* to the source electrode 202*a*, and the electrical resistance is represented by R1. Likewise, current flows from 150*b*' to 150*b* to the source electrode 202*a*, and the electrical resistance is represented by R2. Because NAND strings 150*a*' and 150*a* are located farther from the source electrode 202*a* than NAND strings 150*b*' and 150*b*, the electrical resistance R1 is greater than R2.

The memory region 200*b* includes NAND strings 150*c*, 150*c*', 150*d*, and 150*d*'. As shown in FIG. 3B, current flows from 150*c*' to 150*c* to the source electrode 202*a*, and the electrical resistance is represented by R3. Likewise, current flows from 150*d*' to 150*d* to the source electrode 202*b*, and the electrical resistance is represented by R4. In one embodiment, the memory region 200*b* is symmetric about a plane parallel to and equidistant from sources lines 202*a* and 202*b*, and the electrical resistances R3 and R4 are equal or substantially equal.

In prior art embodiments, the current between the NAND strings and the source electrode 202 flows through the silicon substrate, which is typically undoped and has a relatively high electrical resistance. This leads to location-dependent variations in resistance, for example R1 and R2 above.

In addition, high source resistance and location-dependent source resistance can lead to a nonuniform voltage distribution between memory regions, for example between memory regions 200a and 200b (e.g., there is a higher resistance R1 to NAND strings 150a, 150a' located adjacent to p-well contact region 302a in region 200a than to the other strings in regions 200a, 200b). This nonuniformity of voltage between cells becomes more severe with increased numbers of NAND strings per row. As a result, the effective cell size decreases.

In certain embodiments, the current between the NAND strings 150 and the source electrode 202 flows through the source line 102 that directly contacts each of the semiconductor channels 1. Because the source line 102 is made of a conductive or heavily doped (e.g., n or p-type with a concentration of at least $10^{18}$ $cm^3$) semiconductor material, the electrical resistance is much lower than the undoped silicon substrate. This can result in reduced or eliminated variations between resistances R1, R2, R3, and R4. In addition, the device voltage distribution and source line noise are improved.

Likewise, as shown in FIGS. 2B and 2C, the source line 102 is also continuous in the array in the memory block 400. In other words, the source line 102 has a shape of a continuous strip or sheet with bottom sides 1b and/or sidewalls 1a of the semiconductor channels 1 contacting and/or extending through the source line 102.

Thus, the memory block 400 contains a common control gate electrode 3 in each of the plurality of memory device levels 70 for the first, second, third and fourth rows of NAND strings shown in FIGS. 2B and 2C. The common control gate electrode 3 may also be referred to as a wordline or a wordline finger (shown as dashed lines in FIGS. 4A, 4B, and 4C). In various embodiments, the memory block 400 optionally includes a select gate electrode 33 (shown in FIG. 3C) located between the conductive source line 102 and the control gate electrodes 3, and the select gate electrode is continuous in the array. Likewise, the source electrode 202 contacts a common source line 102 for the first second, third and fourth rows of NAND strings in the block 400. Therefore, all of the NAND strings in the array in each block 400 can be erased together in the same erase step, as shown in FIG. 4A. For example, one specific memory cell can be selected by selecting (i.e., applying a current or voltage) to one source electrode 202, one bit line (i.e., drain electrode) 203 and one word line (e.g., control gate electrode) 3. Specifically, a particular block 400 is selected with the common source electrode 202 in that block, the specific memory opening 81/NAND string 150 is selected with the bit line (drain electrode) 203, and the particular cell in one memory device level 70 in the NAND string 150 is selected with the word line 3. In various embodiments, the memory block 400 may include a source side select transistor 250 (containing the source side select gate electrode 33 and adjacent portions of the channel and memory film as shown in FIG. 3C) located between the conductive source line and the plurality of control gate electrodes 3. In various embodiments, the memory block 400 may include a drain side select transistor 252 (containing the drain side select gate electrode 34 and adjacent portions of the channel and memory film as shown in FIG. 3C) located over the NAND memory cell region (i.e., over the memory device levels 70 in region 200).

In some embodiments, the source line 102 is a semiconductor material, for example n-type polysilicon, and the NAND string may be erased by a process referred to herein as "well erase." A voltage, such as a positive is applied to the semiconductor source line 102 via the source electrode 202, and a different voltage is applied to the drain electrode to create a potential difference between the source line (more positive) and the drain electrode (more negative). This causes a depletion region (fully or partially) to form in the semiconductor source line adjacent to the channel due to the migration of electrons out of the depletion region toward the source electrode 202 and thus holes get accumulated. The resulting holes then migrate from the depletion region into the channel silicon to recombine with the trapped electrons in the charge storage regions 9 and thus erase the NAND string (or selected cells in the string). Alternatively, if the n-type and p-type regions are reversed, then the charge carrier types and voltages should also be reversed. In another embodiment, the source line 202 is biased to erase voltage (positive) and the source electrode 202 is floating or at ground voltage and drain electrode is floating or at ground voltage for well erase.

In other embodiments, the source line 102 is a metal or metal alloy (e.g., metal nitride or silicide), and the NAND string may be erased by a process referred to herein as a "gate-induced drain leakage" ("GIDL") erase. A positive voltage is applied to the conductive source line, and a different, less positive voltage (e.g., negative or smaller positive voltage) is applied to the drain electrode. In some embodiments, the drain electrode is grounded instead. Electrons and holes are separated at the n-p junction between the n-type source region (e.g., region 1s in FIGS. 77 and 79) and the p-type channel 1. The holes can migrate away from the positive voltage at the source region into the channel to recombine with the trapped electrons in the charge storage regions 9 and erase the NAND string (or selected cells in the string). Alternatively, if the n-type and p-type regions are reversed, then the charge carrier types and voltages should also be reversed.

In other embodiments, the source line 102 is a semiconductor material, for example n-type polysilicon, and the NAND string may be erased by the GIDL erase process. In this case, the bottom most conductive word line is biased to a less positive voltage and source line 102 is biased to an erase voltage to make sufficient potential difference to generate GIDL holes. The drain electrode is floating or grounded instead. The GIDL holes can migrate away from the positive voltage of the bottom most conductive word line electrode into the channel to recombine with the trapped electrons in the charge storage regions 9 and erase the NAND string (or selected cells in the string).

A first source electrode 202a is located in the first dielectric filled trench 84a and a second source electrode 202b is located in the second dielectric filled trench 84b in each block 400, as shown in FIGS. 2A and 2B. In the memory device levels 70, the dielectric fill in the trench 84 may comprise any suitable insulating layer 205, such as silicon oxide, etc., which is located on both walls of the trench 84. The source electrode 202 is located in the middle of the trench 84 and is separated from the control gate electrodes 3 by the insulating layer 205, as shown in FIG. 2B.

A plurality of drain electrodes (e.g., bit lines) 203 are located over the array of NAND strings 150 in each block 400, as shown in FIG. 4A. The drain electrodes 203 extend in the bit line direction B-B' from the first dielectric filled trench 84a to the second dielectric filled trench 84b in each block 400, as shown in FIG. 2A. Furthermore, as shown in FIGS. 4A, 4B, and 4C, each trench 84 (except the end trenches in the device) extends in the word line direction and separates two adjacent blocks 400. The drain electrodes 203 extend over and perpendicular to the trenches over plural memory blocks 400. Each drain electrode 203 contacts the channel 1 in one NAND string 150 in one memory opening 81 in each block.

The density of the drain electrodes 203 depends on the number of rows of NAND strings 150 and on the spacing between adjacent NAND strings in each row, as shown in FIGS. 4A, 4B, and 4C. For example, as shown in FIGS. 4B and 4C, each memory opening 81 has one drain electrode 203 passing over it. A respective drain line 103 connects the channel 1 in each memory opening 81 to the respective drain electrode 203 passing over the memory opening 81. In this case, the drain line 103 may be located over the middle of the memory opening 81.

In contrast, in the four row layout shown in FIG. 4A, each memory opening 81 has two drain electrodes 203 passing over it. A respective drain line 103 connects the channel 1 in each memory opening 81 to only one of the two respective drain electrodes 203 passing over the memory opening 81. In this case, the drain line 103 may be located off center of the memory opening 81 (e.g., closer to the periphery than to the middle). The drain line 103 contacts the channel 1 at the periphery of the memory opening 81.

Thus, as shown in FIG. 4A, one bit line 203 passing over the left side of two memory openings 81 aligned in the bit line direction in the odd or even numbered rows, may have electrical contact via the drain line 103 with the left side of the cylindrical channel in one memory opening in one row. Another bit line 203 passing over the right side of the same two memory openings 81, may have electrical contact via the respective drain line 103 with the right side of the channel in the memory opening in the in the other row.

As described above, the semiconductor channel 1 may be a solid rod shape or a hollow substantially cylindrical shape in the memory device levels 70. The tunnel dielectric 11 comprises a cylinder or inverse truncated cone which surrounds the semiconductor channel 1. The charge storage region 9 comprises a cylinder or inverse truncated cone which surrounds the tunnel dielectric 11. The blocking dielectric 7 comprises a cylinder or inverse truncated cone which surrounds the charge storage region 9. The plurality of control gate electrodes 3 preferably comprise metal or metal alloy control gate electrodes which surround the blocking dielectric 7 in each NAND string 150.

FIGS. 5 to 34 illustrate a method of making a NAND string according to a non-limiting embodiment of the invention. Specifically, the method results in a lower resistance, more uniform electrical connection between the source electrode 202 and the NAND strings 150. The method also features a self-aligned process integration advantage. Thus, the memory blocks 400 are not subjected to misalignment or costly and intensive alignment procedures that occur in a prior art method.

Specifically, in the prior art method, the memory film 13 and semiconductor channel 1 are formed first. Then, a vertical opening is etched through the semiconductor channel 1 into the substrate 100. Then, a semiconductor layer is depositing into the vertical opening, thus connecting the semiconductor channel 1 with the substrate 100. However, this over-etch method requires a large memory opening diameter and two depositions to complete the semiconductor channel, and relies on the poorly conductive substrate as a source line.

In contrast, as will be explained in more detail with reference to FIGS. 5-34, in the embodiment methods of the present invention, a conductive or semiconductor source line 102 is formed on a major surface 100*a* of substrate, such as a single crystalline silicon substrate 100, such that the source line 102 is substantially parallel to the major surface 100*a*. Then, a stack 120 of alternating layers of a first material and a second material is deposited over the conductive source line, and a plurality of memory openings 81 is subsequently etched in the stack 120 to expose the source line 102. The memory opening 81 extends substantially perpendicular to the major surface of the substrate. The memory film 13 including a charge storage region, a tunnel dielectric, and a blocking dielectric is deposited in and/or around the memory opening 81. The semiconductor channel 1 is deposited in the memory opening 81 such that the bottom side 1*b* and/or side wall 1*a* of the semiconductor channel 1 contact the source line 102.

FIGS. 35-41 illustrate a variation of the embodiment illustrated in FIGS. 6-34. In this embodiment, the blocking dielectric 7 is formed such that it surrounds the plurality of control gates 3. In other words, the blocking dielectric 7 has a plurality of regions, each region surrounding a respective one of the plurality of control gate electrodes 3. A memory film 13' including a charge storage region and a tunnel dielectric is deposited in and/or around the memory opening 81, and the semiconductor channel 1 is deposited in the memory opening 81 such that the bottom side 1*b* and/or side wall 1*a* of the semiconductor channel 1 contact the source line 102.

In another embodiment, as will be explained in more detail with reference to FIGS. 42-75, a sacrificial material is deposited on a major surface 100*a* of a substrate 100. Then, a stack 120 of alternating layers is deposited, and a plurality of memory openings 81 is subsequently etched in the stack 120 to expose the source line 102. The memory film 13 is deposited in and/or around the memory openings 81. The semiconductor channel 1 is deposited such that the bottom side 1*b* and/or side wall 1*a* of the semiconductor channel 1 contact the sacrificial material. The sacrificial material is removed to form a recess, and a conductive or semiconductor material is deposited in the recess to form the source line.

Figure 5:
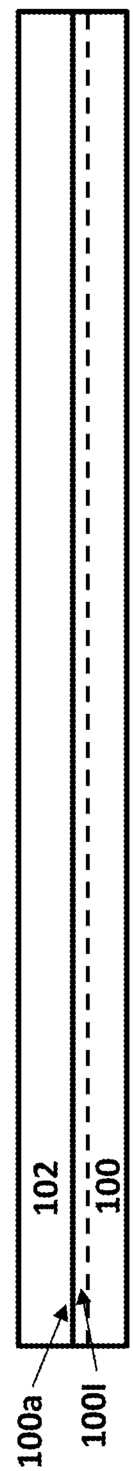
FIGS. 5-20 and 22-34 are side cross sectional views illustrating steps in an embodiment method of making the device illustrated in FIGS. 1A-1D and 2A-2C along line B-B' in the bit line direction.

FIGS. 5-34 illustrate a method of making the NAND device. FIG. 5 illustrates a first step in the embodiment method of making the NAND device. FIG. 5 shows a conductive source line 102 formed substantially parallel to a major surface 100*a* of a substrate 100. In various embodiments, the substrate is single crystal silicon, optionally doped with a first conductivity type (e.g., n or p-type, such as containing the p-well 302) at a concentration of less than $10^{18}$ $cm^3$, for example from $10^{15}$-$10^{17}$ $cm^3$. In various embodiments, the conductive source line 102 comprises a doped upper portion of the substrate 100 or a deposited semiconductor layer having a higher doping concentration than the substrate. Preferably, the conductive source line 102 is polysilicon or single crystal silicon doped with a second conductivity type (e.g., p or n-type opposite to that of the substrate) at a concentration of at least $10^{18}$ $cm^3$.

In some embodiments, an optional insulating layer (e.g., silicon oxide, etc.) 100I is formed directly on or over the substrate 100 (e.g., a silicon substrate), and the conductive source line 102 is formed directly on or over the insulating layer. In these embodiments, the NAND strings are formed on the resulting silicon on insulator (SOI) substrate.

In some embodiments, the polysilicon conductive source line 102 is formed by depositing a small grain polysilicon or amorphous silicon layer followed by annealing the layer (e.g., a laser anneal, a thermal anneal, and/or a lamp anneal) to recrystallize the layer to form a larger grained polysilicon layer. For example, the recrystallized source line 102 may be formed on the insulating layer 100I of the SOI substrate.

Figure 6:
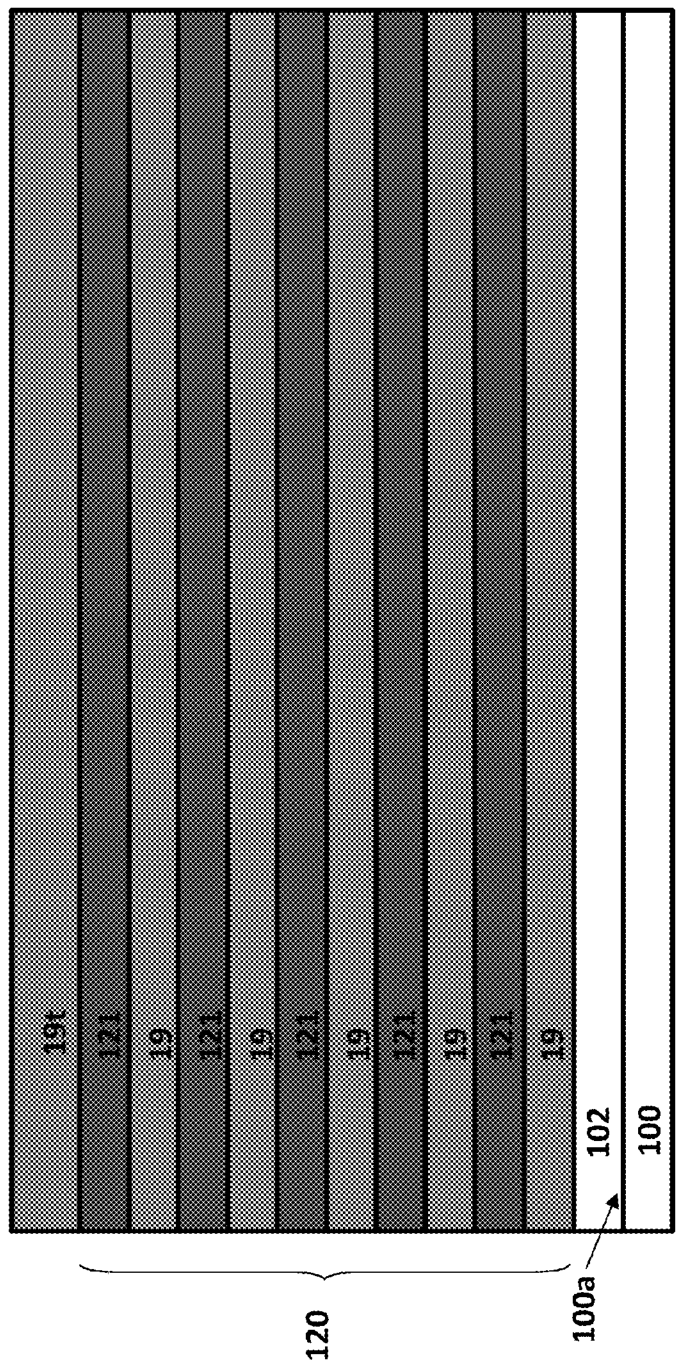

As shown in FIG. 6, a stack 120 of alternating layers 19 and 121 are formed over the source line 102. Layers 19, 121 may be deposited by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating or semiconductor material. For example, layers 19 may comprise silicon oxide and layers 121 may comprise silicon nitride or silicon, such as amorphous silicon or polysilicon, or another semiconductor material, such as a group IV semiconductor, including silicon-germanium and germanium. Preferably, layers 121 comprise silicon nitride.

Figure 7:
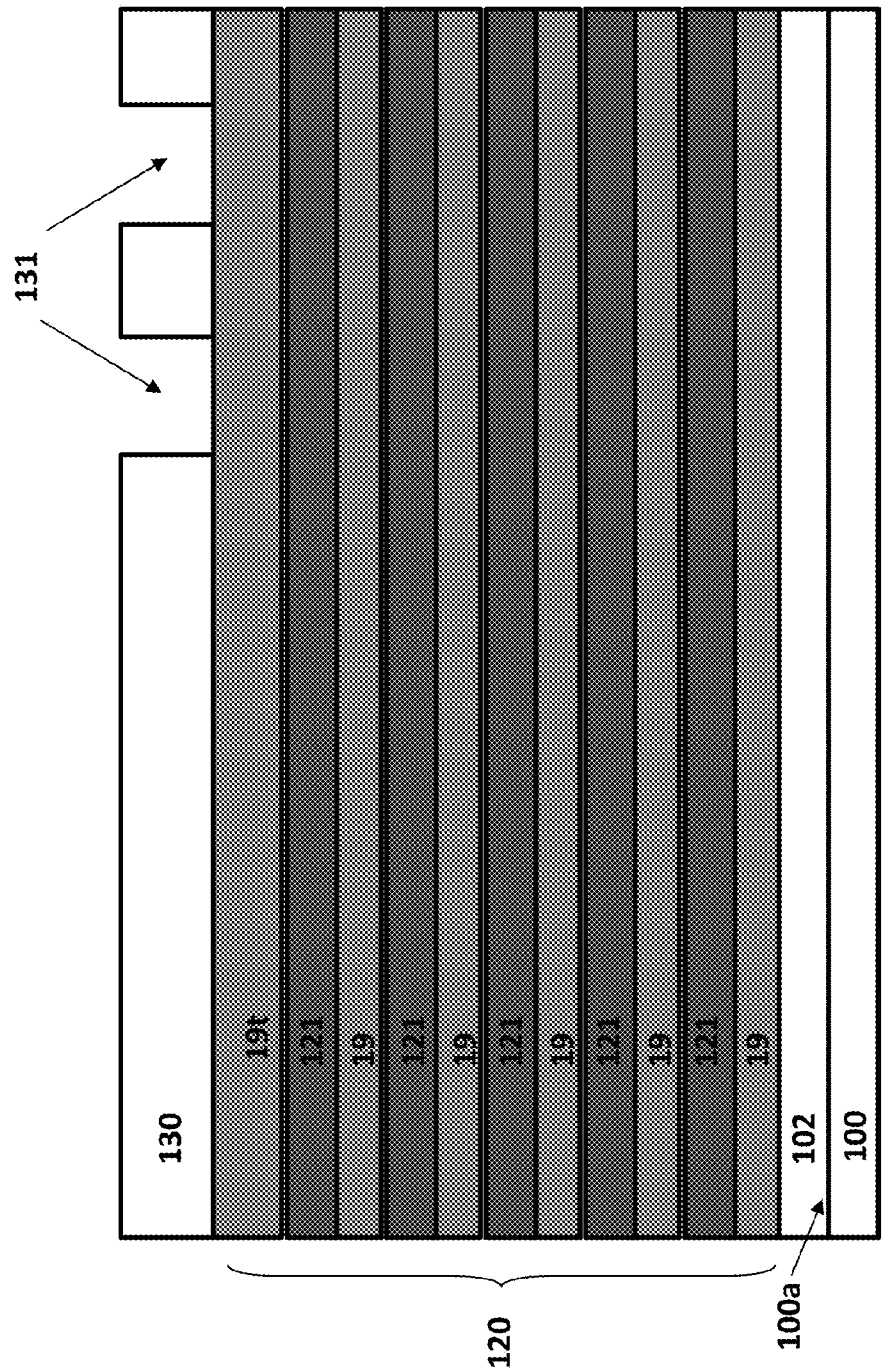
Figure 8:
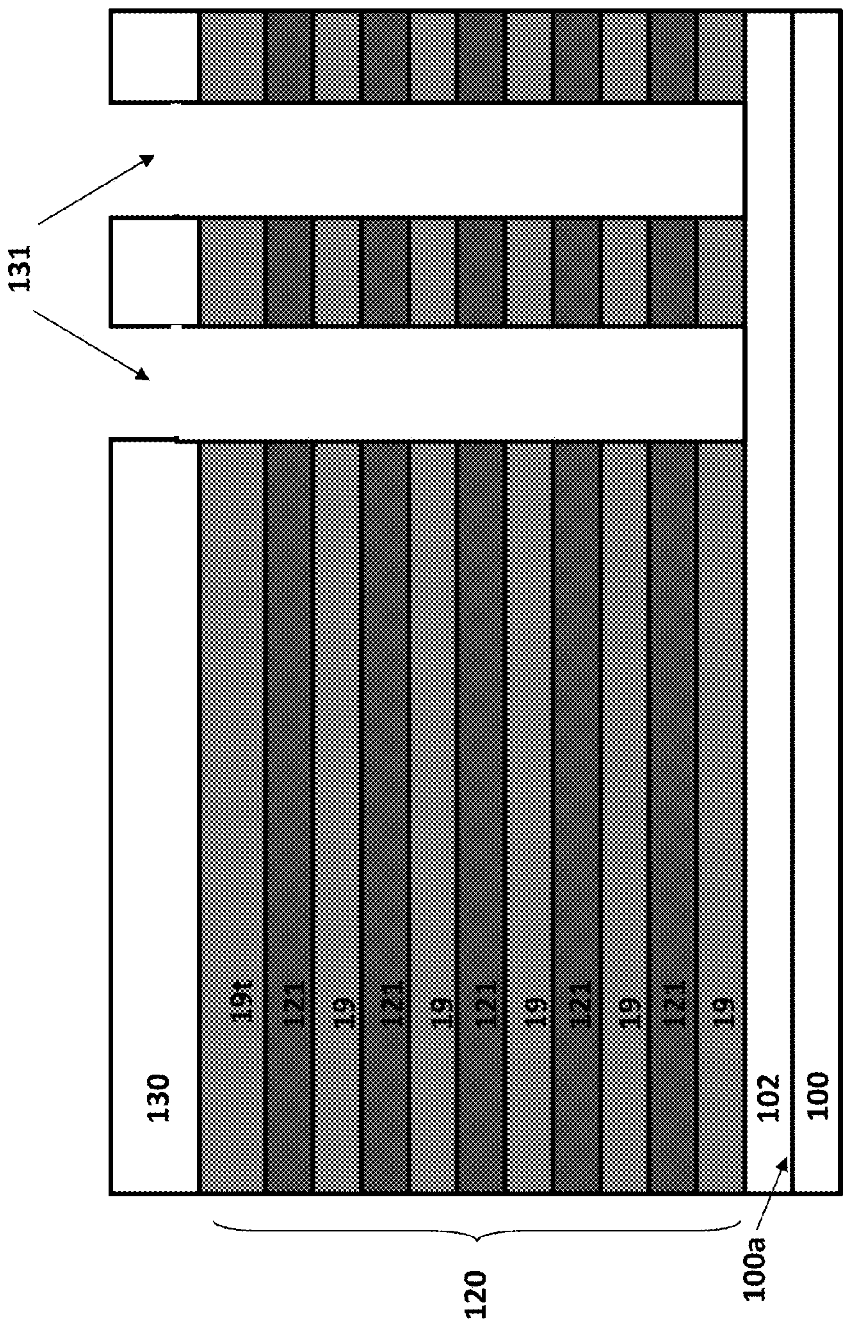

The deposition of layers 19, 121, is followed by etching the stack 120 to form at least one a front side opening 81 in the stack 120. An array of a front side openings 81 (e.g., cylindrical memory openings or holes) may be formed in locations where vertical channels of NAND strings 150 will be subsequently formed, as shown in FIGS. 7 and 8.

The openings 81 may be formed by photolithography and etching, as follows. First, a memory opening mask 130 is formed over the top layer 19*t* of the stack and patterned to form mask openings 131 exposing the stack 120, as shown in FIG. 7. Mask 130 may comprise any suitable material, such as one or more layer of photoresist and/or hard mask material. Then, the stack 120 is etched using RIE to form the openings 81 in the stack through the mask openings 131 in mask 130. Each front side memory opening 81 is etched until the source line 102 is exposed in the opening 81, as shown in FIG. 8.

Figure 9:
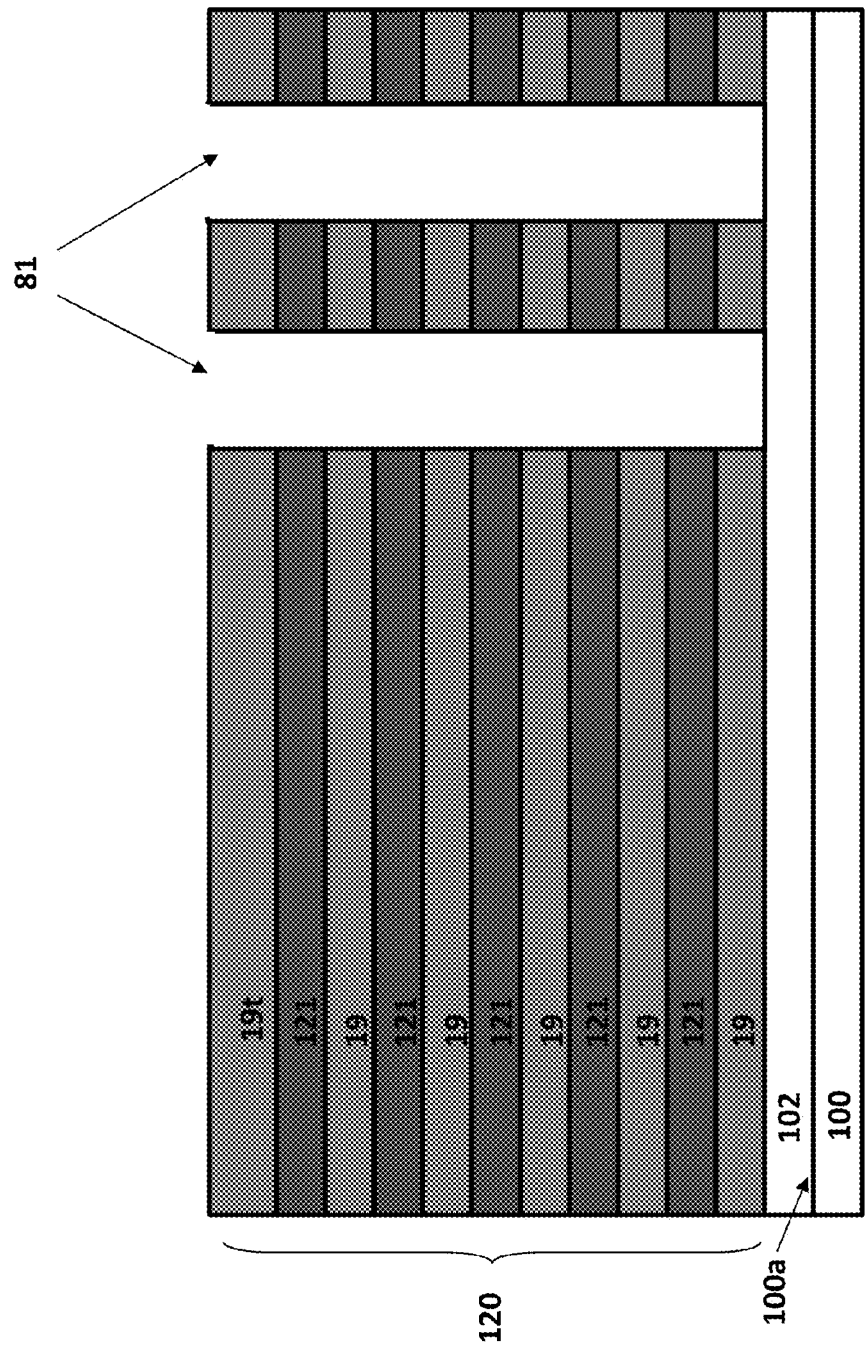

The mask is then removed, as shown in FIG. 9.

Figure 10:
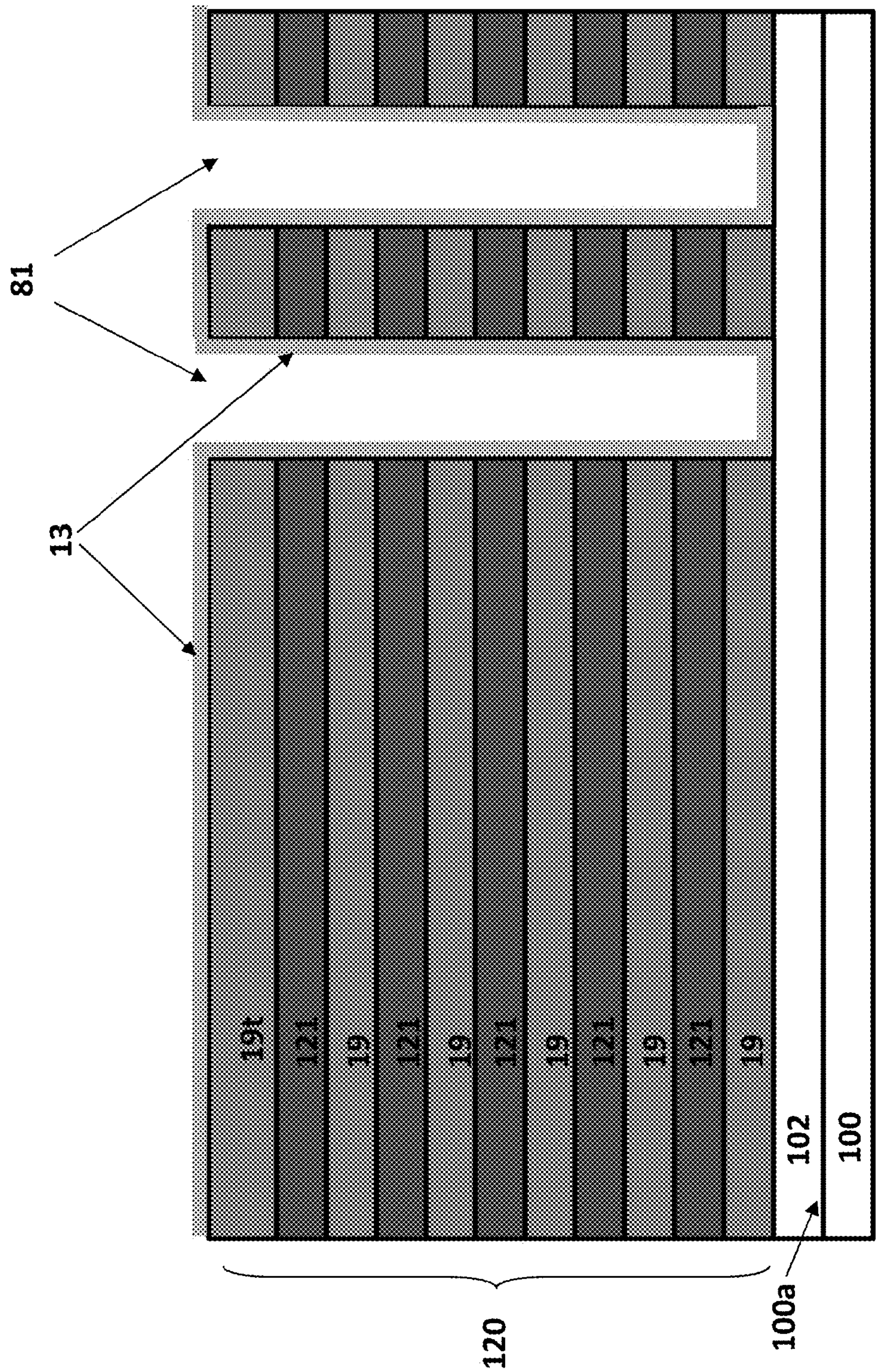

Then, as shown in FIG. 10, the memory film 13 is formed in the memory openings 81 and over the stack 120. Specifically, this step includes forming a blocking dielectric in the memory opening 81, forming a charge storage region (e.g., silicon nitride layer or a floating gate layer) over the blocking dielectric in the memory opening, and forming a tunneling dielectric over the charge storage region in the memory opening 81.

Then, the channel 1 is formed by depositing channel material, such as a lightly doped or intrinsic polysilicon over the tunnel dielectric layer portion of the memory film 13 in the front side opening 81. If desired, a high temperature anneal may be performed after forming the channel 1. As discussed above, the entire opening 81 may be filled to form the device illustrated in FIG. 1D. Alternatively, a layer of channel material may first be deposited in the opening 81 followed by deposition of an insulating fill material 2 to form the device illustrated in FIG. 1B.

Figure 11:
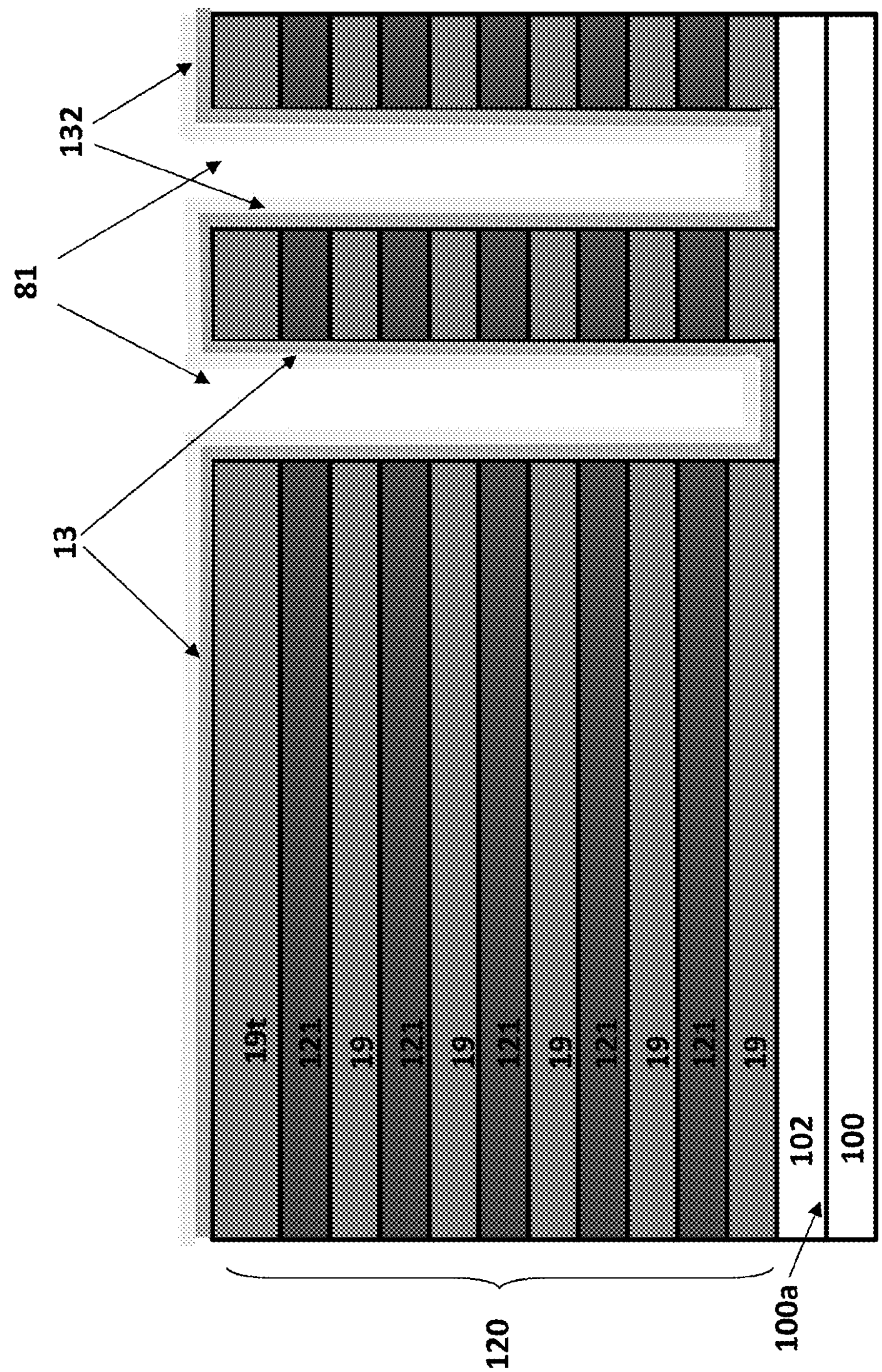

In a preferred embodiment, the channel may be formed by a multi-step process utilizing a protective layer, as will be described below with reference to FIGS. 11 to 18. First, as shown in FIG. 11, a cover semiconductor layer 132, such as an amorphous silicon or polysilicon layer, is formed in the memory openings 81 over the memory film 13 and over the stack 120. Layer 132 protects the memory film 13 from damage during a subsequent etching step.

Figure 12:
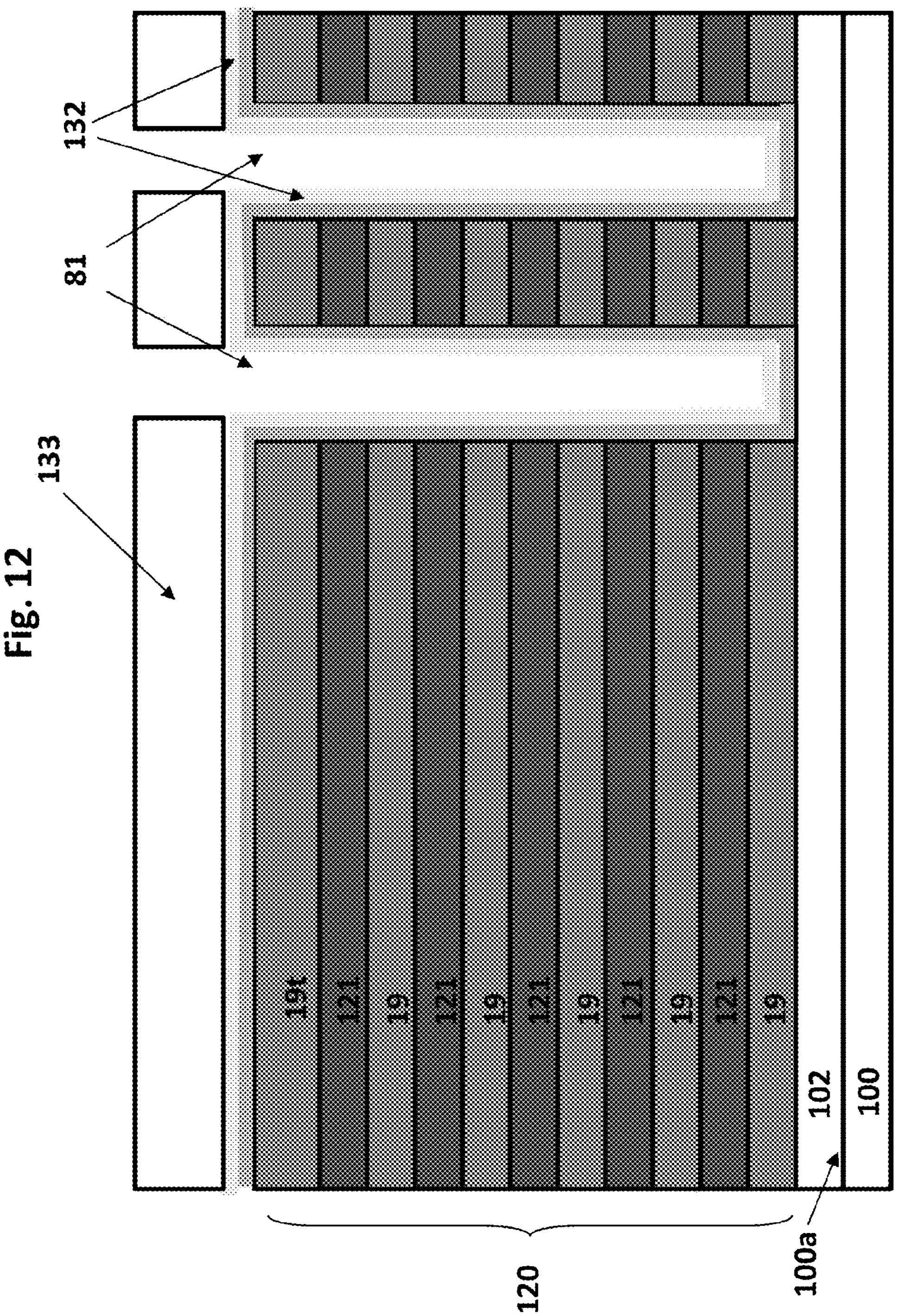

Then, a hard mask cover layer 133 is formed over layer 132. The hard mask cover layer 133 may comprise an amorphous carbon layer for example. Layer 133 is deposited non-conformally such that layer 133 is located over layer 132 on top of the stack 120, but does not extend into the memory openings 81, as shown in FIG. 12. Alternatively, layer 133 may be deposited conformally and then patterned by photolithography and etching to be removed from the memory openings.

Figure 13:
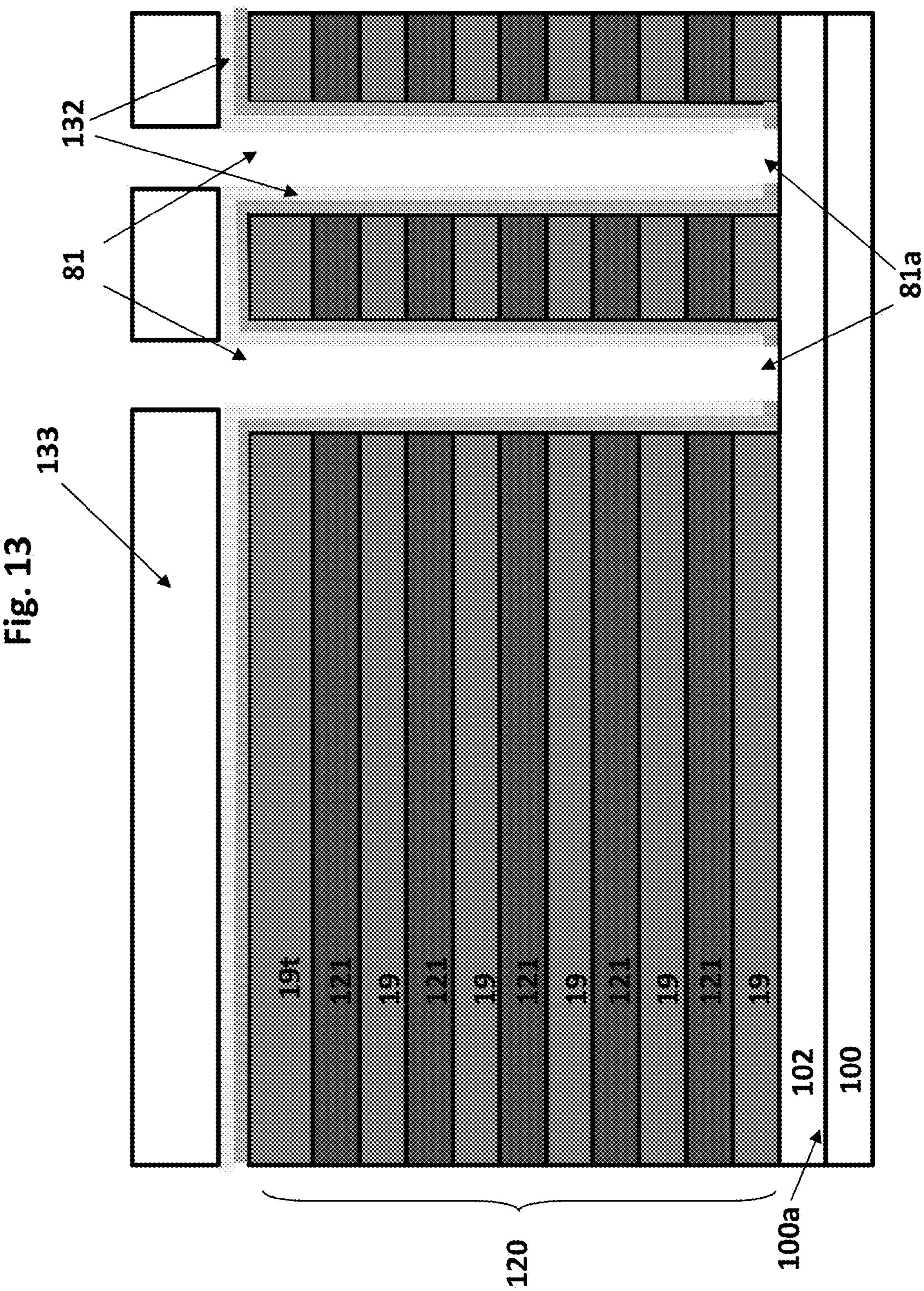

As shown in FIG. 13, the memory film 13 (e.g., the blocking dielectric, the charge storage region and the tunnel dielectric) is removed from a bottom of the memory openings 81 using RIE or another suitable anisotropic etching method. The cover semiconductor layer 132 protects the memory film 13 on the sidewalls of the memory openings 81 from etching damage, and the hard mask cover layer 133 protects the rest of the stack from being etched. The etching step forms extension portions 81A of the openings 81 which expose the source line 102 at the bottom of the openings 81. The hard mask cover layer 133 is then removed by any suitable method, such as ashing or selective wet etching.

Figure 14:
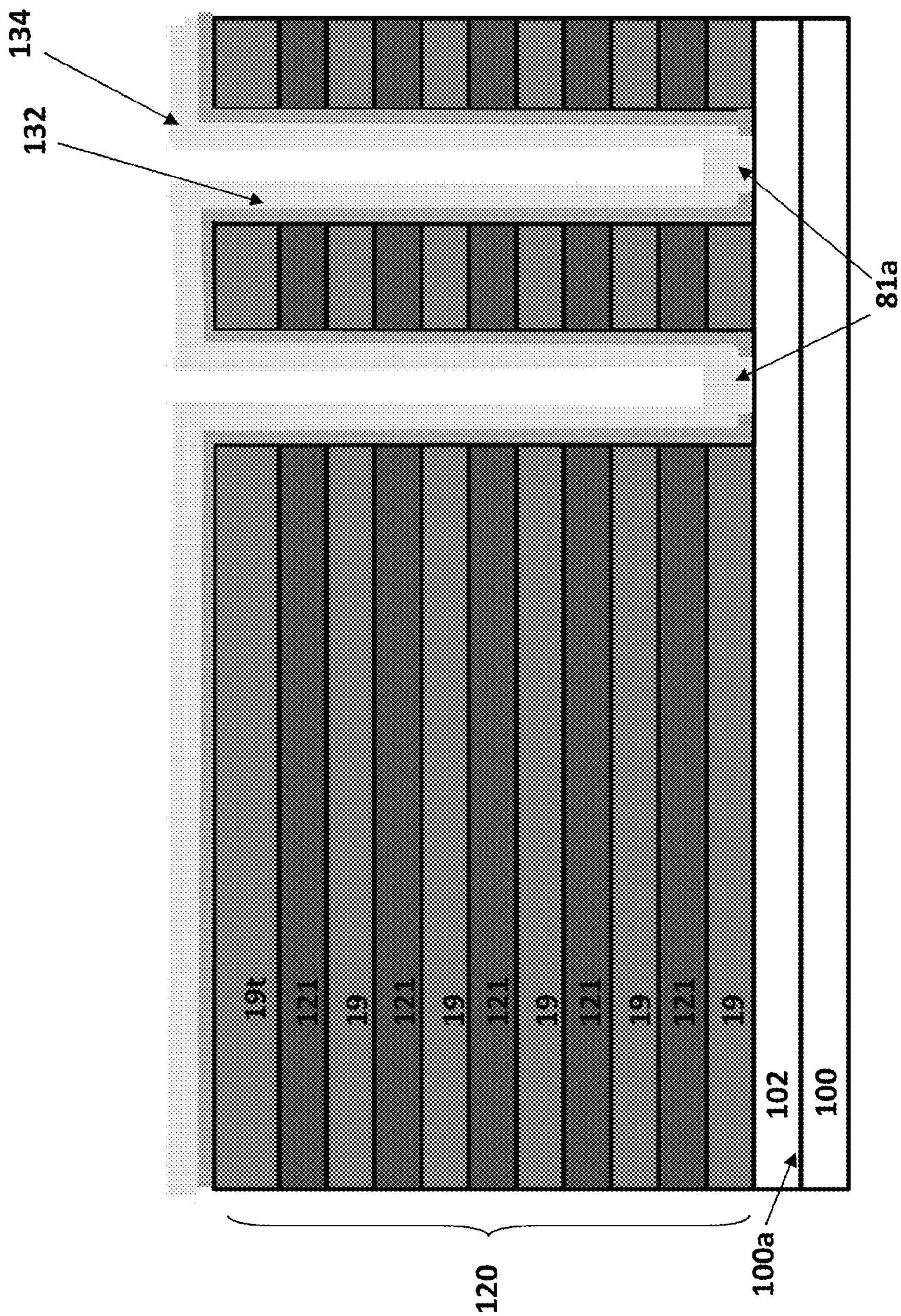

As shown in FIG. 14, a semiconductor channel body layer 134 is formed in the memory openings 81 such that it makes contact with the source line 102 exposed in the openings 81 (e.g., exposed in portions 81*a* of openings 81). The semiconductor channel body layer 134 comprises a channel material, such as amorphous silicon or polysilicon. Layers 132 and 134 preferably comprise the same materials, and layer 134 contacts layer 132 on the sidewalls of the openings 81.

Figure 15:
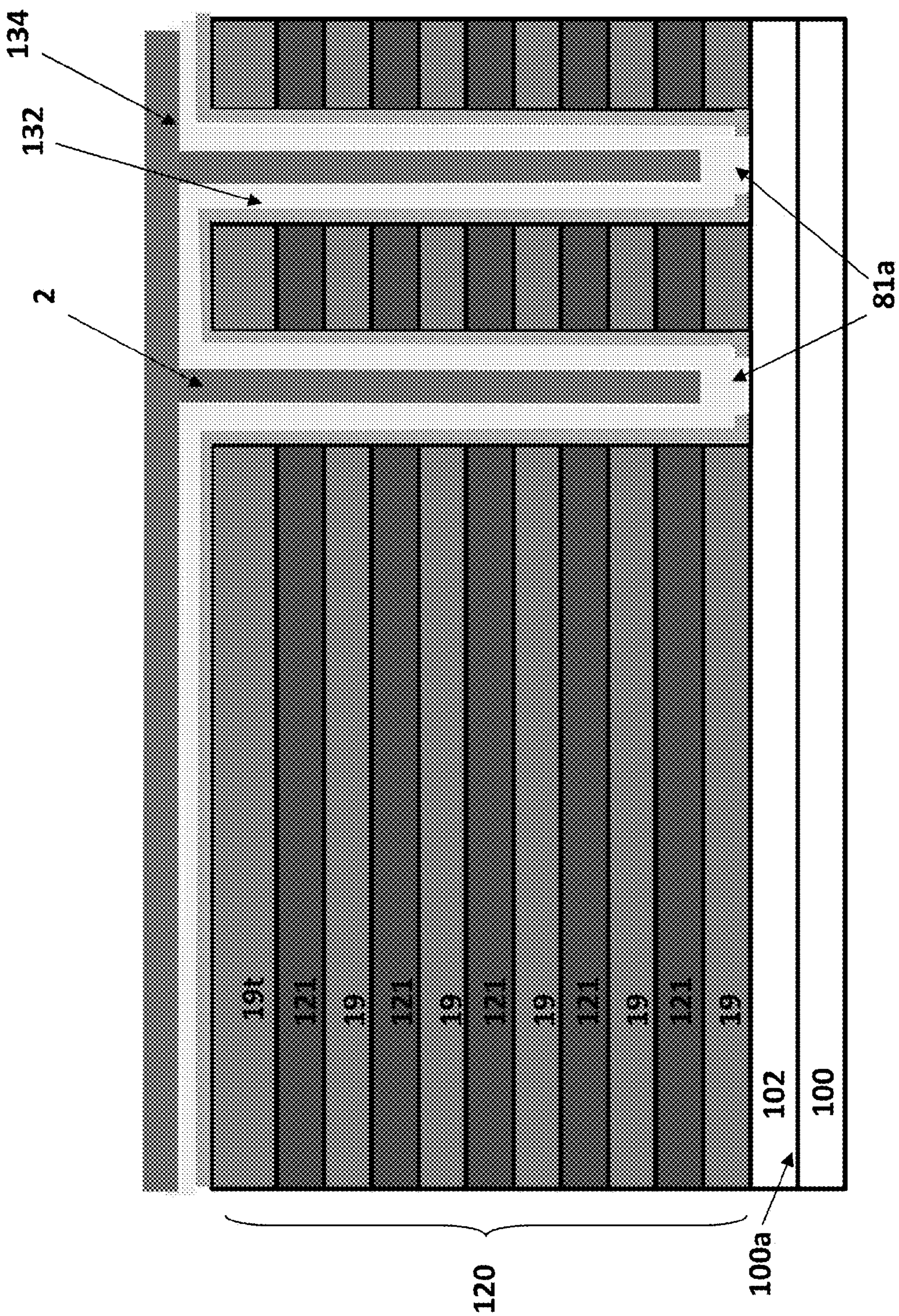
Figure 16:
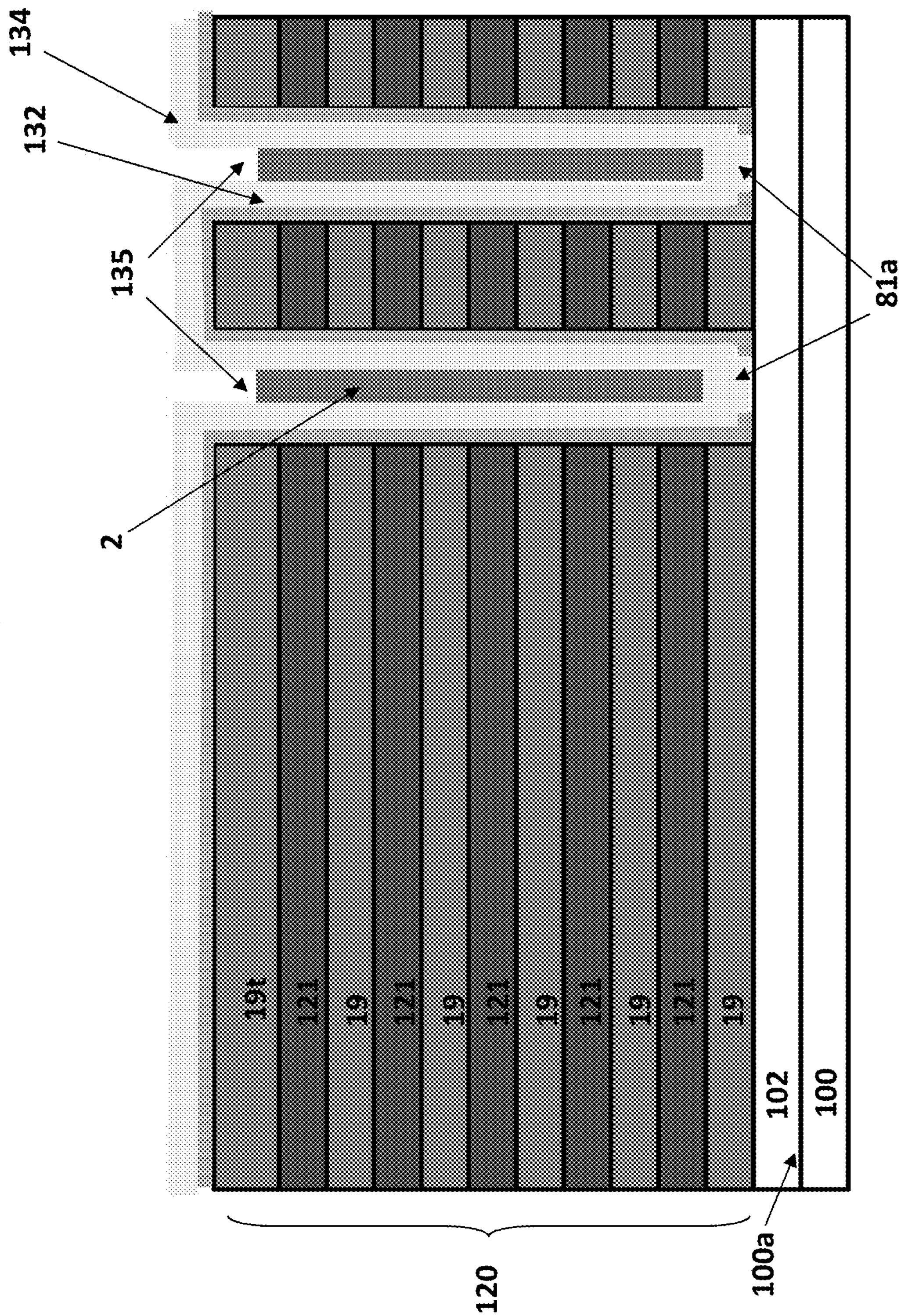

The optional core insulating layer 2, such as a silicon oxide layer is then deposited in the openings 81 and over the stack 120, as shown in FIG. 15. Layer 2 is also shown in FIGS. 1A and 1B. The core insulating layer 2 is then recessed from the top of the openings 81 by selective etchback to form recesses 135 in the top of the openings 81, as shown in FIG. 16.

Figure 17:
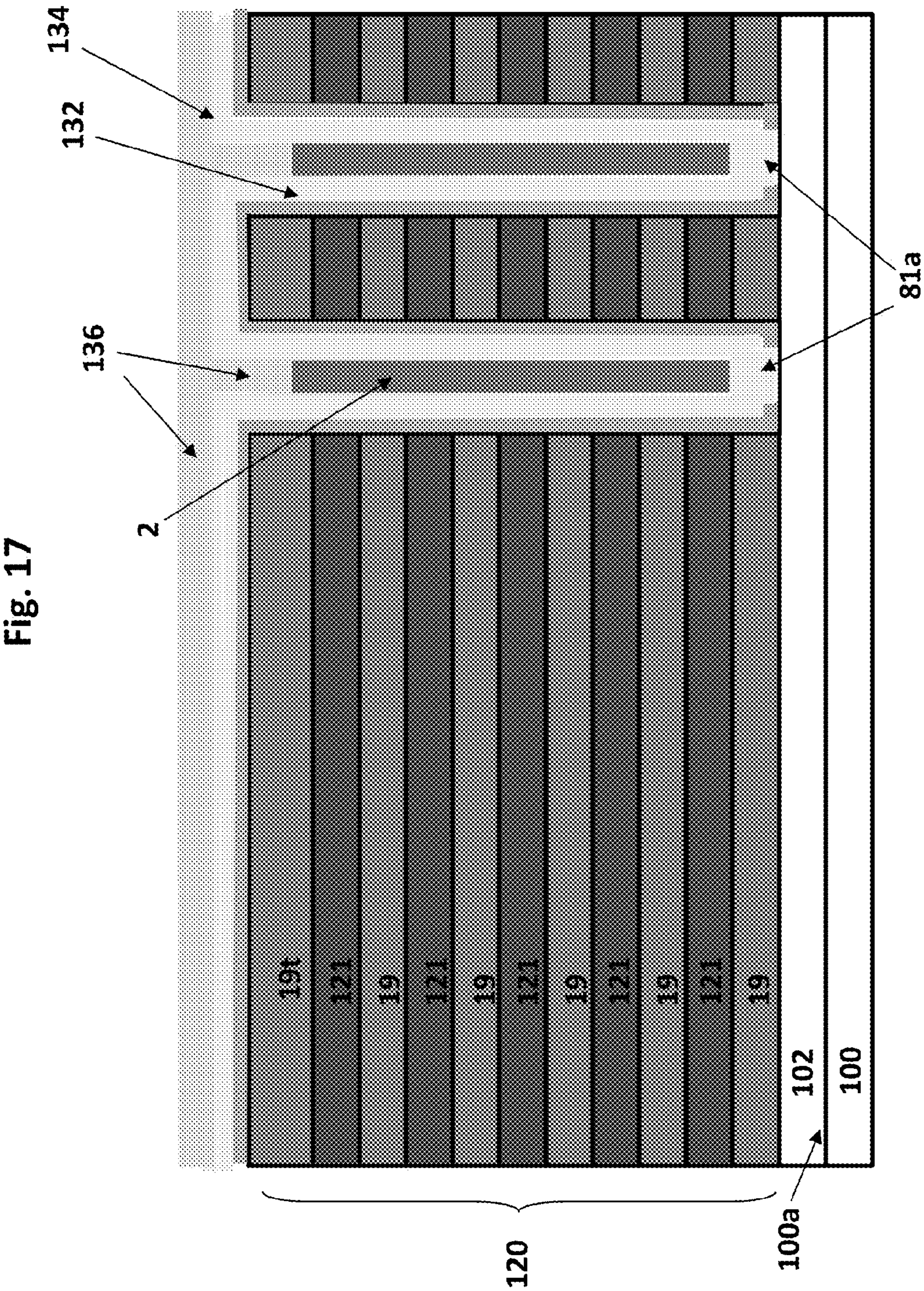

The recesses 135 are then filled by a semiconductor cap layer 136 which is deposited conformally over layer 134 on the stack 120 and in the recesses 135, as shown in FIG. 17. The cap layer 136 comprises a channel semiconductor material, such as amorphous silicon or polysilicon. Layer 136 preferably comprises the same material as layers 132 and 134. Layer 136 completely fills the recesses 135 and contacts layer 134 on the sidewalls of the recesses 135 in the openings 81.

Figure 18:
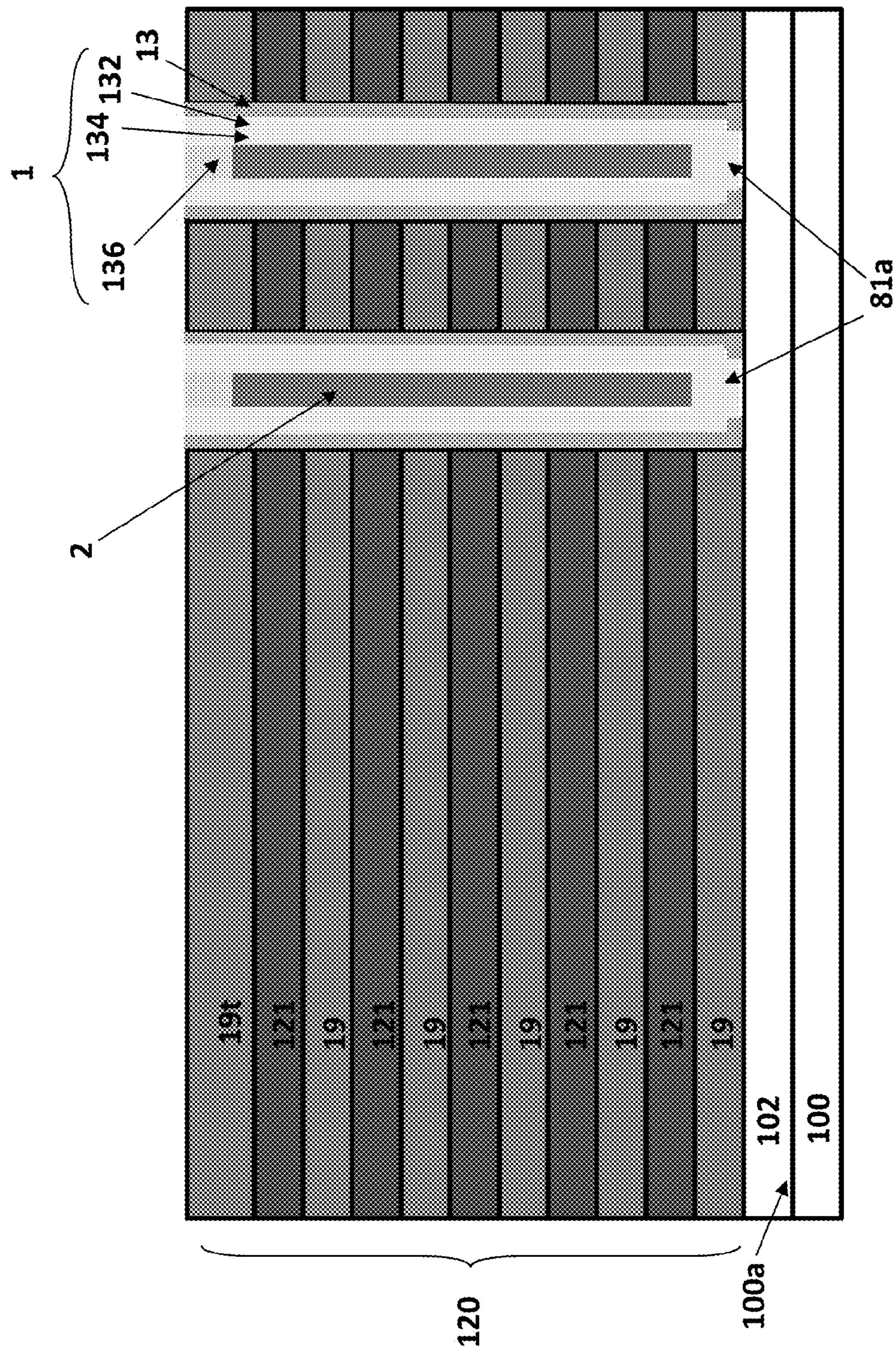

As shown in FIG. 18, the semiconductor channel layers 132, 134 and 136 are then planarized by etch back or CMP to remove these layers from the top of the stack 120 to expose the upper silicon oxide layer 19*t* of the stack. The channel layers 132, 134 and 136 remain in the openings 81 and together form the above described channel 1 in the memory device levels 70.

Thus, as shown in FIG. 18, the channel 1 of the embodiment of FIGS. 11-18 is composed of three sublayers 132, 134, 136. Sublayer 132 comprises an outer hollow cylinder or hollow inverse truncated cone which contacts the memory film 13 with its outer surface. Sublayer 132 does not contact the source line 102.

Sublayer 134 comprises an inner hollow cylinder or hollow inverse truncated cone which contacts sublayer 132 with its outer surface. Sublayer 134 contacts the core insulating layer 2 with its inner surface in the lower portion of the opening 81 and contacts sublayer 136 with its inner surface in the upper portion of the opening 81. Preferably, sublayer 134 completely fills the extension portion 81*a* of the opening 81 and contacts the source line 102.

Sublayer 136 comprises a filled cylinder or filled inverse truncated cone which is located only in the upper portion of the opening 81. Sublayer 136 contacts sublayer 134 with its outer surface. Sublayer 136 also contacts the top of the core insulating layer 2 with its bottom surface.

Figure 19:
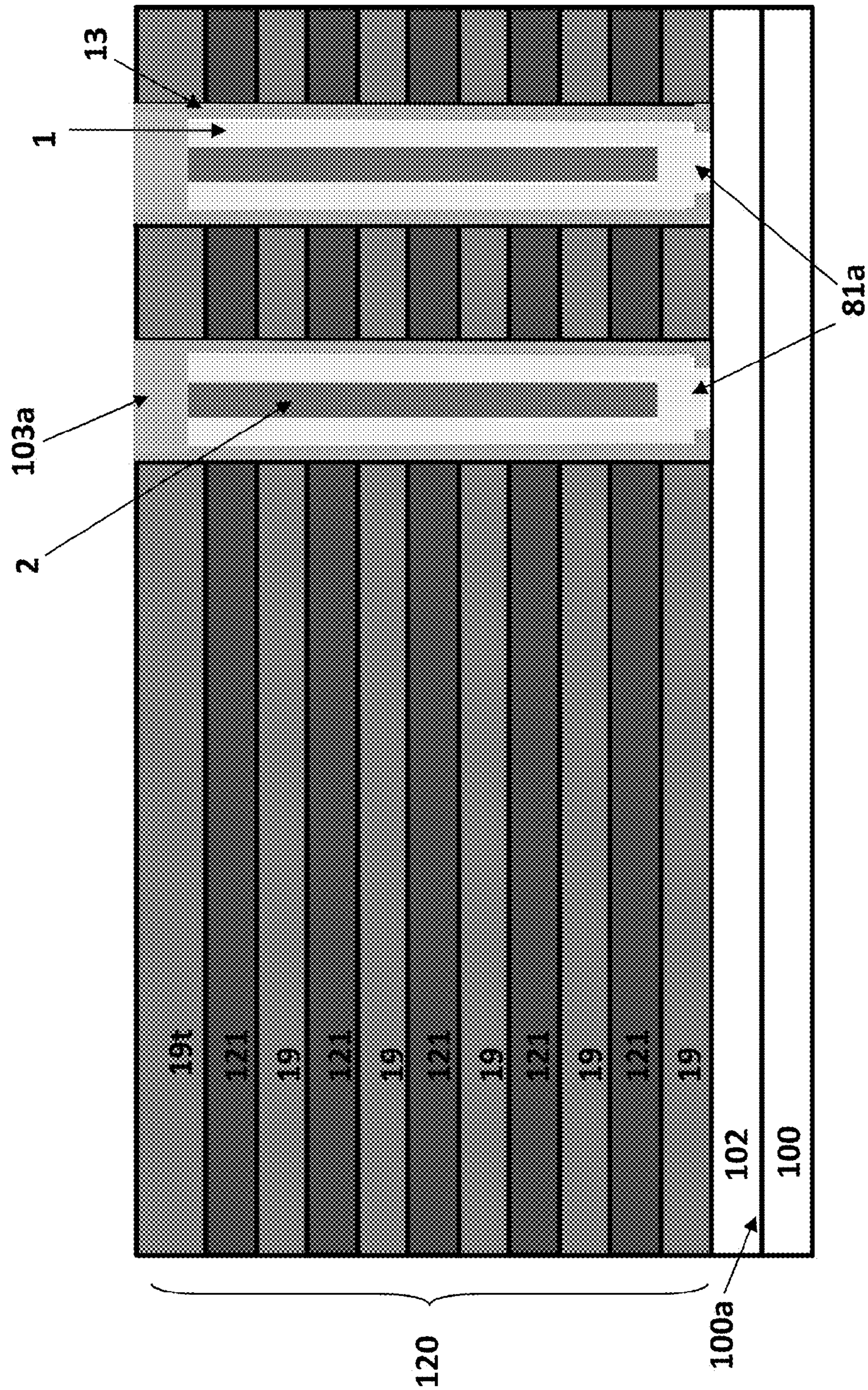

As shown in FIG. 19, the polysilicon channel 1 is doped to form a doped drain 103*a*.

Figure 20:
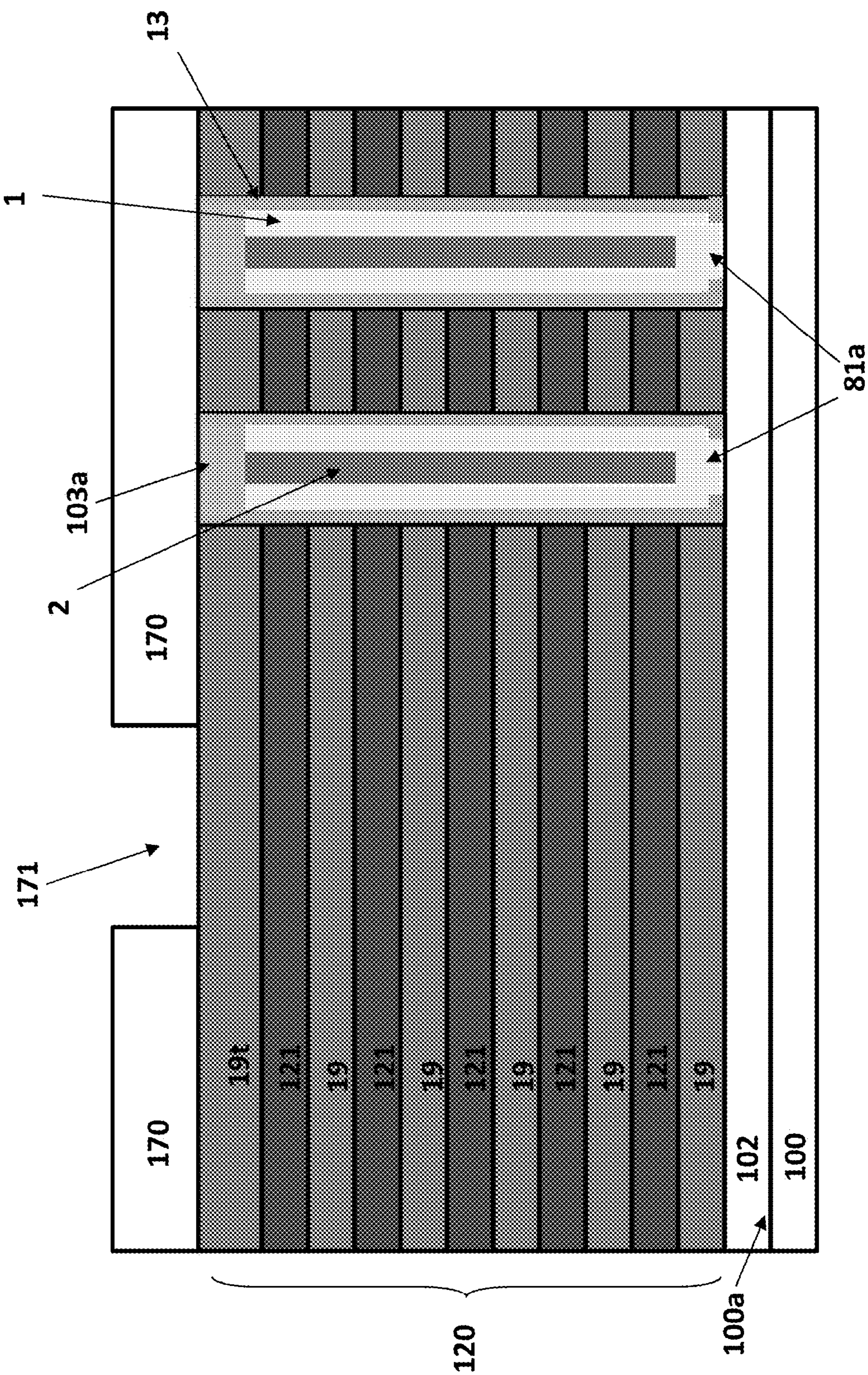
Figure 21:
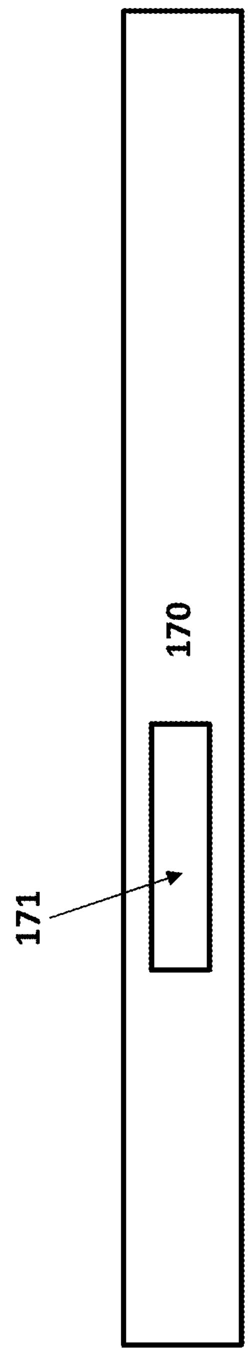
FIG. 21 is a top view of the steps shown in FIG. 22.
Figure 22:
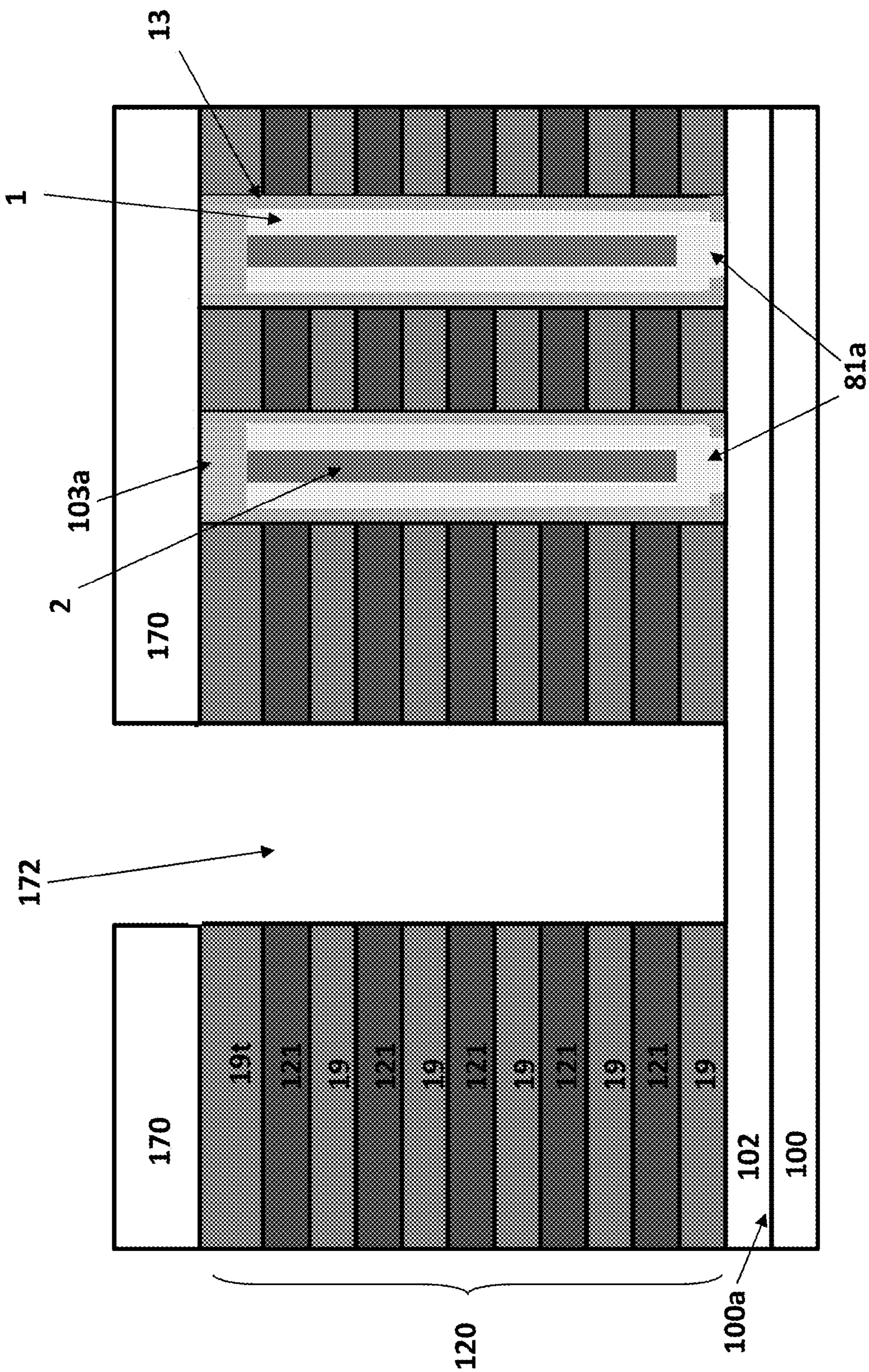
Figure 23:
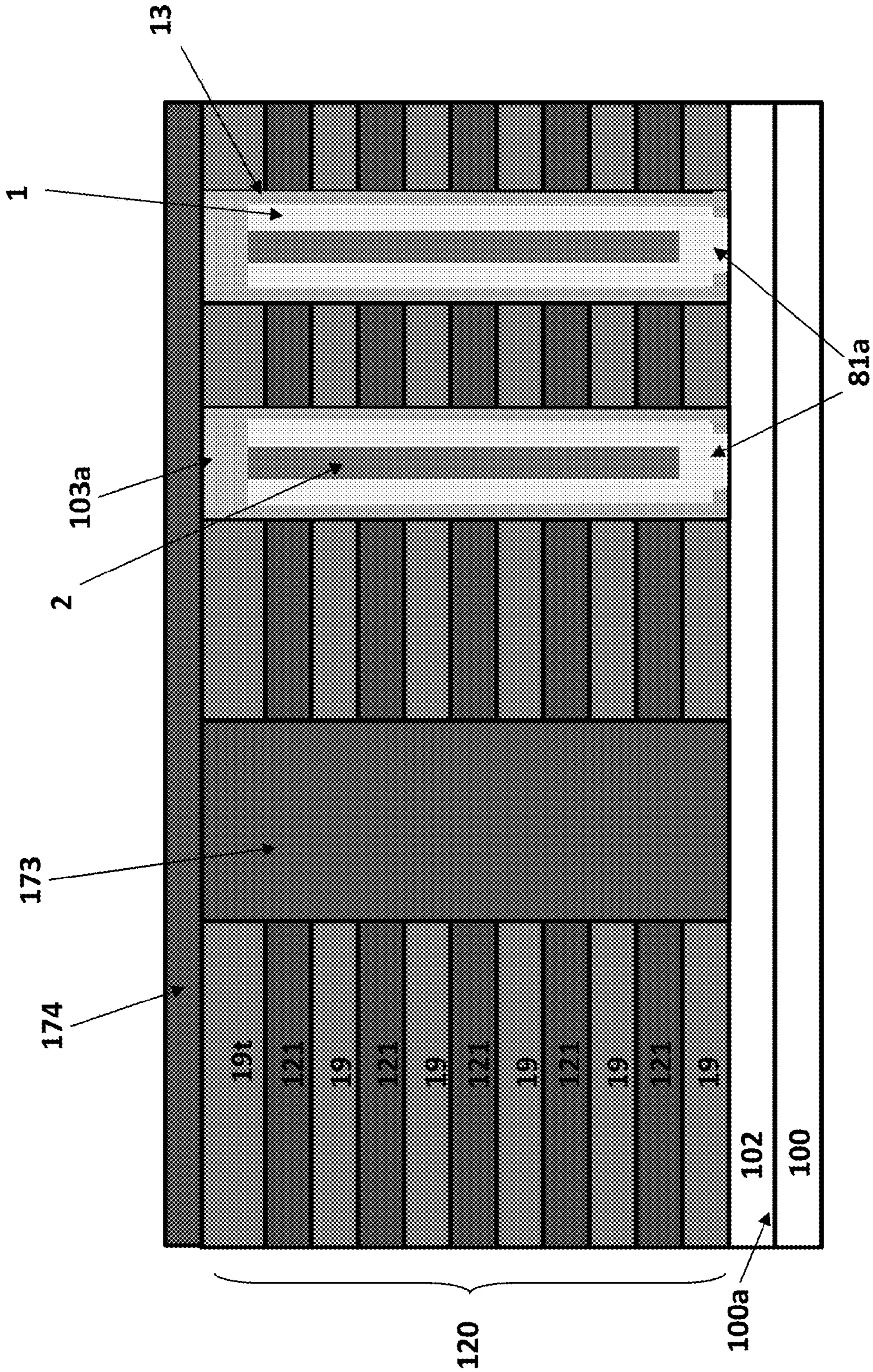

FIGS. 20-23 illustrate the formation of a support column which supports the stack layers after the sacrificial layer 121 are removed. FIGS. 20, 22, and 23 are side cross sectional views which have the same direction as the view in FIG. 19, but which are shifted into or out of the plane of the drawing in FIG. 19.

As shown in FIG. 20, a mask 170 is formed over the device and a column opening 171 is formed in the mask 170 to expose the upper silicon oxide layer 19*t* of the stack.

FIG. 21 shows the top view of the mask 170 having the opening 171. As shown in FIG. 22, a column opening 172 is etched through all of the layers in the stack to the source line 102 using RIE or another suitable method.

Finally, as shown in FIG. 23, the insulating support column 173 is formed in the column opening 172. The column 173 may be formed by depositing an insulating layer 174, such as a silicon oxide layer into the opening 172 and over the remaining device layers followed by planarization, such as a CMP planarization. While only one column 173 is shown in the figures, more than one column may be formed at the same time.

Figure 24:
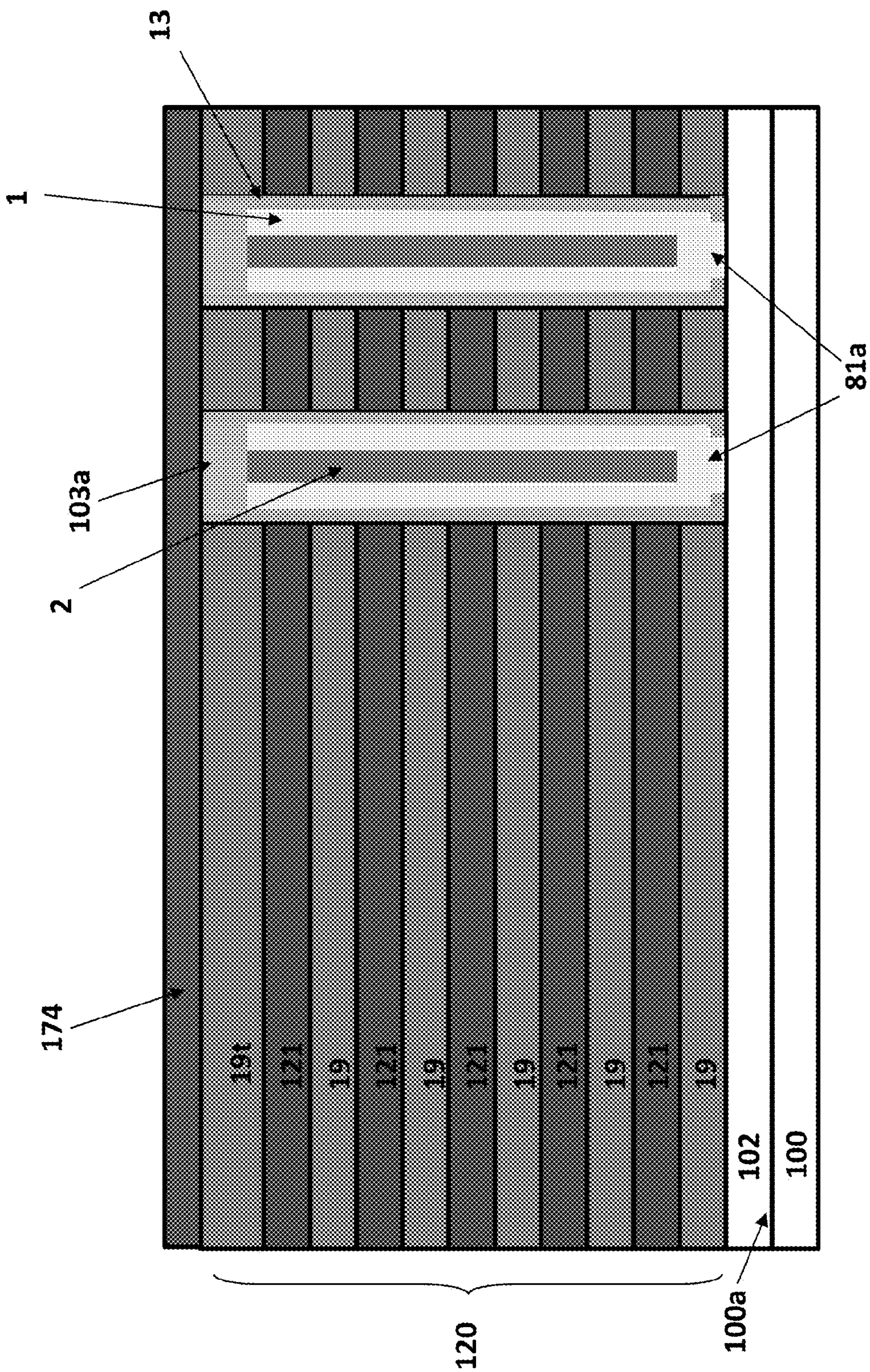

FIG. 24 shows the same cross sectional view as FIG. 20 after the formation of the column(s) 173 and layer 174. The view in FIG. 24 is in or out of the plane of the drawing in FIG. 23, such that the column 173 is not visible in FIG. 24.

FIGS. 25-34 illustrate a method of forming the trenches 84 and the source electrode 202.

Figure 25:
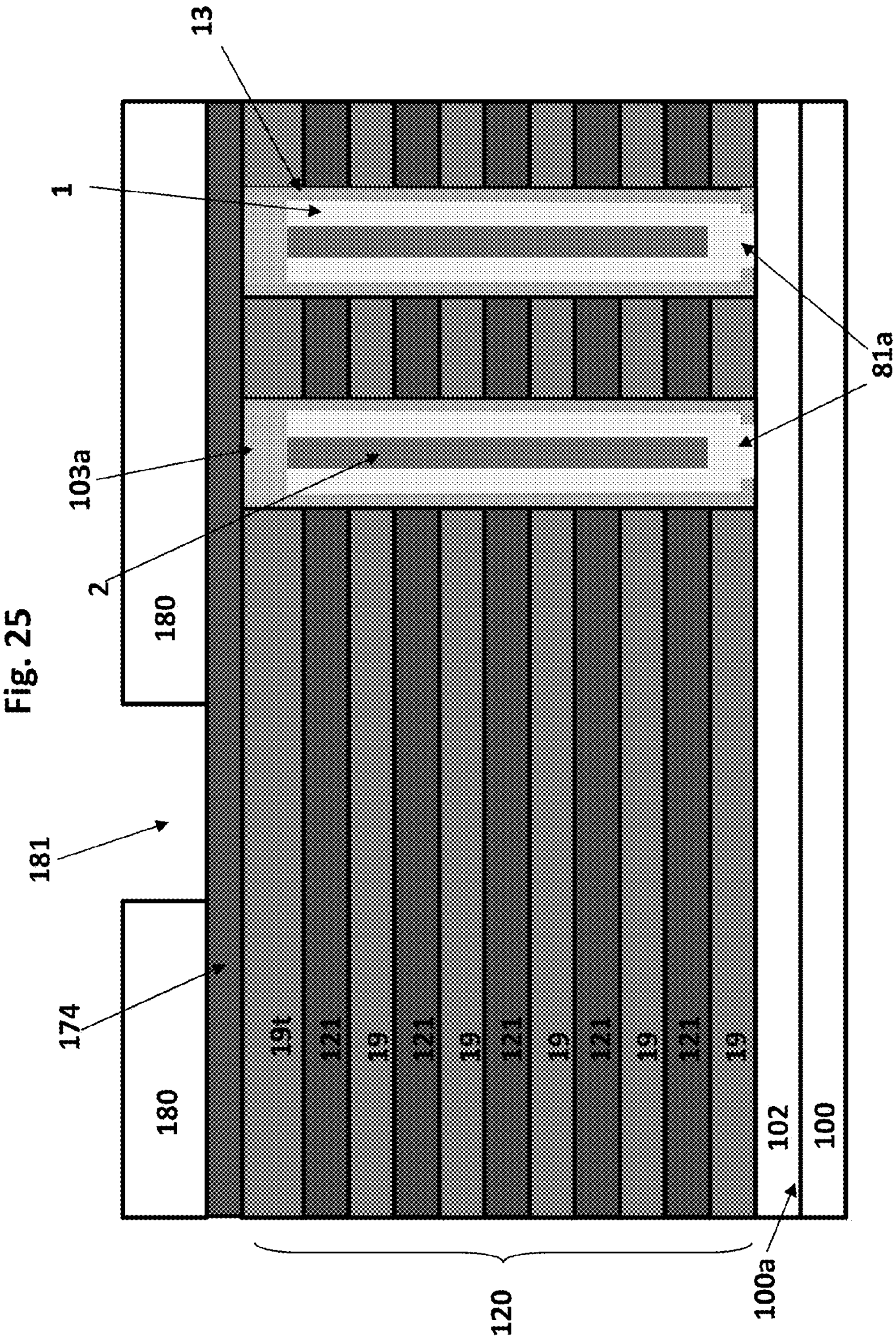

As shown in FIG. 25, a mask 180 is formed over layer 174. The mask 180 may be a photoresist and/or hard mask described above. At least one back side mask opening 181 is formed in the mask. Preferably, a plurality of openings 181 are formed in the mask 180.

Figure 26:
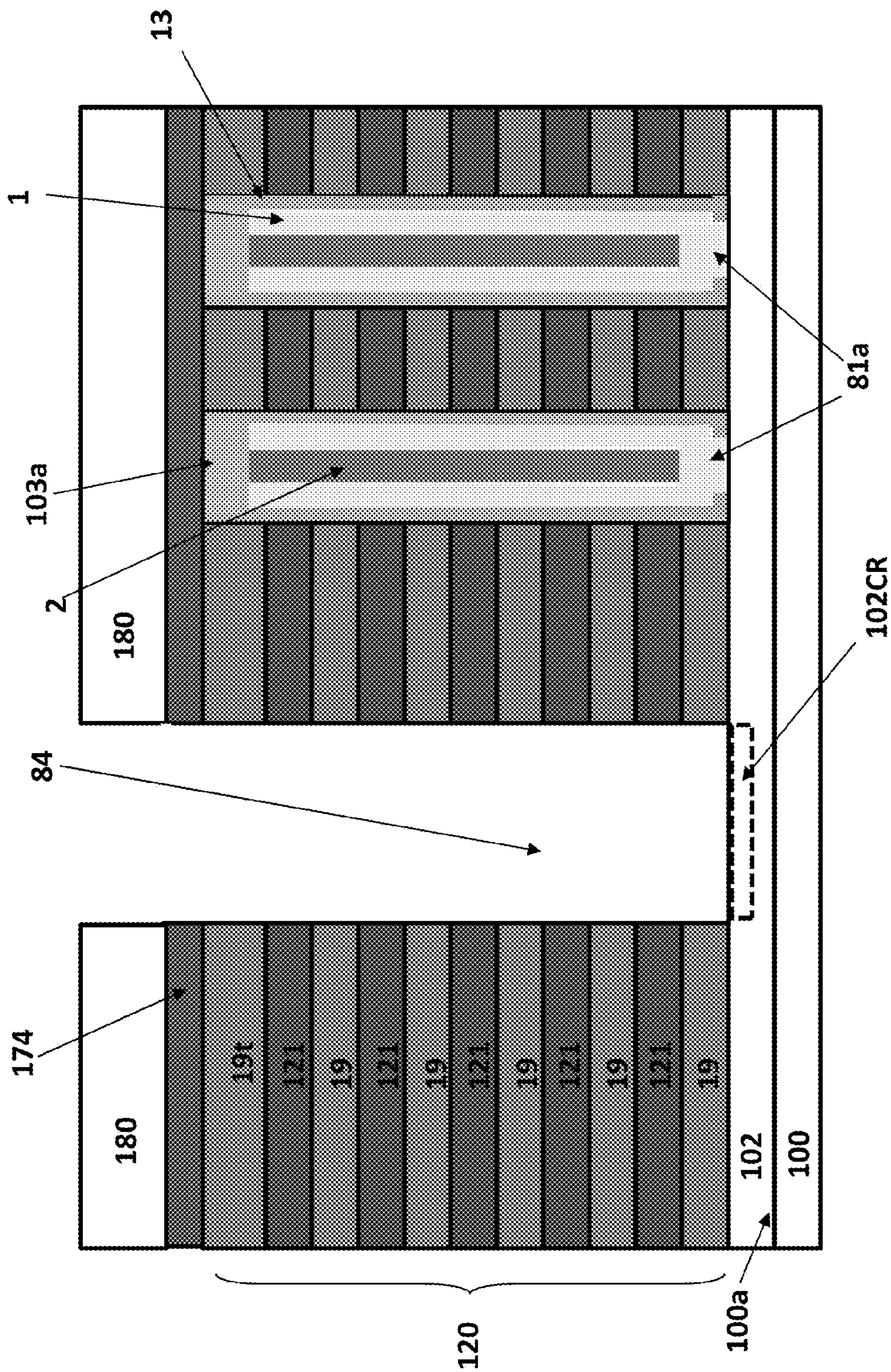

Then, as shown in FIG. 26, layer 174 and the stack 120 are etched through the openings 181 in the mask to form the back side openings (e.g., the trenches) 84 in the stack 120 extending to the source line 102. Thus, the step of forming the back side openings 84 forms back side trenches which exposes the source line 102, which may act as an etch stop.

Figure 27:
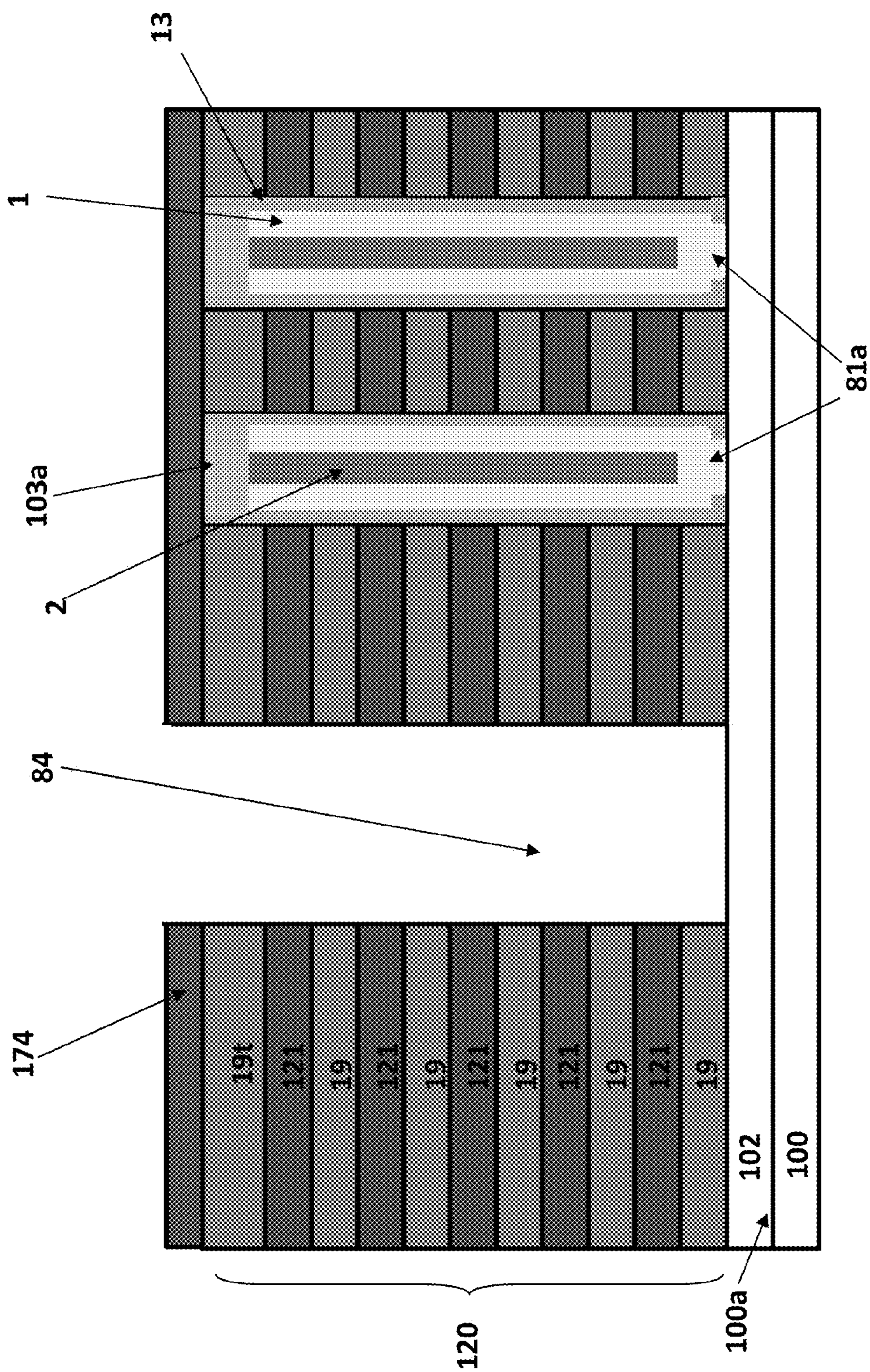

If the source line 102 comprises lightly or moderately doped polysilicon (e.g., n-type polysilicon), then if desired, dopants (e.g., n-type dopants, such as arsenic or phosphorus and/or p-type dopants, such as boron) may optionally be implanted into the source line 102 through opening 84 to form a heavily doped contact region 102CR in the source line 102 which will contact the source electrode 202 which will be formed in the opening 84. In an embodiment both n-type and p-type dopants are implanted to form an N−/P+ region 102CR followed by an activation anneal. The mask 180 may then be removed, as shown in FIG. 27.

Figure 28:
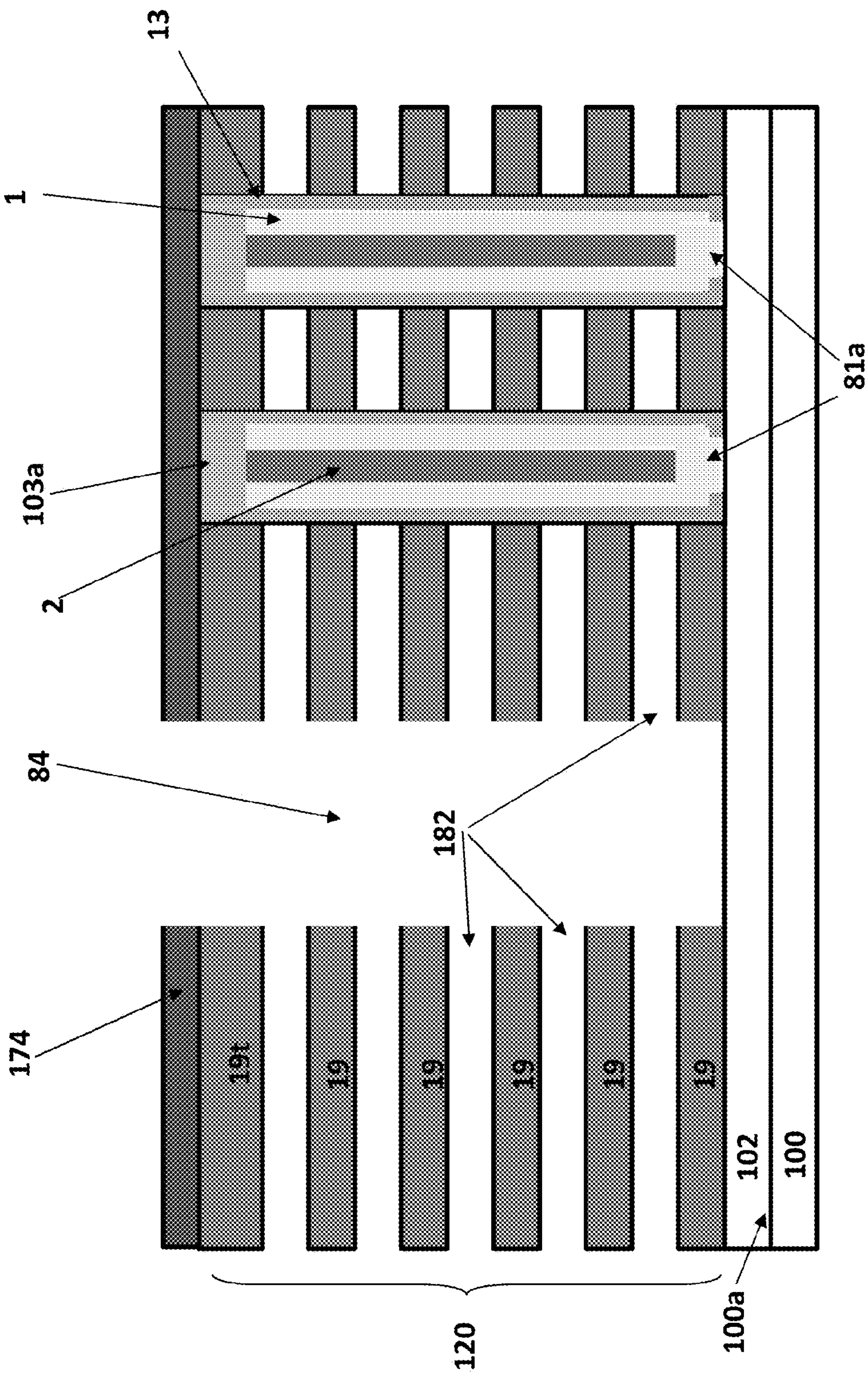

Then, at least a portion of the sacrificial second material layers 121 are removed through the back side openings 84 to form back side recesses 182 between the first material layers 19, as shown in FIG. 28. Layers 121 may be removed by selective etching, such as a silicon nitride selective etching which removes silicon nitride layers 121 but does not remove the silicon oxide layers 174, 19 and 7 or the silicon regions (e.g., source line 102). The selective etch may stop on the oxide blocking dielectric, such as a silicon oxide blocking dielectric 7 which forms the outer part of the memory film 13. The support column 173 described above supports the spaced apart layers 19 of the stack 120 and prevents layers 19 from collapsing on each other.

Figure 29:
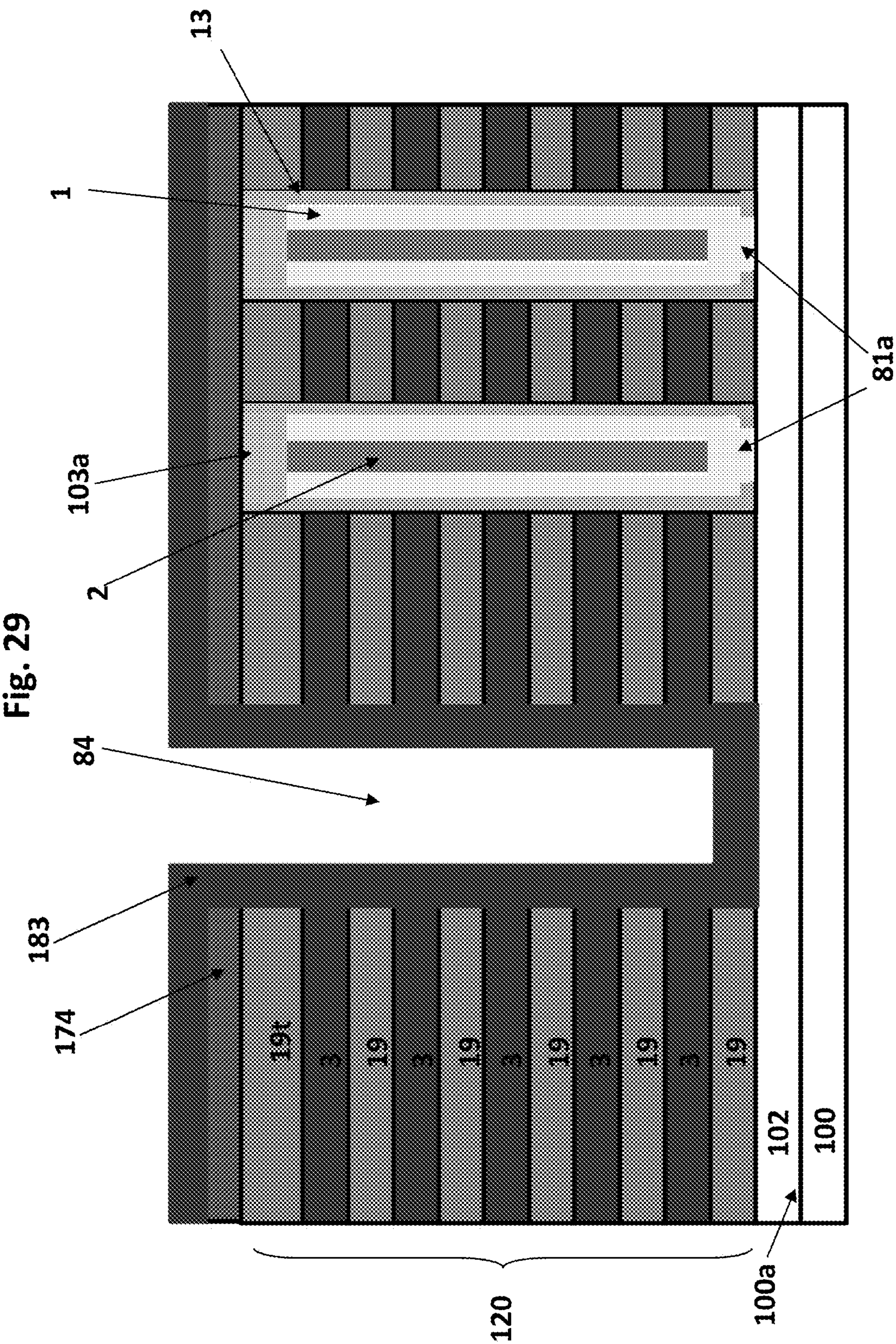

Metal or metal alloy control gate electrodes 3 are then formed in the back side recesses 182 through the back side openings 84, as shown in FIG. 29. A portion 183 of the metal or metal alloy control gate material partially or fully fills the back side openings (e.g., trenches) 84 and is located over layer 174. The control gate electrode 3 material may comprise any suitable materials described above. For example, the material may comprise a TiN liner and tungsten gate material.

Figure 30:
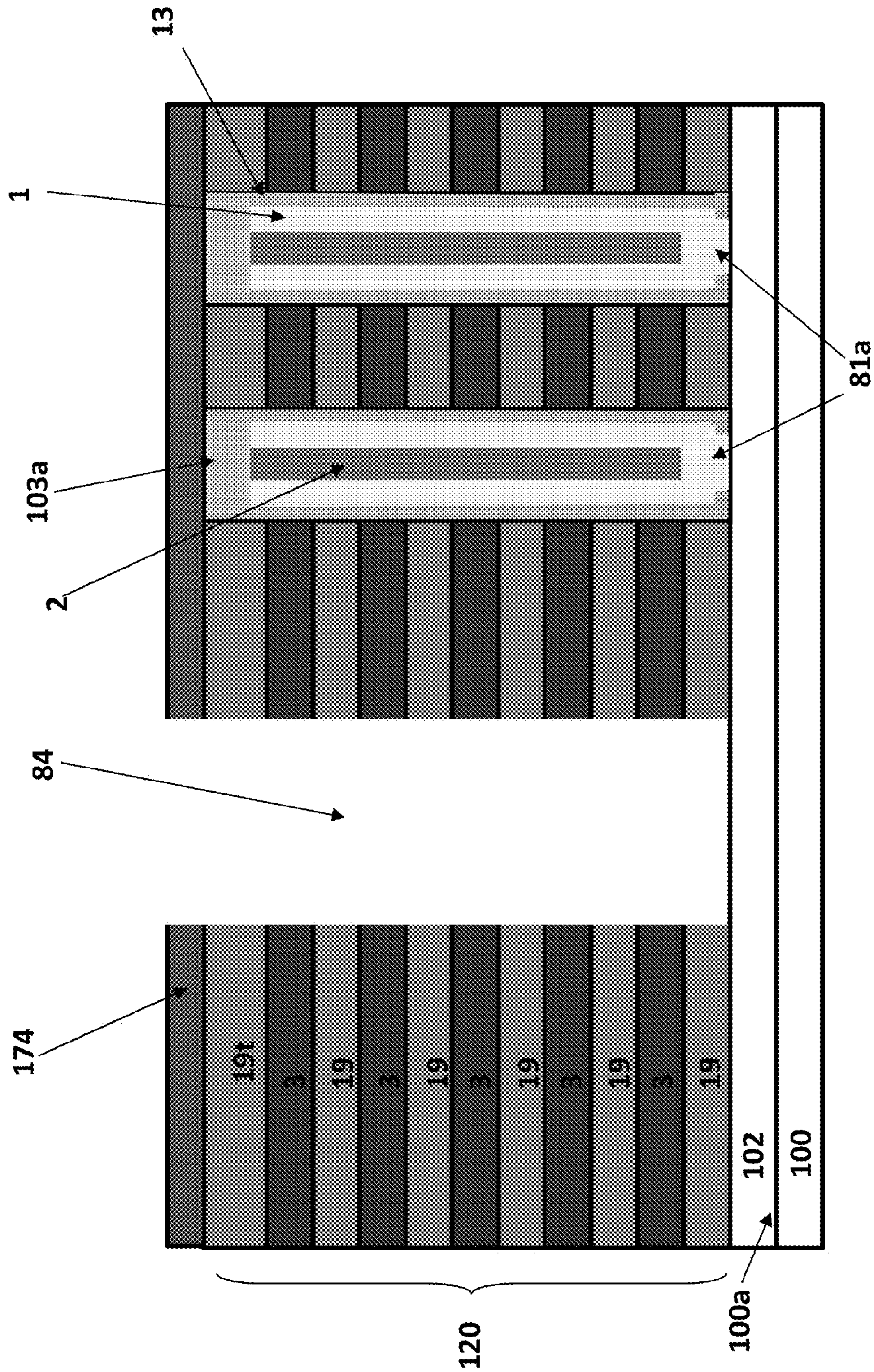

Then, as shown in FIG. 30, the portion 183 of the metal or metal alloy control gate material is removed by anisotropic etching from the back side openings (e.g., trenches) 84 and from over layer 174 without removing the control gate electrodes 3 to complete the formation of the control gate electrodes 3. The select gate electrodes (33, 34 shown in FIG. 3C, but not shown in FIG. 30 for clarity) may be formed above and below the control gate electrodes 3 at the same time or during a different step.

Figure 31:
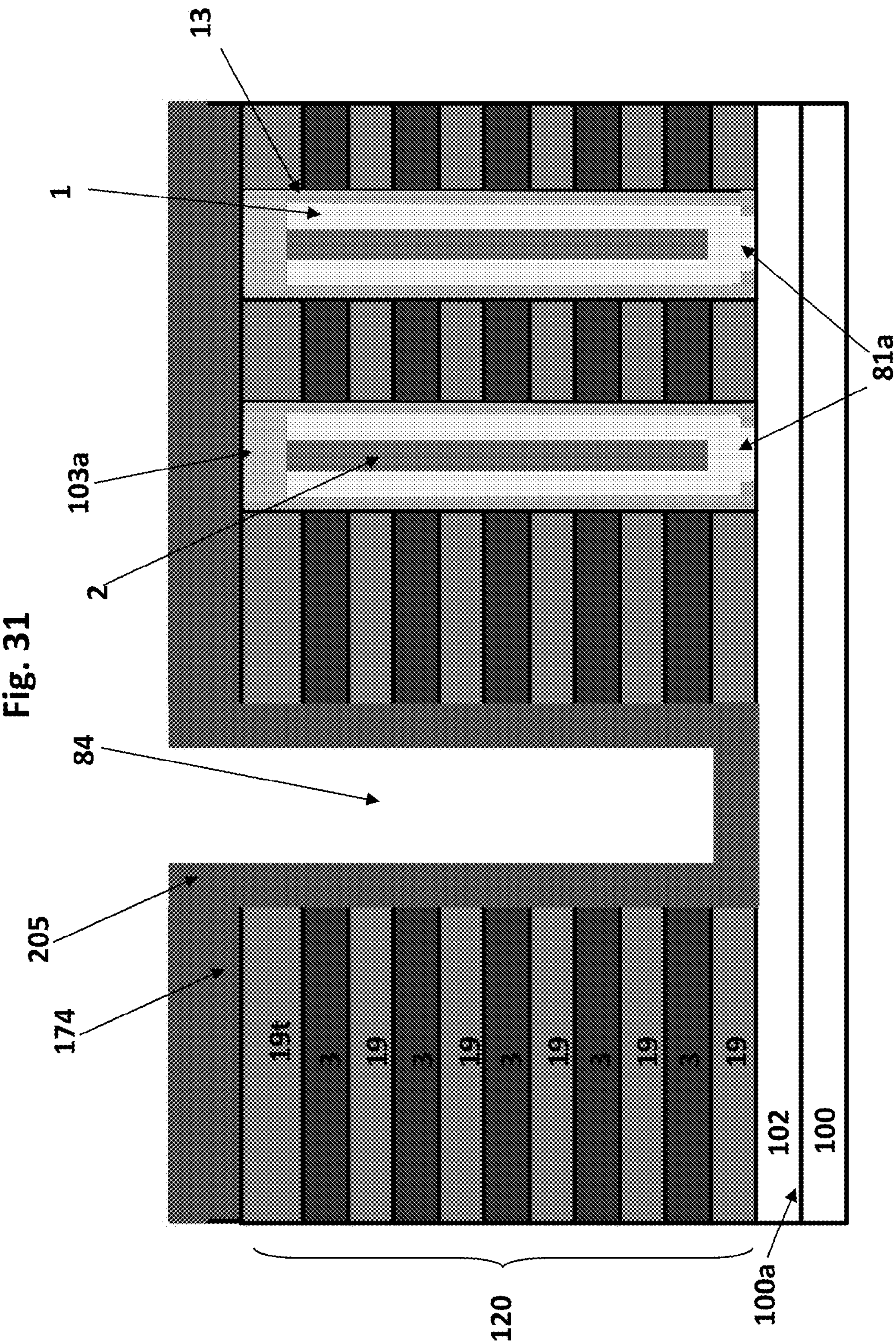
Figure 32:
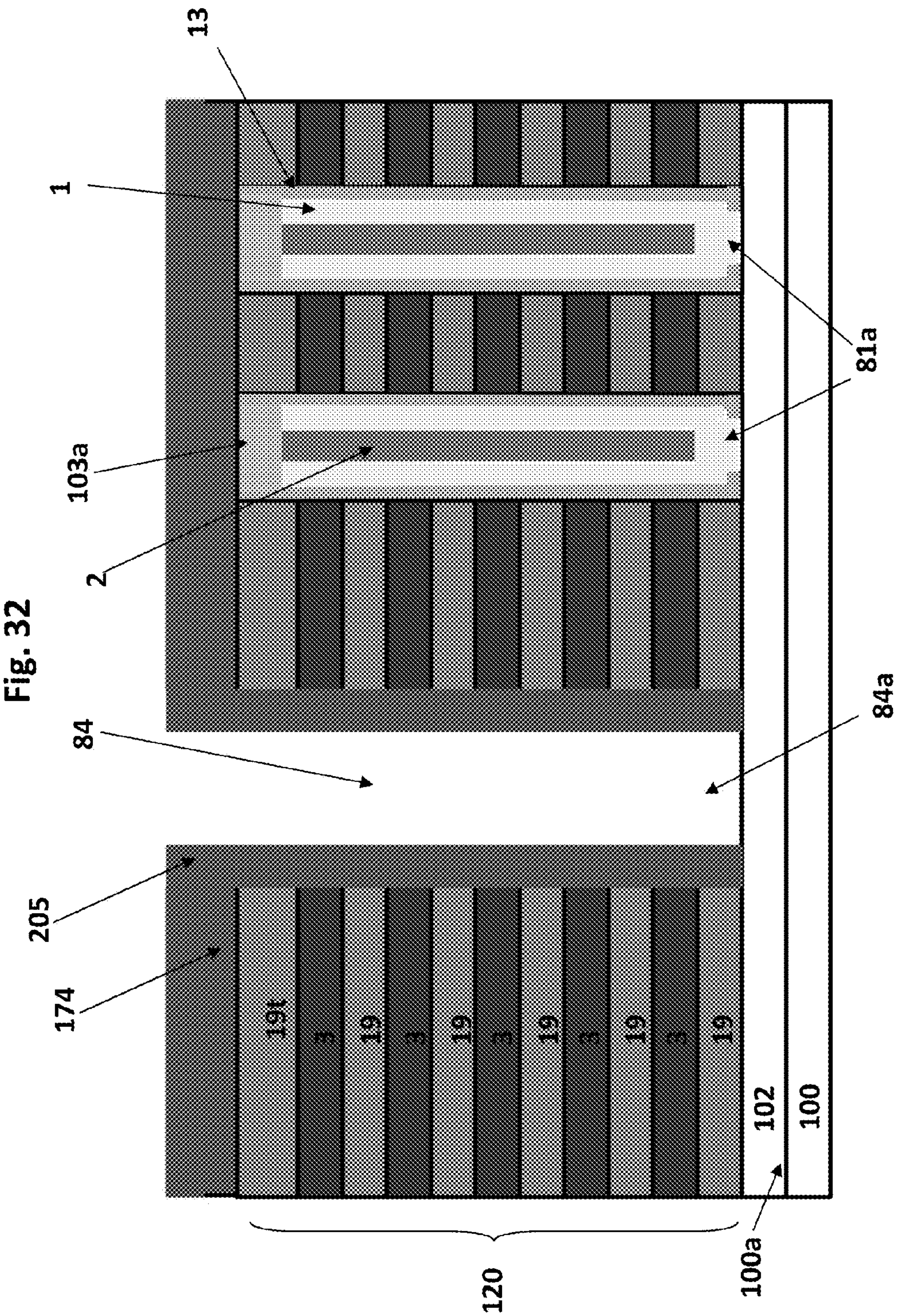

The insulating layer 205, such as a silicon oxide layer, is formed on sidewalls and bottom of the back side trenches 84, as shown in FIG. 31. Layer 205 is also formed over layer 174. The insulating layer 205 is then removed from the bottom 84*a* of the back side trench 84 by anisotropic etching (e.g., by RIE spacer etch) without removing the insulating layer from the sidewalls of the trench 84, as shown in FIG. 32. This etching step exposes the source line 102 through the bottom 84*a* of the trench 84.

Figure 33:
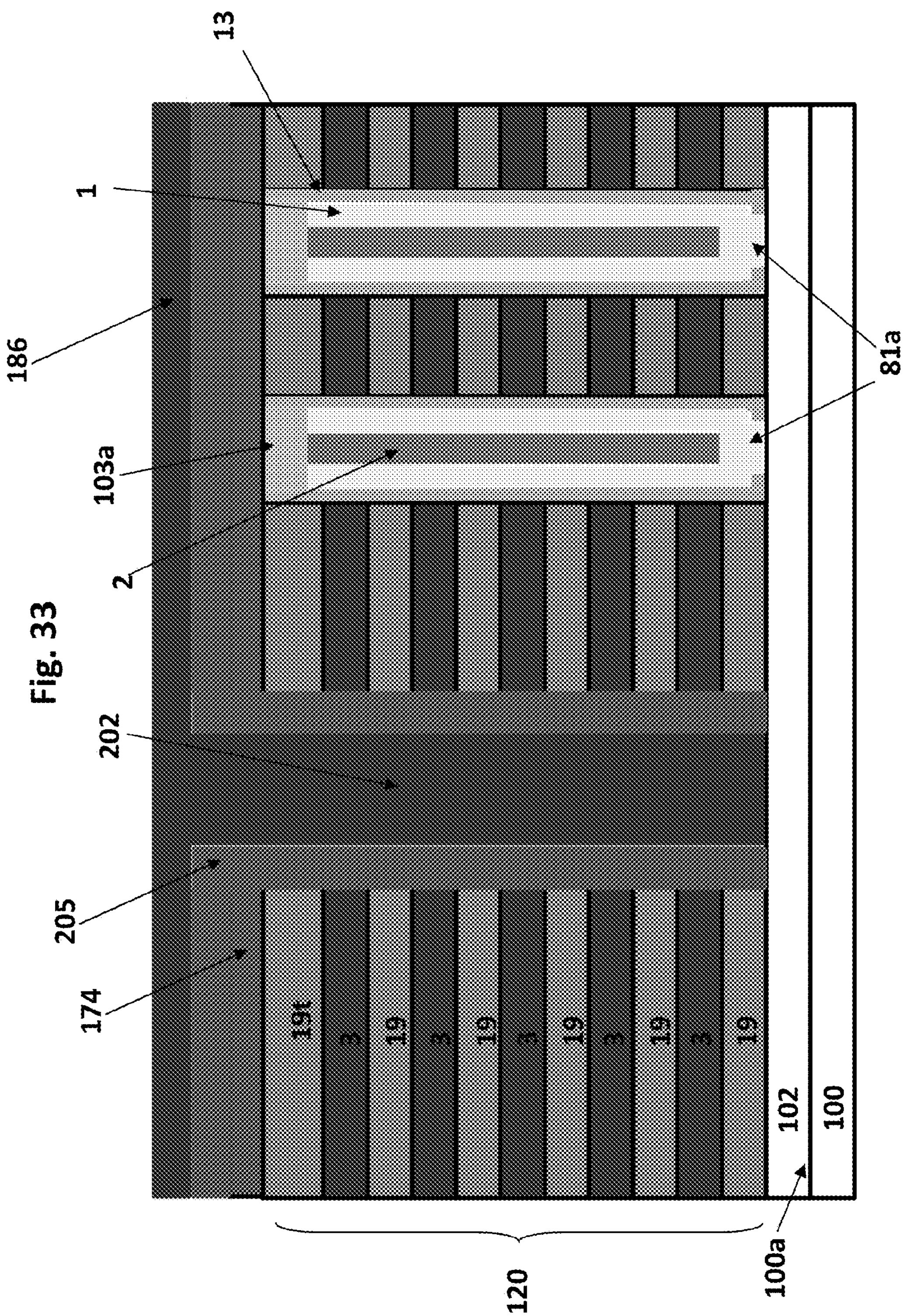
Figure 34:
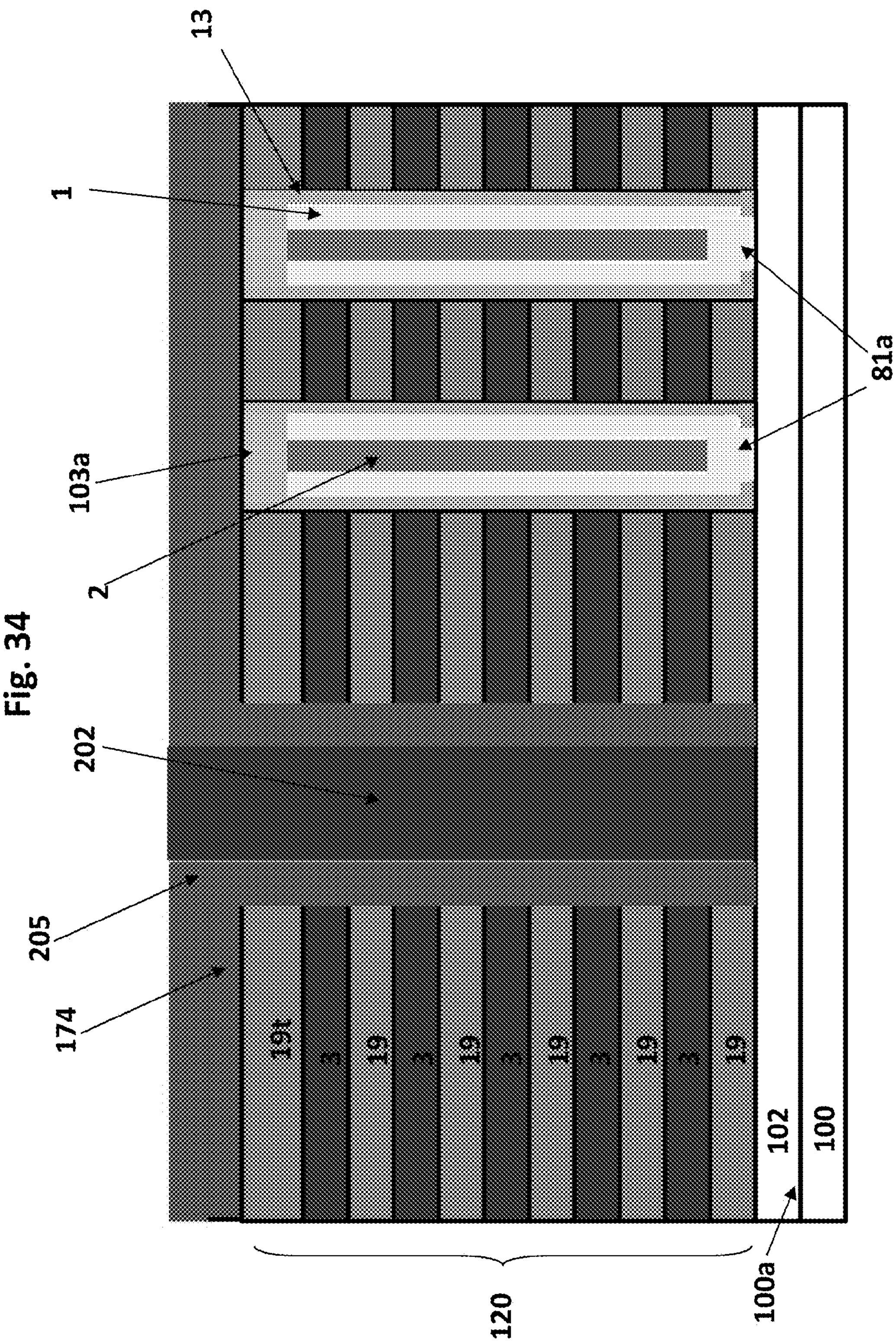

The source electrode 202 is then formed in the back side trench 84 in contact with the source line 102, as shown in FIG. 33. The source electrode 202 may be formed by depositing any suitable metal or metal alloy layers, such as TiN, ruthenium, and/or tungsten over layer 205 in the trenches 84. A portion 186 of the source electrode material located over the device is removed by CMP or etching to leave the source electrode 202 in the dielectrically insulated trenches 84, as shown in FIG. 34.

Figure 35:
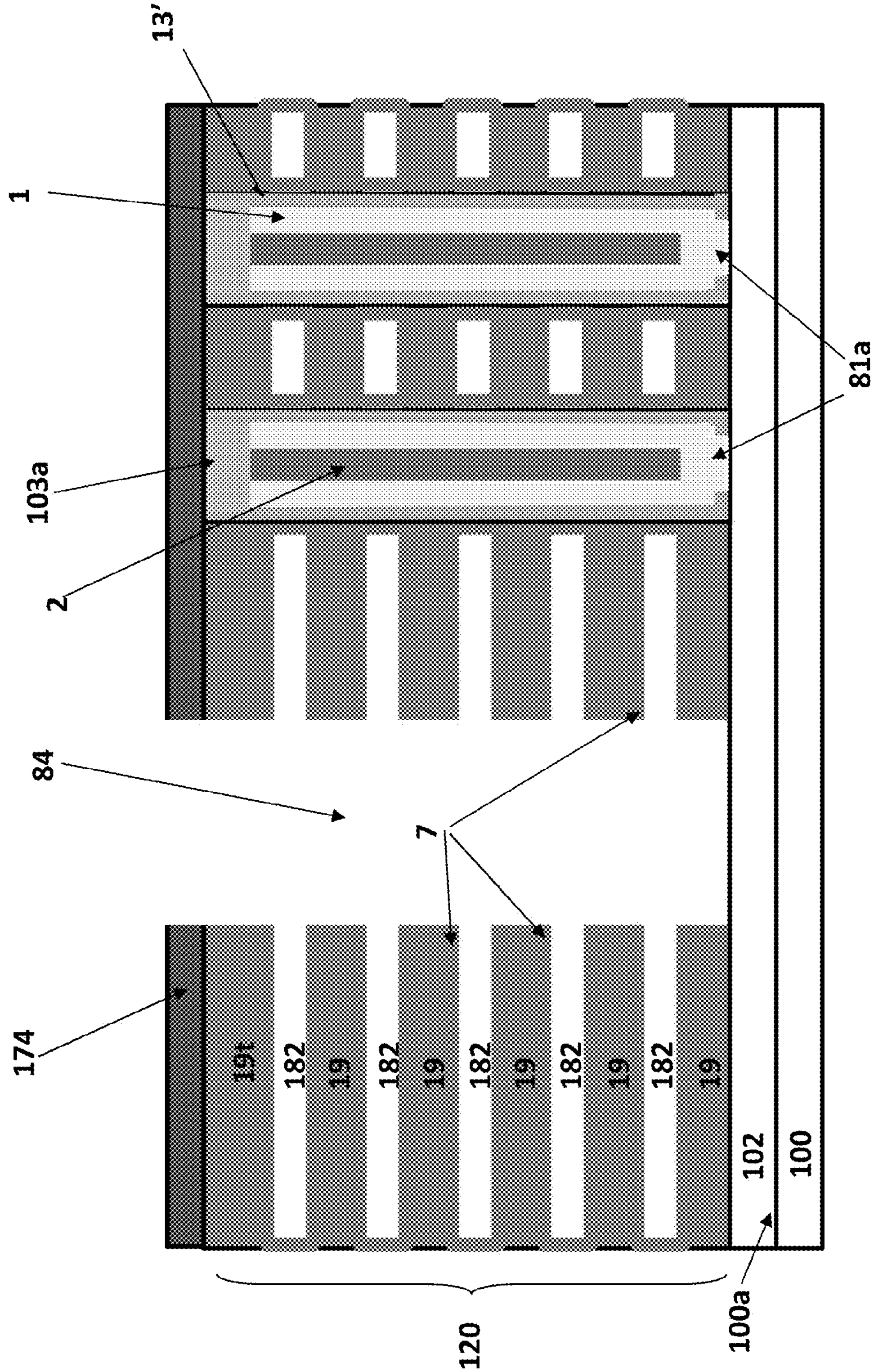
FIGS. 35-41 are side cross sectional views illustrating steps in an embodiment method of making the device illustrated in FIGS. 1E and 2A along line B-B' in the bit line direction.

In some embodiments, the blocking dielectric 7 may surround the control gate 3, as shown in FIG. 1E. A method for making this embodiment is shown in FIGS. 35-41. In the embodiment shown in FIG. 35, the memory film 13' contains the tunnel dielectric 11 and the charge storage region(s) 9 (e.g., a charge trapping layer or floating gates). Following the removal of sacrificial layers 121, shown in FIG. 28, a blocking dielectric 7 is deposited within the recesses 182, as shown in FIG. 35.

Figure 36:
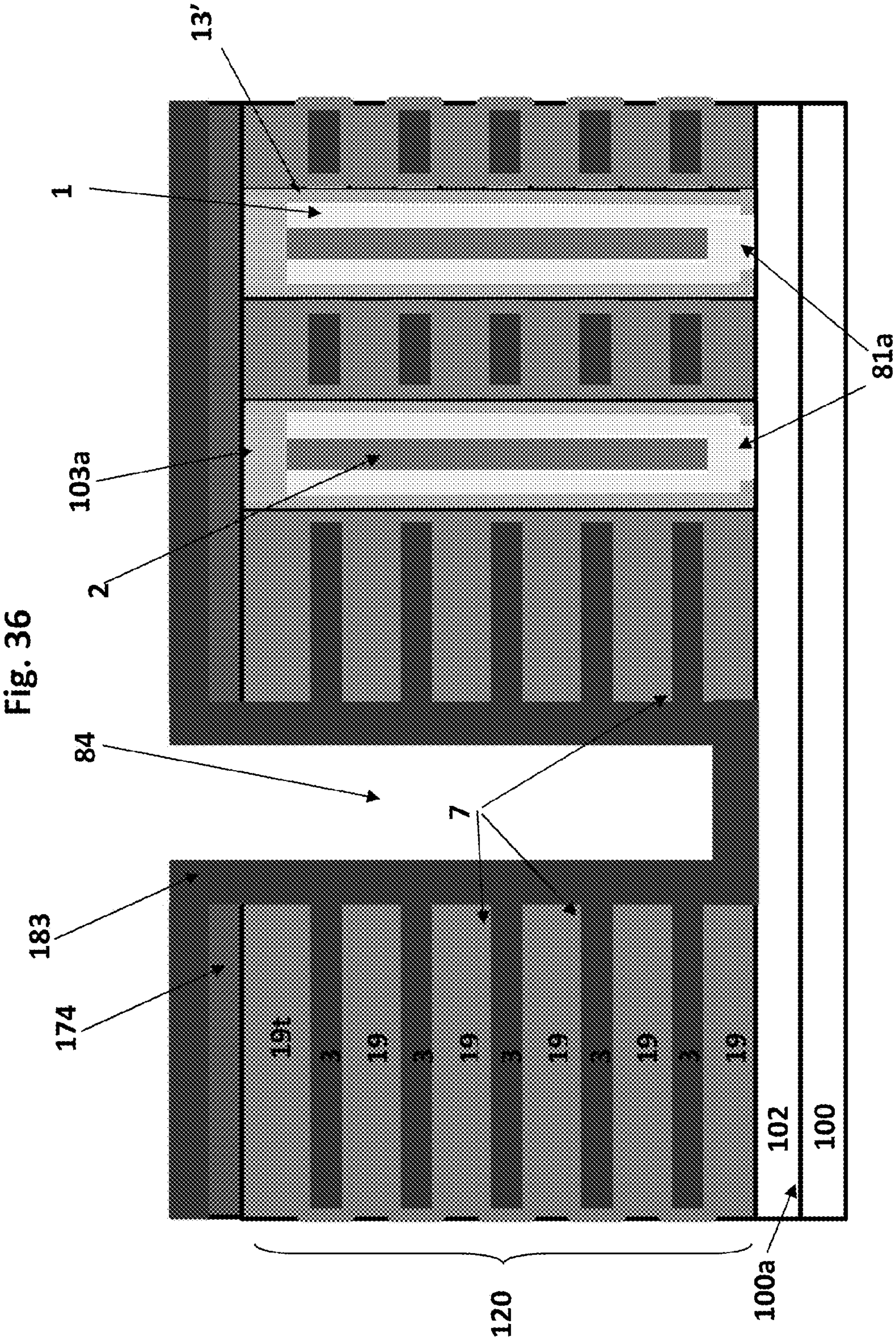

Metal or metal alloy control gate electrodes 3 are then formed in the back side recesses 182 through the back side openings 84, as shown in FIG. 36. A portion 183 of the metal or metal alloy control gate material partially or fully fills the back side openings (e.g., trenches) 84 and is located over layer 174. The control gate electrode 3 material may comprise any suitable materials described above. For example, the material may comprise a TiN liner and tungsten gate material.

Figure 37:
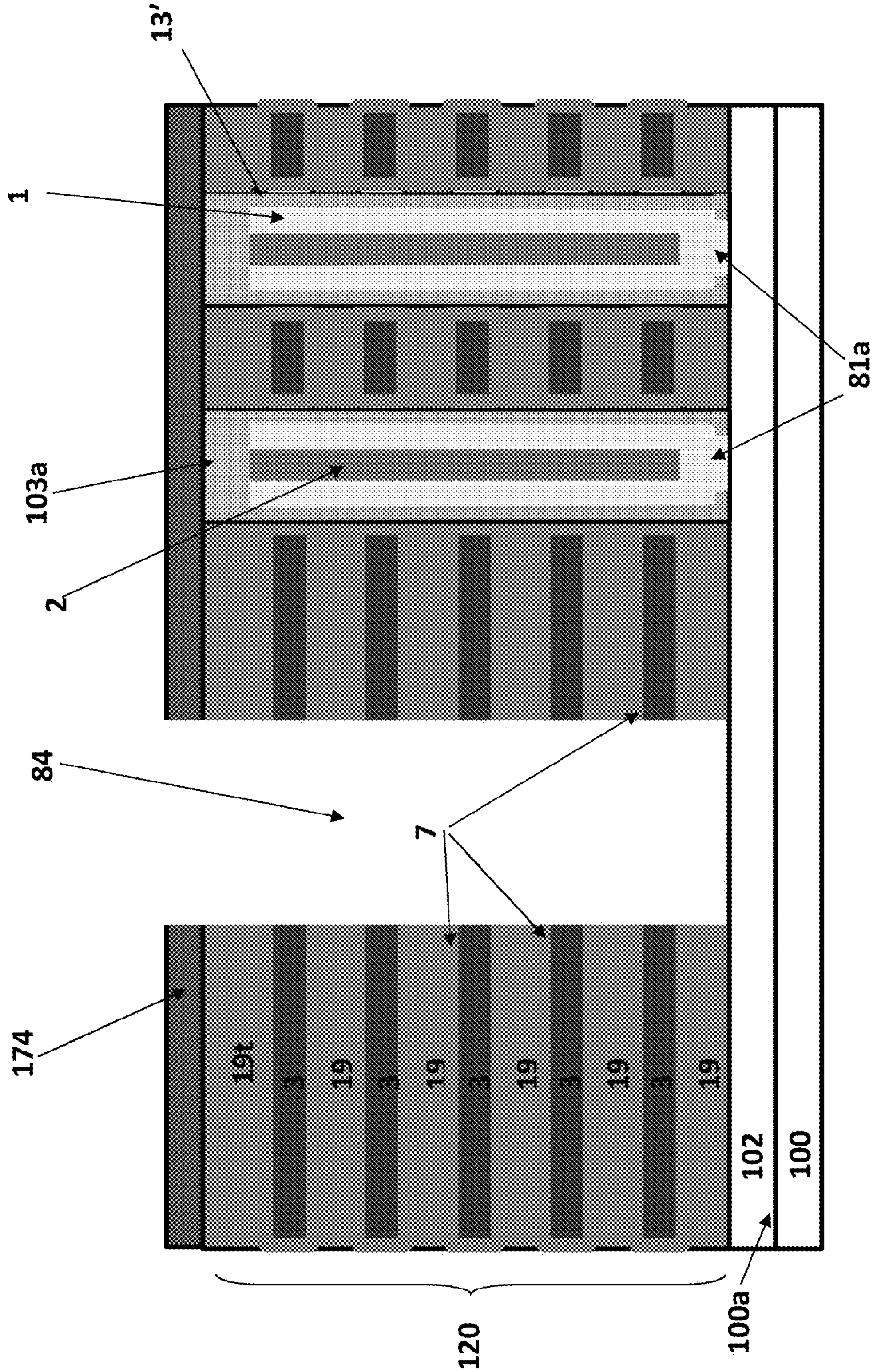

Then, as shown in FIG. 37, the portion 183 of the metal or metal alloy control gate material is removed by anisotropic etching from the back side openings (e.g., trenches) 84 and from over layer 174 without removing the control gate electrodes 3 to complete the formation of the control gate electrodes 3.

Figure 38:
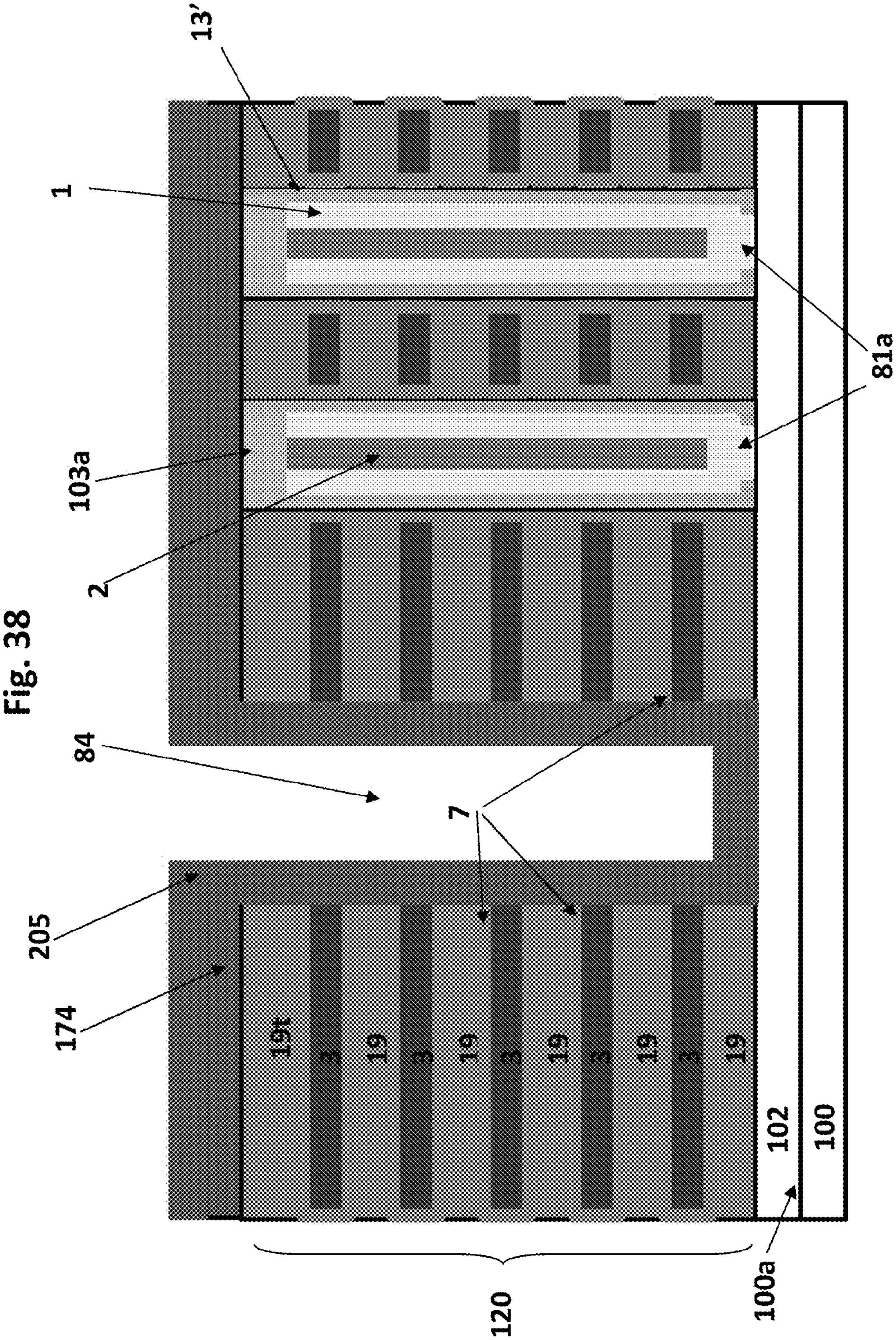
Figure 39:
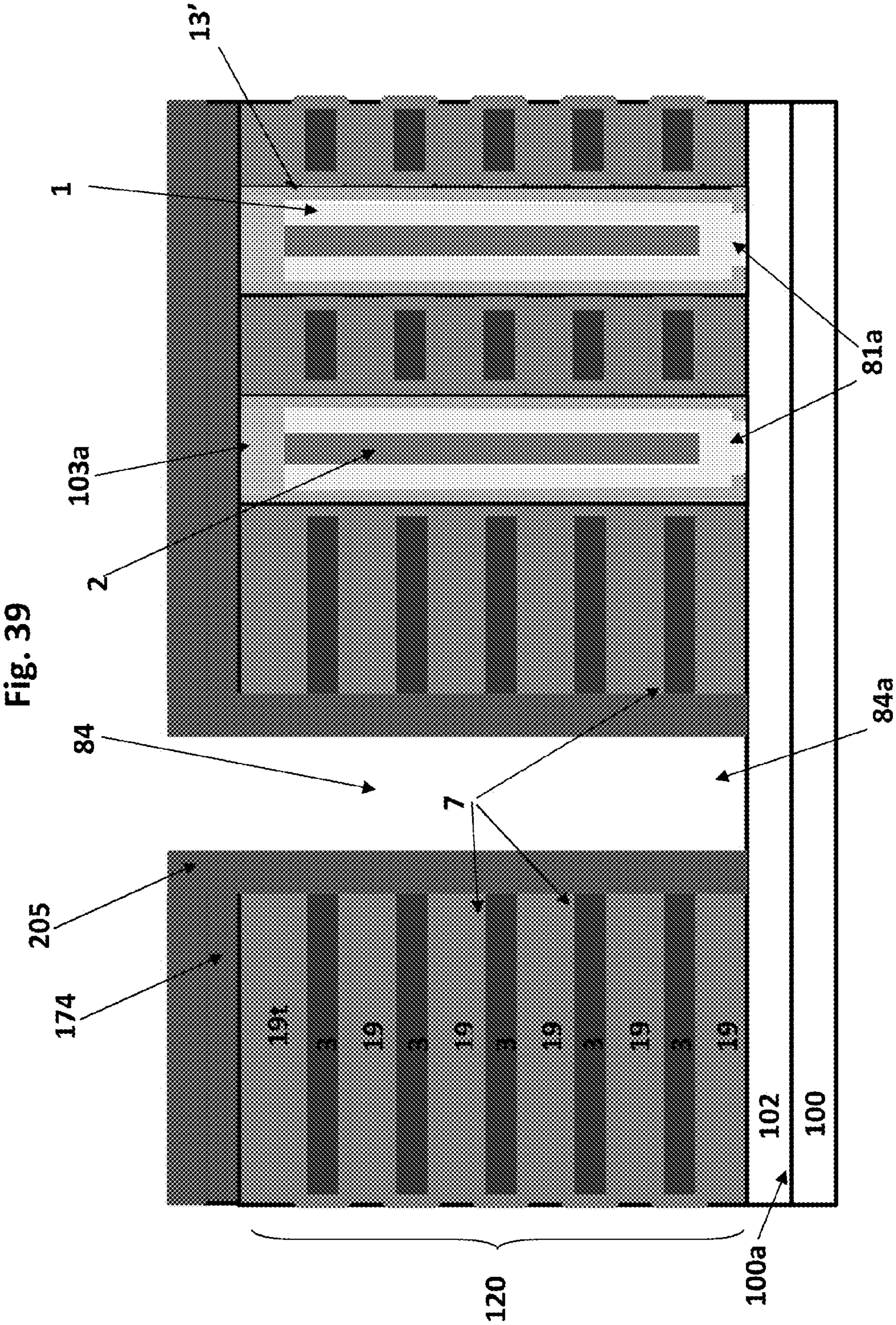

The insulating layer 205, such as a silicon oxide layer, is formed on sidewalls and bottom of the back side trenches 84, as shown in FIG. 38. Layer 205 is also formed over layer 174. The insulating layer 205 is then removed from the bottom 84*a* of the back side trench 84 by anisotropic etching (e.g., by RIE spacer etch) without removing the insulating layer from the sidewalls of the trench 84, as shown in FIG. 39. This etching step exposes the source line 102 through the bottom 84*a* of the trench 84.

Figure 40:
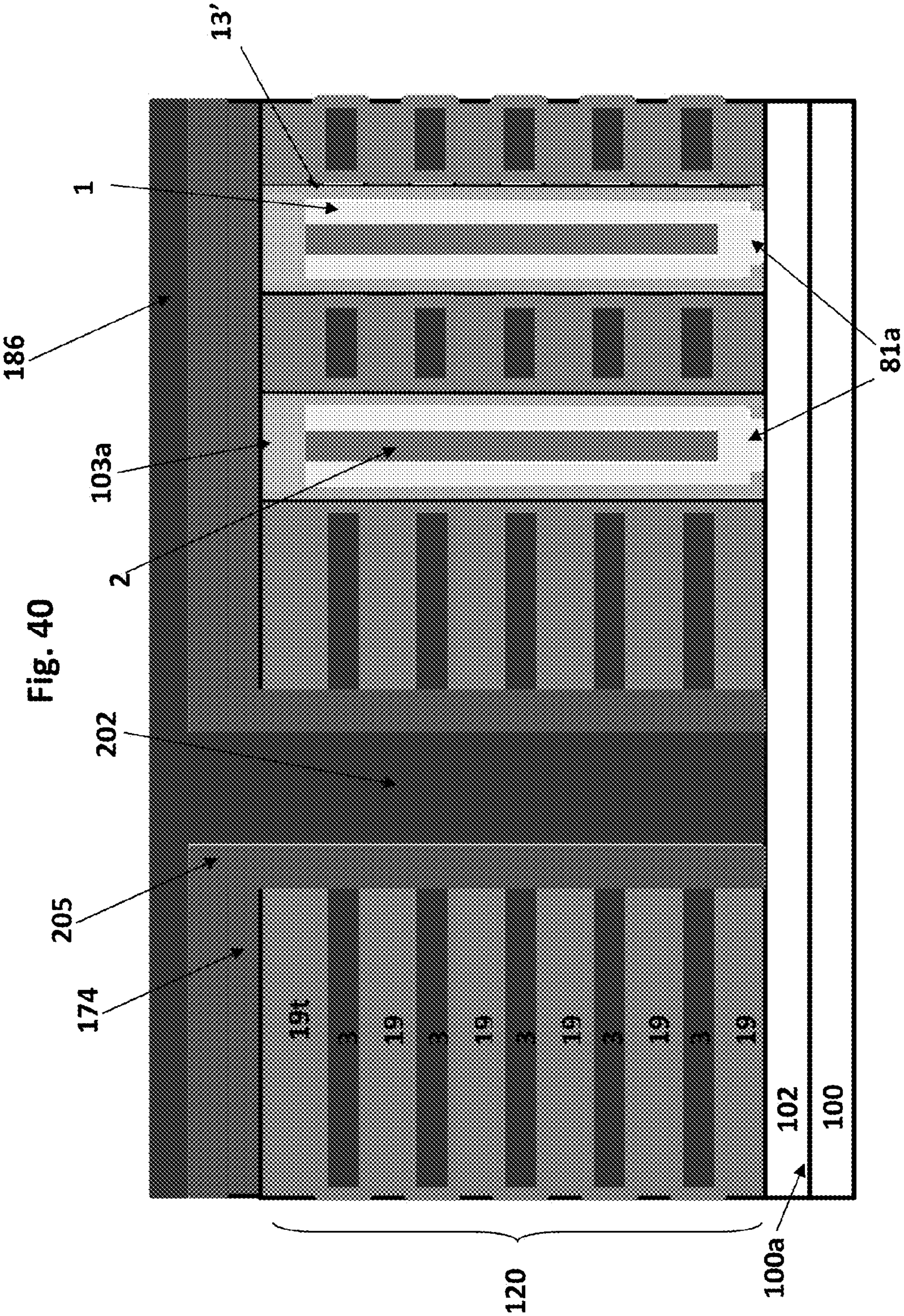
Figure 41:
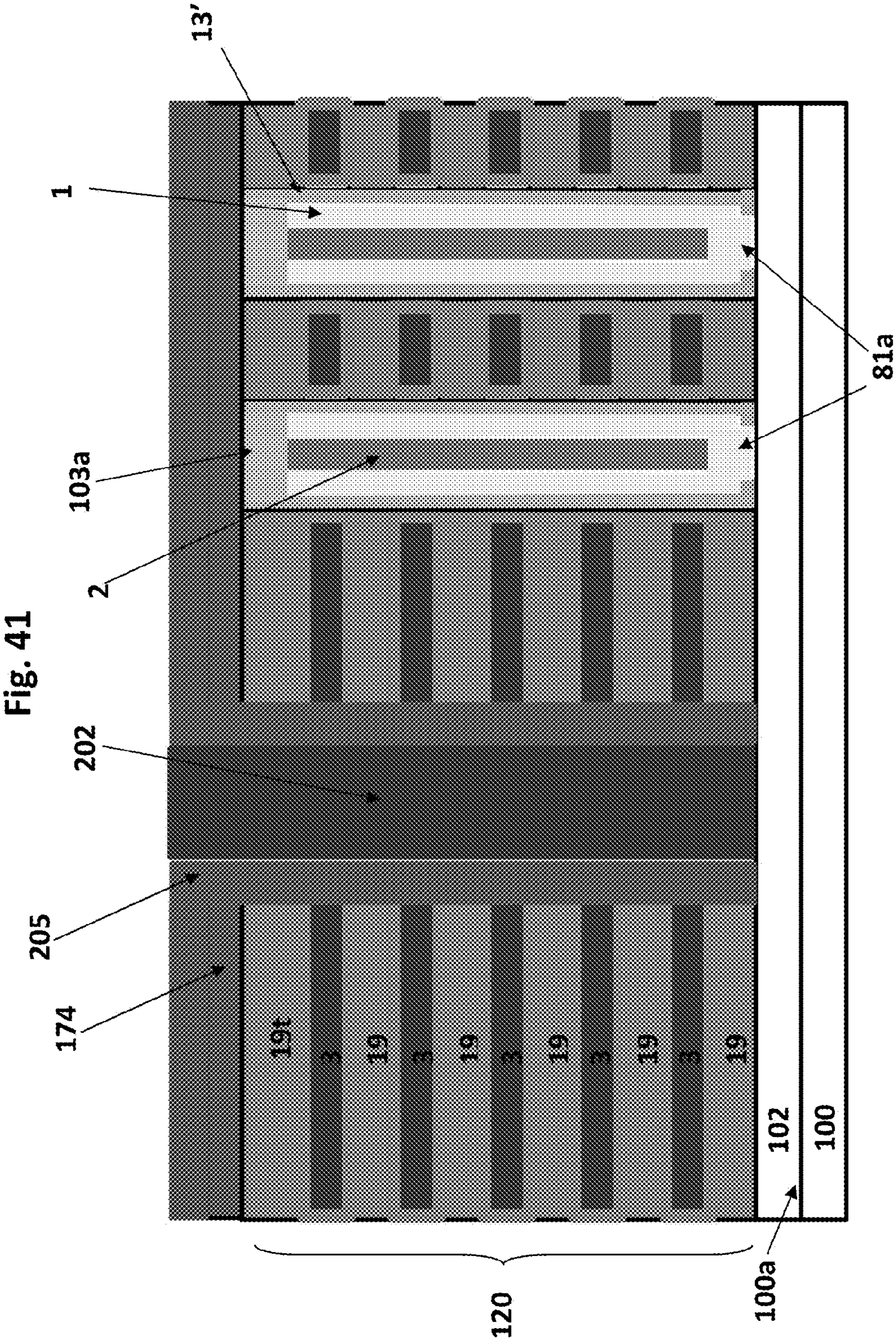

The source electrode 202 is then formed in the back side trench 84 in contact with the source line 102, as shown in FIG. 40. The source electrode 202 may be formed by depositing any suitable metal or metal alloy layers, such as TiN, ruthenium, and/or tungsten over layer 205 in the trenches 84. A portion 186 of the source electrode material located over the device is removed by CMP or etching to leave the source electrode 202 in the dielectrically insulated trenches 84, as shown in FIG. 41. Openings are then formed to the drain regions 103*a*. Drain lines 103 and drain electrodes (i.e., bit lines) 203 may then be formed in contact with the drain regions 103*a* through the openings as shown in FIGS. 2B and 2C.

Figure 42:
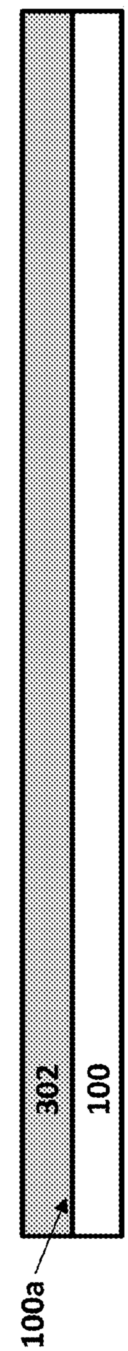
FIGS. 42-76 are side cross sectional views illustrating steps in an embodiment method of making the device illustrated in FIGS. 1F and 2A along line B-B' in the bit line direction.
Figure 43A:
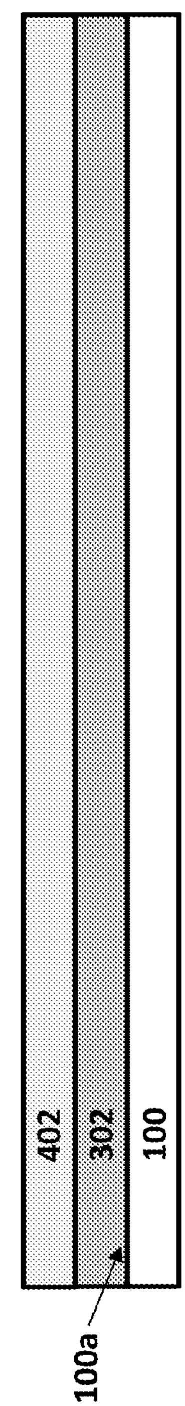

FIGS. 42-75 show an alternative method of making the NAND string in which the source line comprises a metal or metal alloy formed by a replacement method. FIG. 42 shows a sacrificial layer 302 formed substantially parallel to a major surface 100*a* of a substrate 100. An etch stop layer 402, such as a polysilicon layer is formed over the sacrificial layer 302, as shown in FIG. 43A.

Figure 43B:
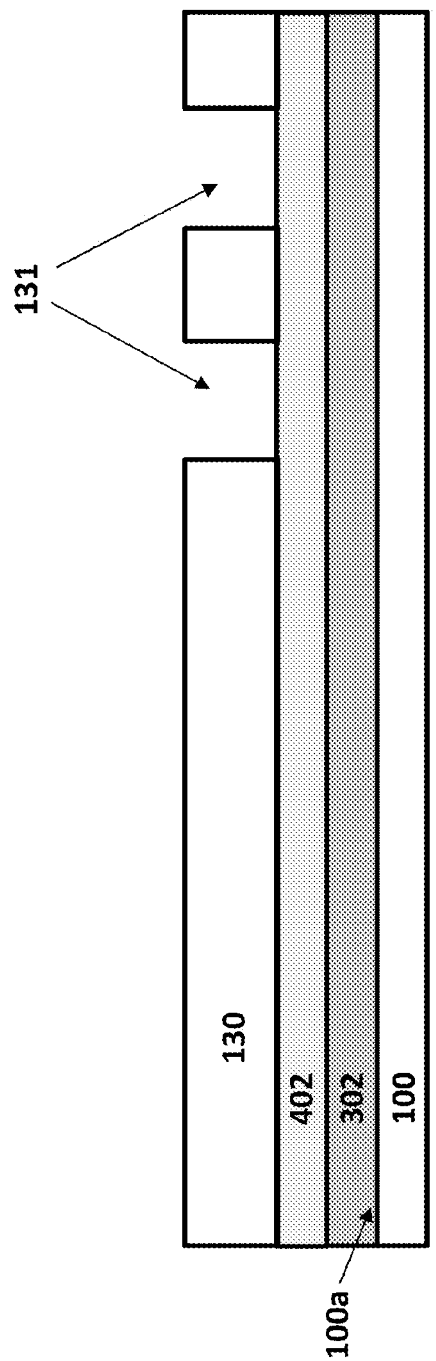
Figure 43C:
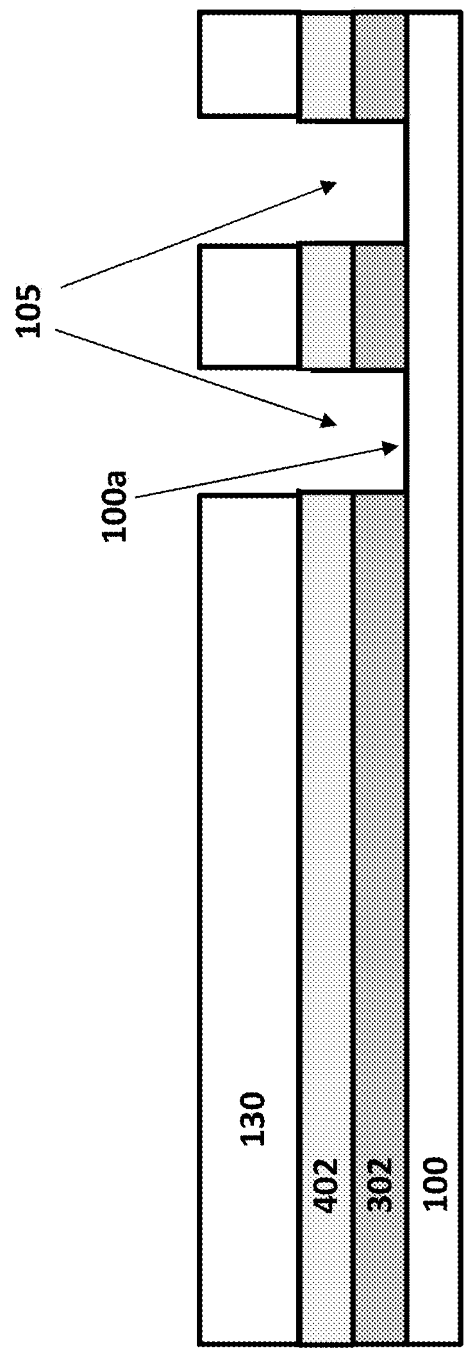
Figure 43D:
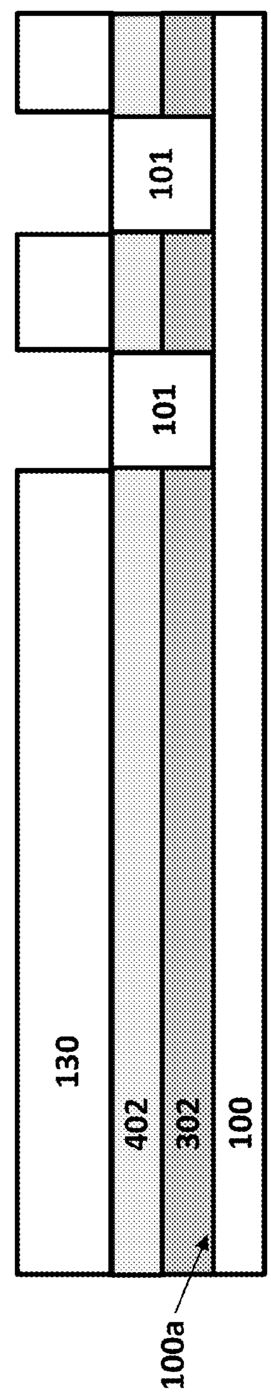
Figure 77:
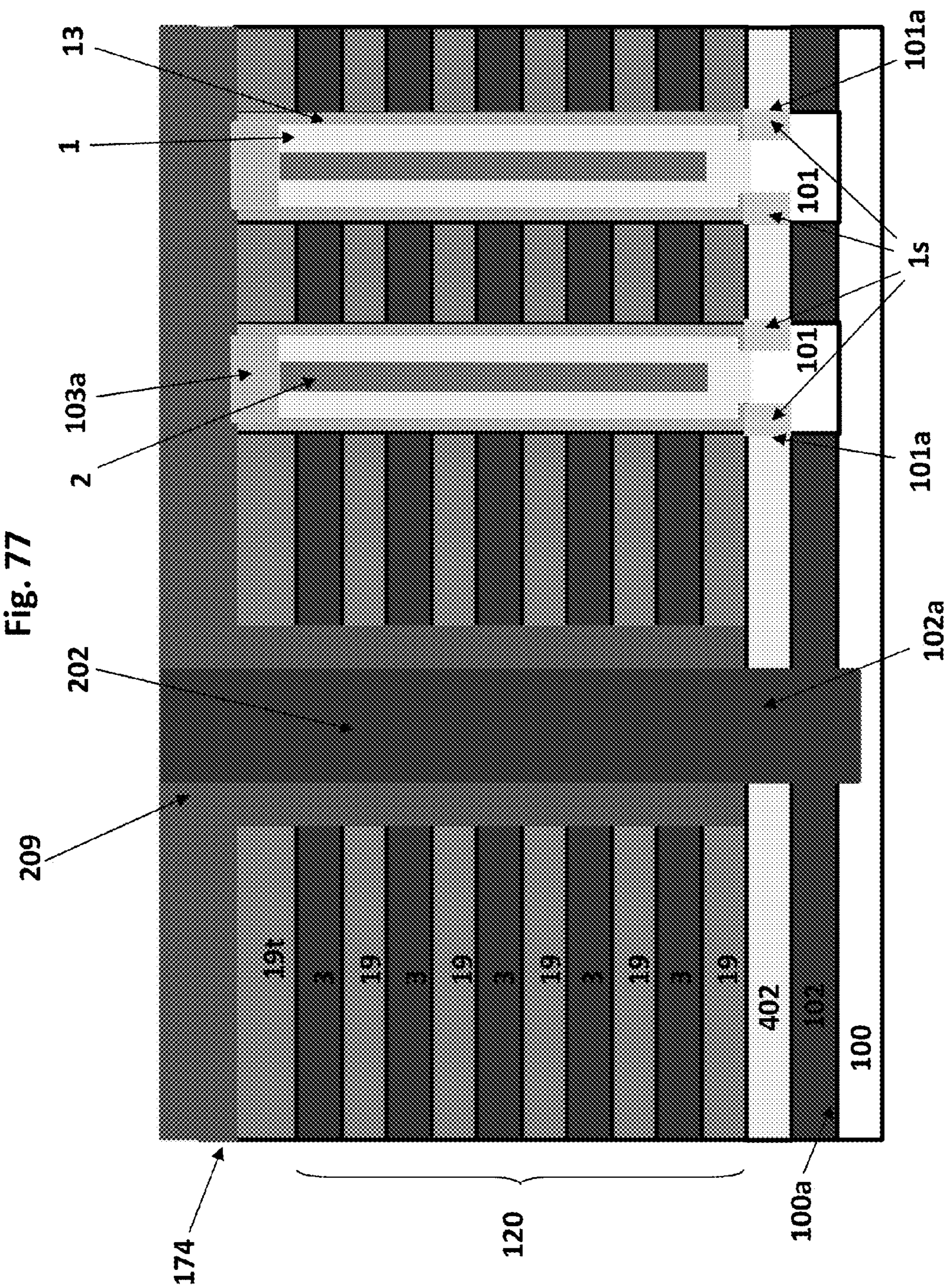
FIGS. 77-79 are side cross sectional views illustrating other embodiments of the device illustrated in FIGS. 1F and 2.

In an alternative embodiment, a bottom portion of each channel 1 comprises a epitaxial silicon pillar 101 as shown in FIG. 77. Preferably, pillar 101 is a channel of a source side select transistor of the NAND string. FIGS. 43B-43D show one method of forming the pillar 101.

As shown in FIG. 43B, a mask 130 includes mask openings 131 that expose the etch stop layer 402. The mask 130 may comprise any suitable material, such as one or more layer of photoresist and/or hard mask material.

The etch stop layer 402 and sacrificial layer 302 are etched in the mask openings 131 to form openings 105 and expose the surface 100*a* of the substrate 100, as shown in FIG. 43C.

FIG. 43D shows epitaxial silicon pillar 101 growth on the exposed surface 100*a* of the substrate 100 in openings 105. In some embodiments, the mask 130 is a hard mask, and the pillar 101 can be grown prior to the removal of the mask 130. The stack 120 may be formed over the mask 130, or the mask 130 may be removed before the stack 120 is formed. In other embodiments, the mask 130 is removed before the pillar 101 is grown in the openings 105.

The NAND string as shown in FIG. 77 is then formed according to the steps illustrated in FIGS. 44-75, including forming an array of memory openings 81 over the array of pillars 101, doping sidewalls 101*a* of the pillars 101 via n-type plasma doping and post annealing to form doped silicon source regions 1*s*, and forming a metal or metal alloy source line 102, as will be described in more detail below.

Figure 44:
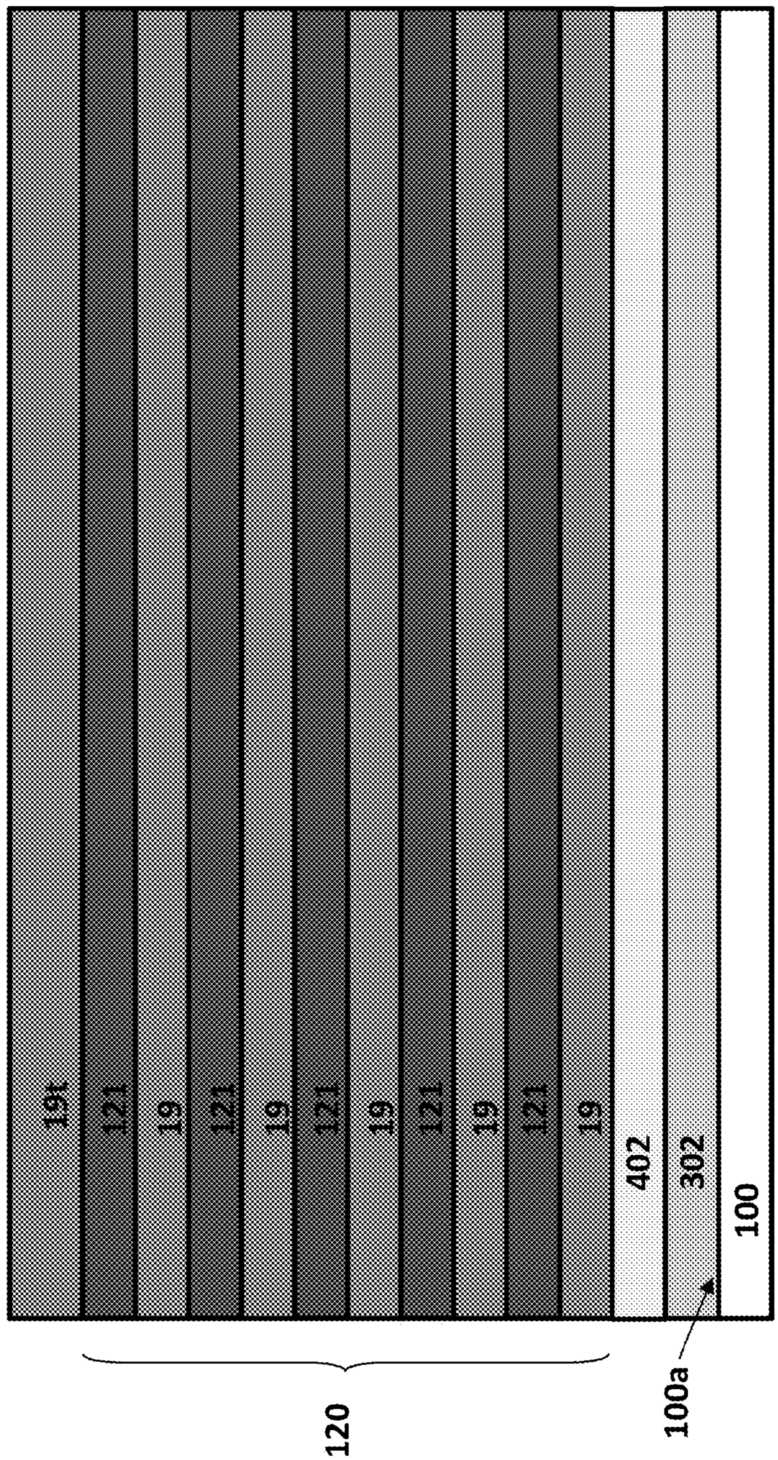

As shown in FIG. 44, a stack 120 of alternating layers 19 and 121 are formed over the sacrificial layer 302 and over etch stop layer 402. Layers 19, 121 may be deposited by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating or semiconductor material. For example, layers 19 may comprise silicon oxide and layers 121 may comprise silicon nitride or silicon, such as amorphous silicon or polysilicon, or another semiconductor material, such as a group IV semiconductor, including silicon-germanium and germanium. Preferably, layers 121 comprise silicon nitride.

Figure 45:
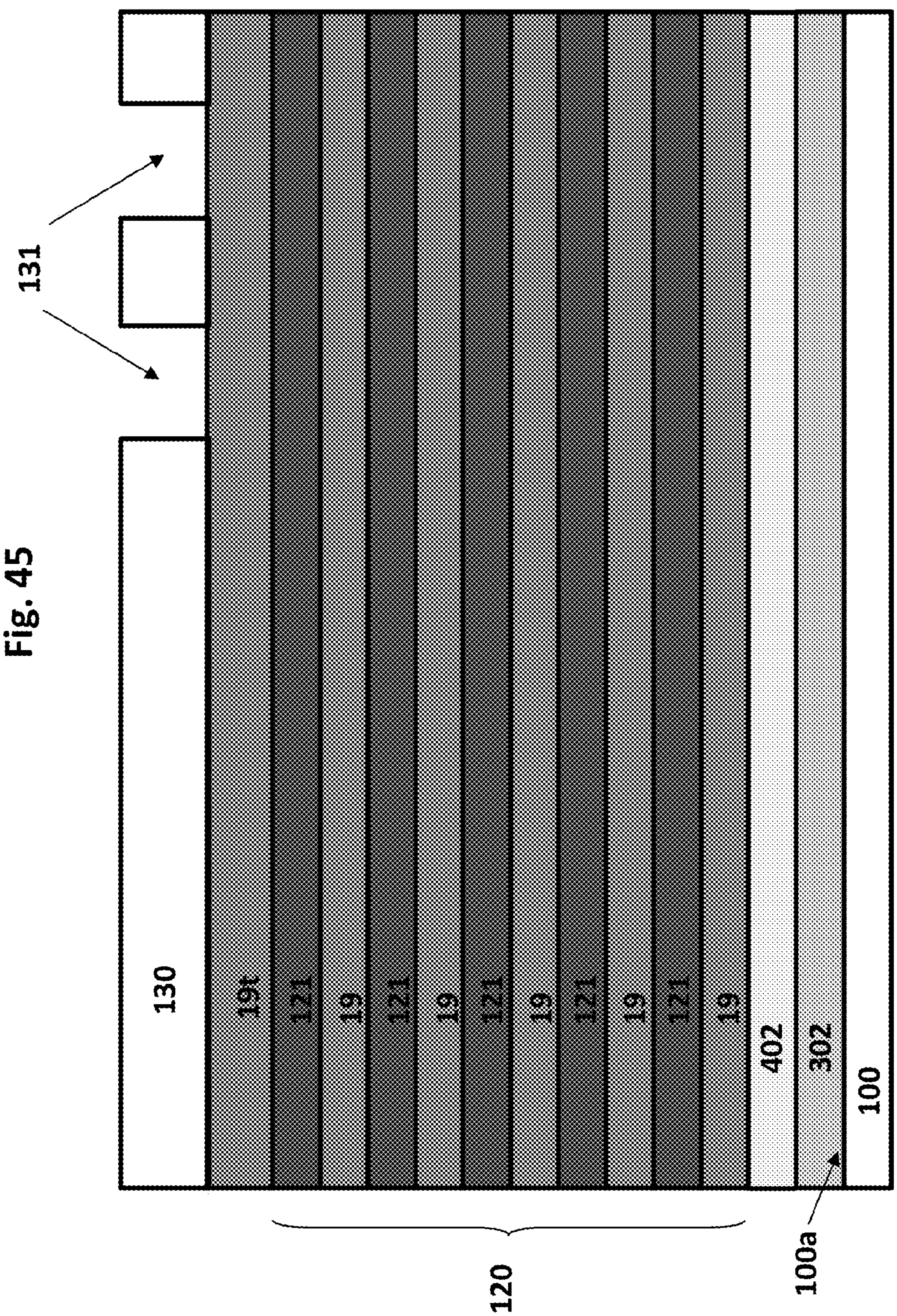
Figure 46:
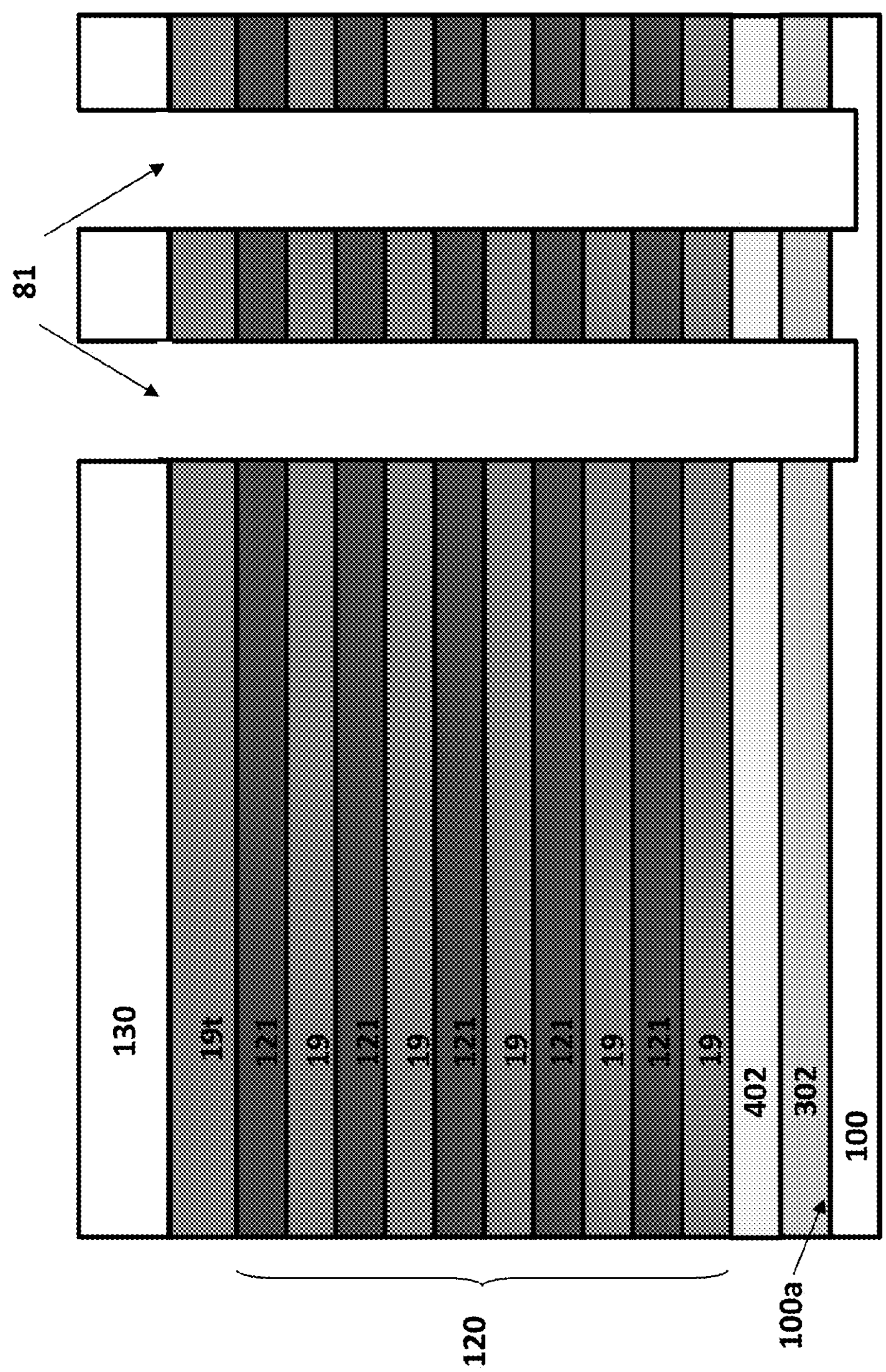

The deposition of layers 19, 121, is followed by etching the stack 120 to form at least one a front side opening 81 in the stack 120. An array of a front side openings 81 (e.g., cylindrical memory openings or holes) may be formed in locations where vertical channels of NAND strings 150 will be subsequently formed, as shown in FIGS. 45 and 46.

The openings 81 may be formed by photolithography and etching, as follows. First, a memory opening mask 130 is formed over the stack and patterned to form mask openings 131 exposing the stack 120, as shown in FIG. 45. Mask 130 may comprise any suitable material, such as one or more layer of photoresist and/or hard mask material described above. Then, the stack 120 is etched using RIE to form the openings 81 in the stack through the mask openings 131 in mask 130. Each front side memory opening 81 is etched until the substrate 100 is exposed in the opening 81. In certain embodiments, the memory opening 81 extends past the major surface 100*a* into the substrate 100, as shown in FIG. 46.

Figure 47:
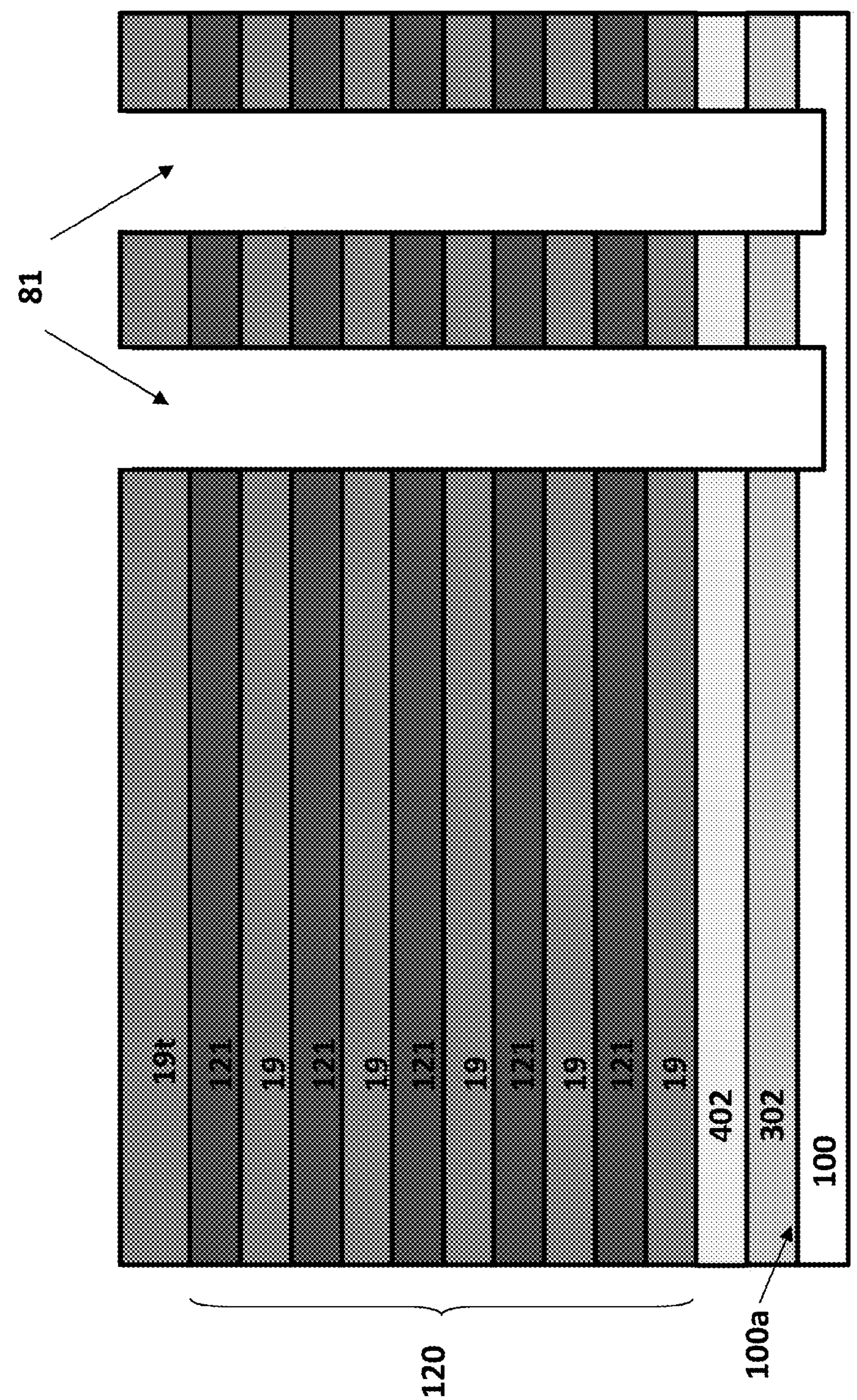

The mask is then removed, as shown in FIG. 47.

Figure 48:
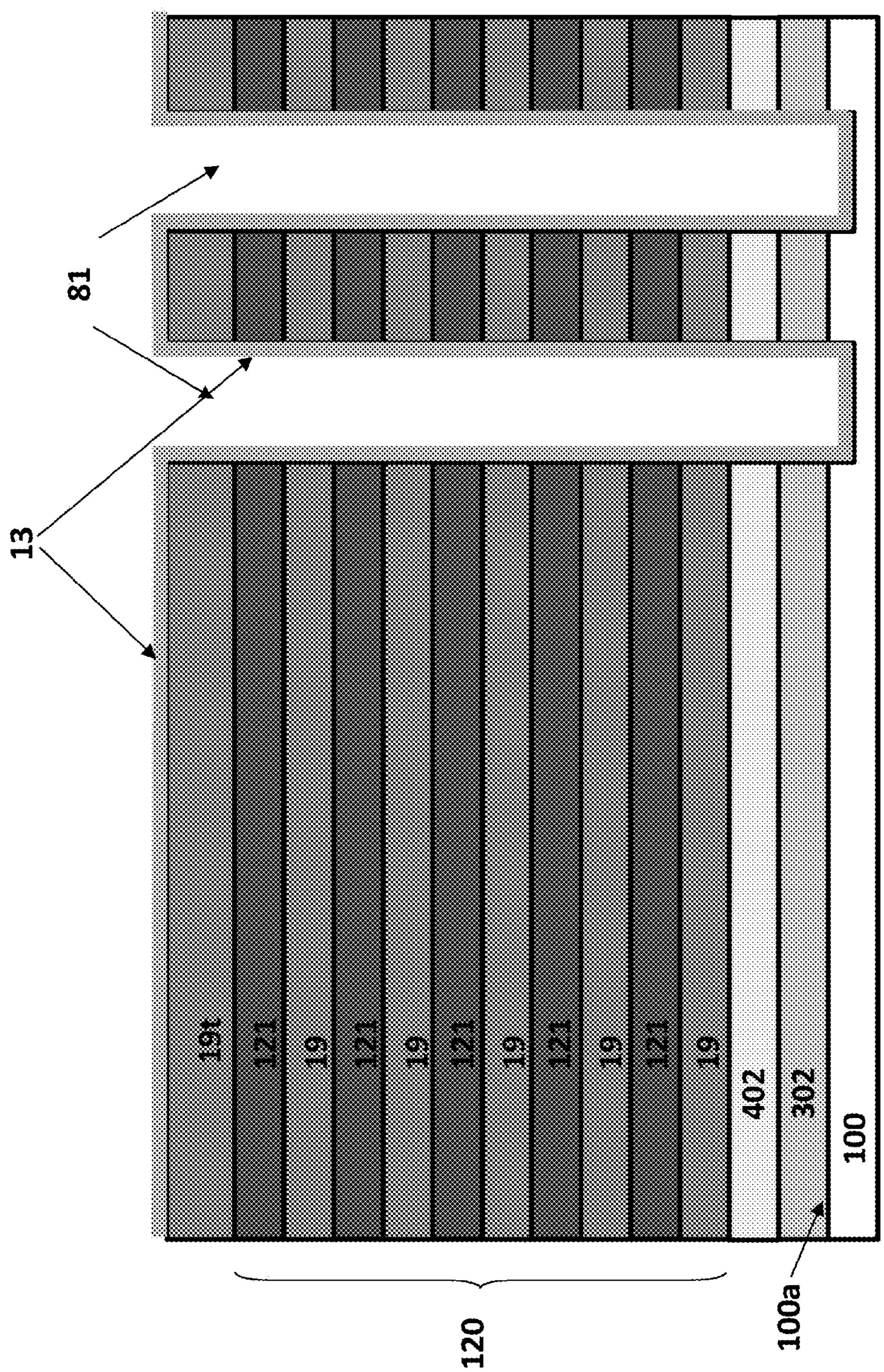

Then, as shown in FIG. 48, the memory film 13 is formed in the memory openings 81 and over the stack 120. Specifically, this step includes forming a blocking dielectric in the memory opening 81, forming a charge storage region (e.g., silicon nitride layer or a floating gate layer) over the blocking dielectric in the memory opening, and forming a tunneling dielectric over the charge storage region in the memory opening 81.

Then, the channel 1 is formed by depositing channel material, such as a lightly doped or intrinsic polysilicon over the tunnel dielectric layer portion of the memory film 13 in the front side opening 81. If desired, a high temperature anneal may be performed after forming the channel 1. As discussed above, the entire opening 81 may be filled to form the device illustrated in FIG. 1D. Alternatively, a layer of channel material may first be deposited in the opening 81 followed by deposition of an insulating fill material 2 to form the device illustrated in FIG. 1B.

Figure 49:
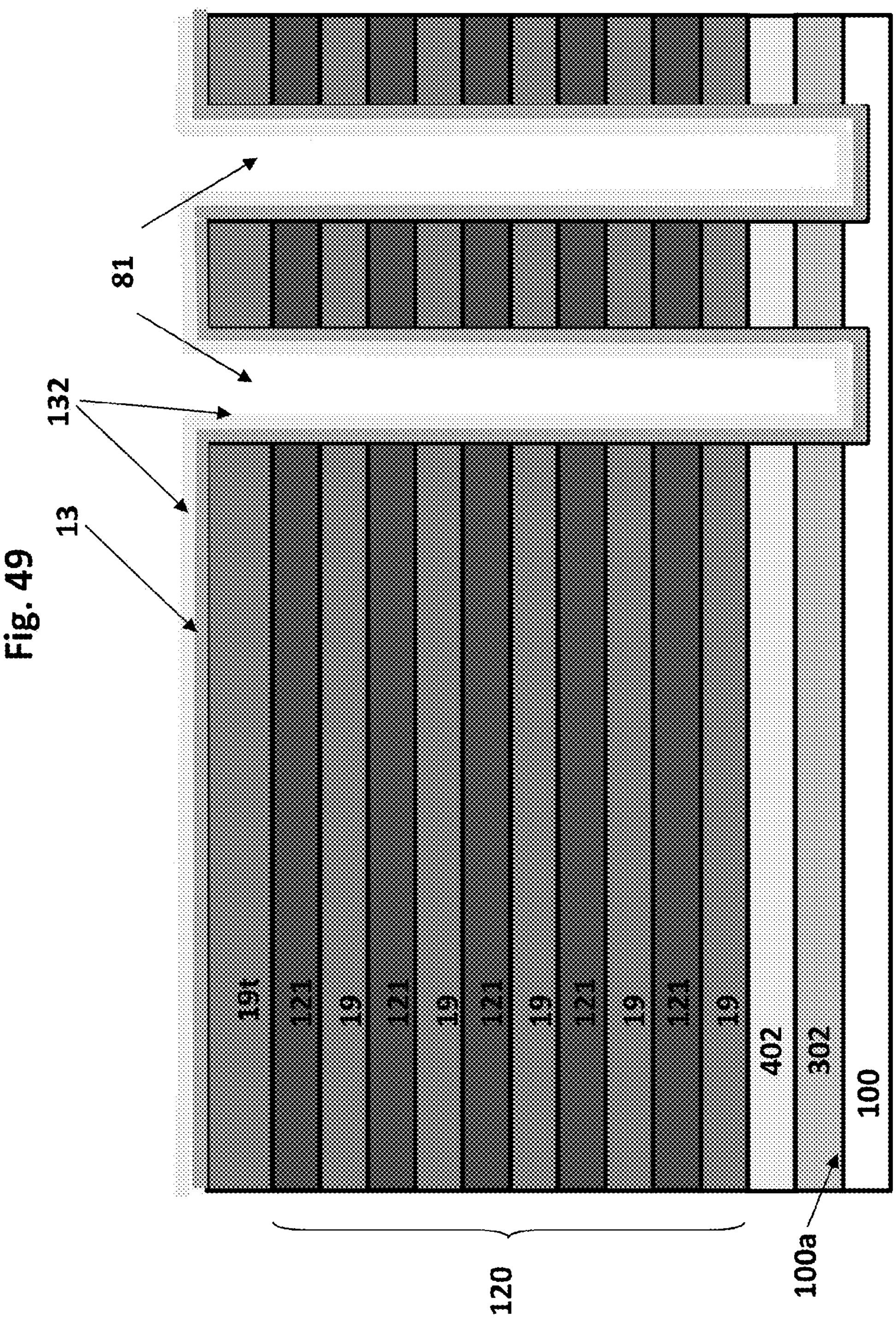

In a preferred embodiment, the channel may be formed by a multi-step process utilizing a protective layer, as will be described below with reference to FIGS. 49 to 56. First, as shown in FIG. 49, a cover semiconductor layer 132, such as an amorphous silicon or polysilicon layer, is formed in the memory openings 81 over the memory film 13 and over the stack 120. Layer 132 protects the memory film 13 from damage during a subsequent etching step.

Figure 50:
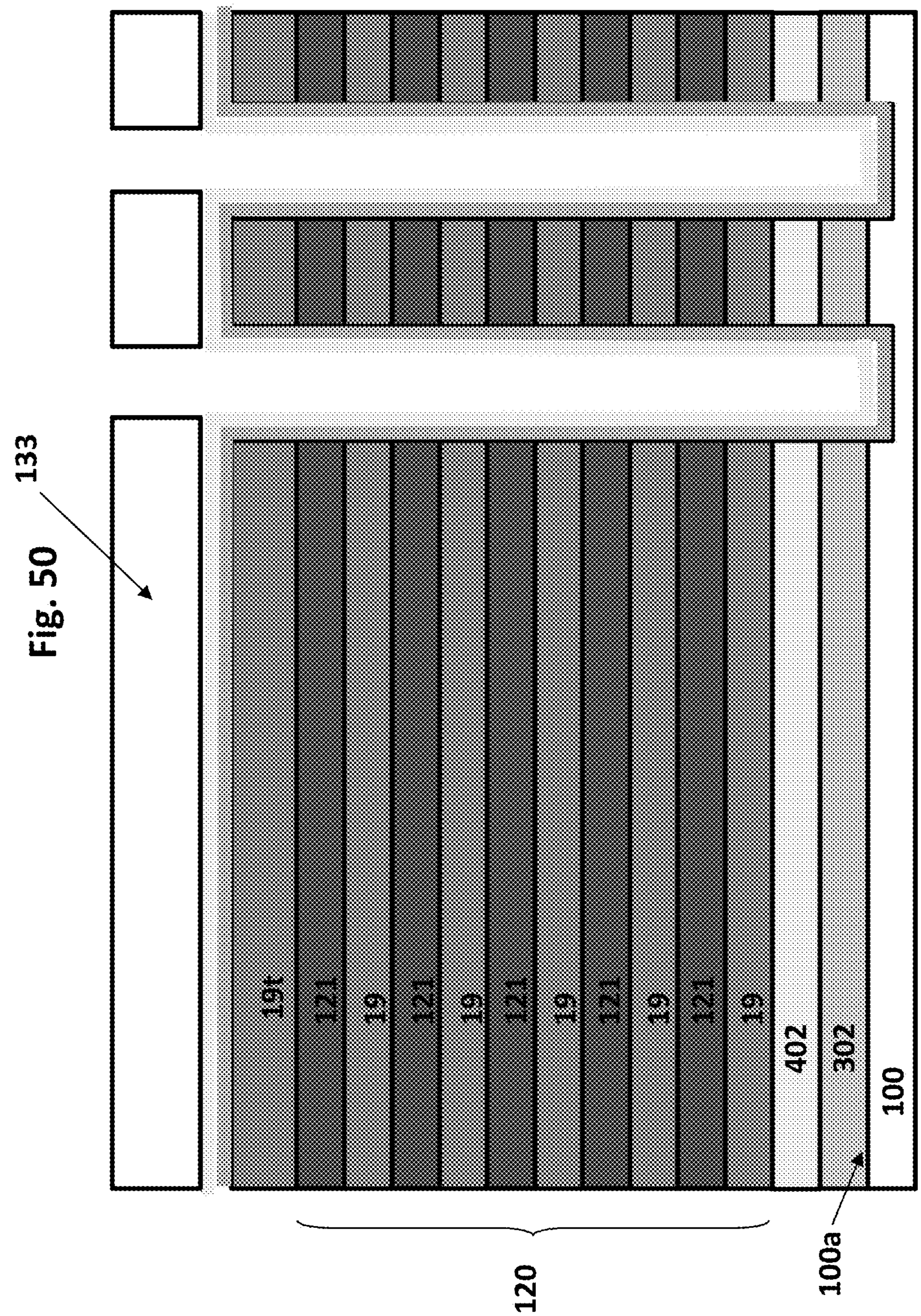

Then, a hard mask cover layer 133 is formed over layer 132. The hard mask cover layer 133 may comprise an amorphous carbon layer for example. Layer 133 is deposited non-conformally such that layer 133 is located over layer 132 on top of the stack 120, but does not extend into the memory openings 81, as shown in FIG. 50. Alternatively, layer 133 may be deposited conformally and then patterned by photolithography and etching to be removed from the memory openings.

Figure 51:
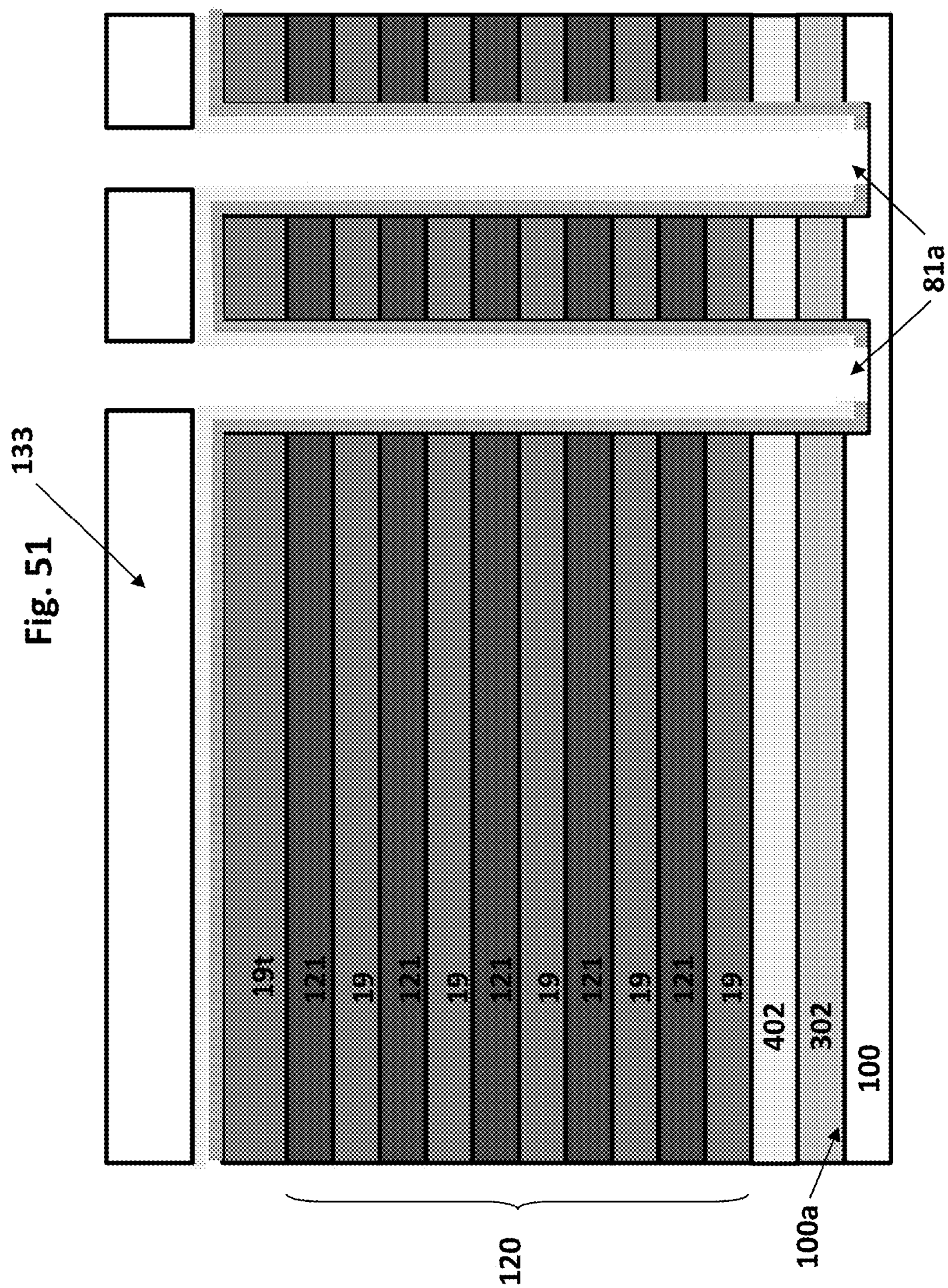

As shown in FIG. 51, the memory film 13 (e.g., the blocking dielectric, the charge storage region and the tunnel dielectric) is removed from a bottom of the memory openings 81 using RIE or another suitable anisotropic etching method. The cover semiconductor layer 132 protects the memory film 13 on the sidewalls of the memory openings 81 from etching damage, and the hard mask cover layer 133 protects the rest of the stack from being etched. The etching step forms extension portions 81A of the openings 81 which expose the substrate 100 at the bottom of the openings 81. The hard mask cover layer 133 is then removed by any suitable method, such as ashing or selective wet etching.

Figure 52:
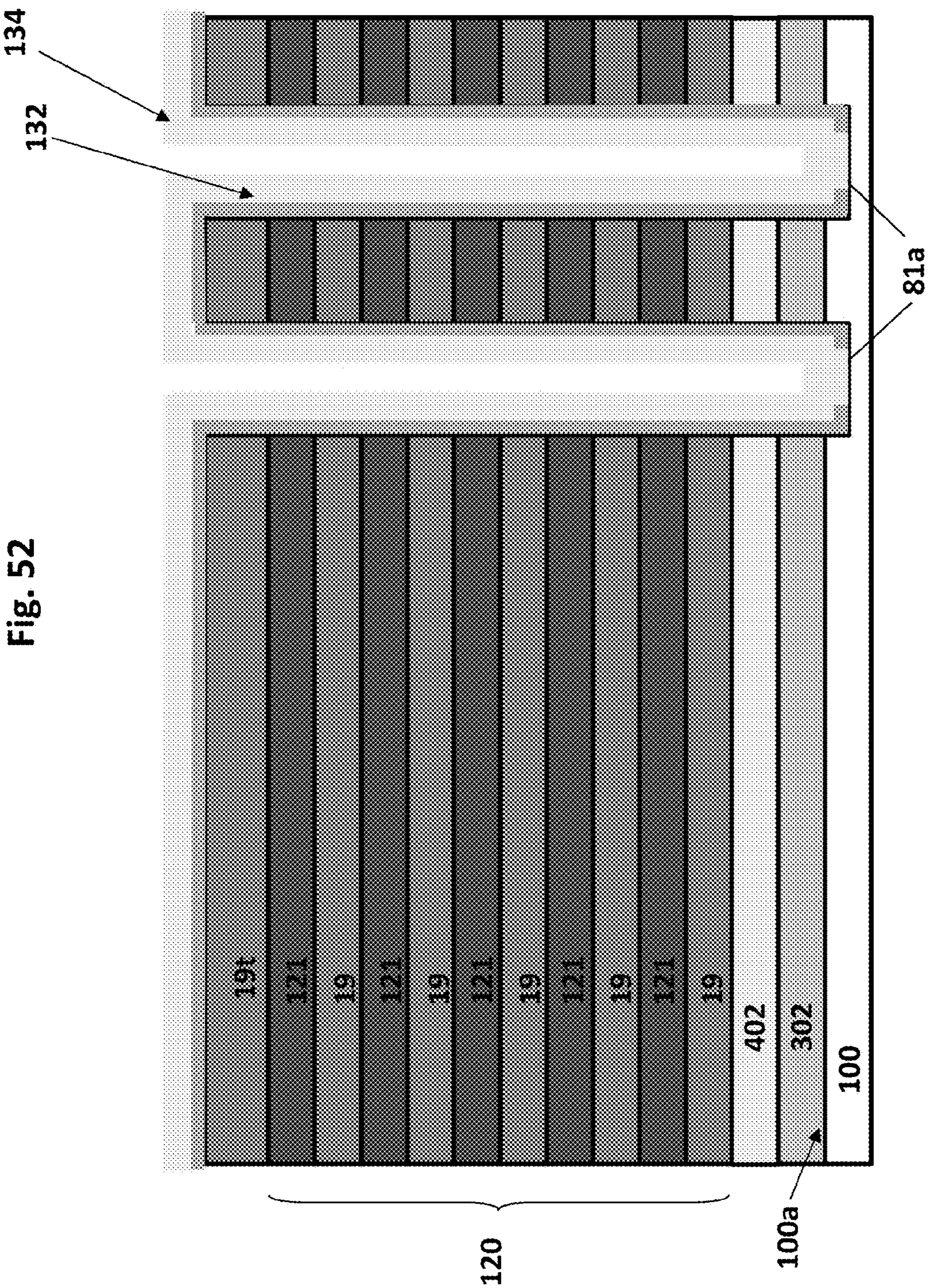

As shown in FIG. 52, a semiconductor channel body layer 134 is formed in the memory openings 81 such that it makes contact with the substrate 100 exposed in the extension portions 81A of the openings 81. The semiconductor channel body layer 134 comprises a channel material, such as amorphous silicon or polysilicon. Layers 132 and 134 preferably comprise the same materials, and layer 134 contacts layer 132 on the sidewalls of the openings 81.

Figure 53:
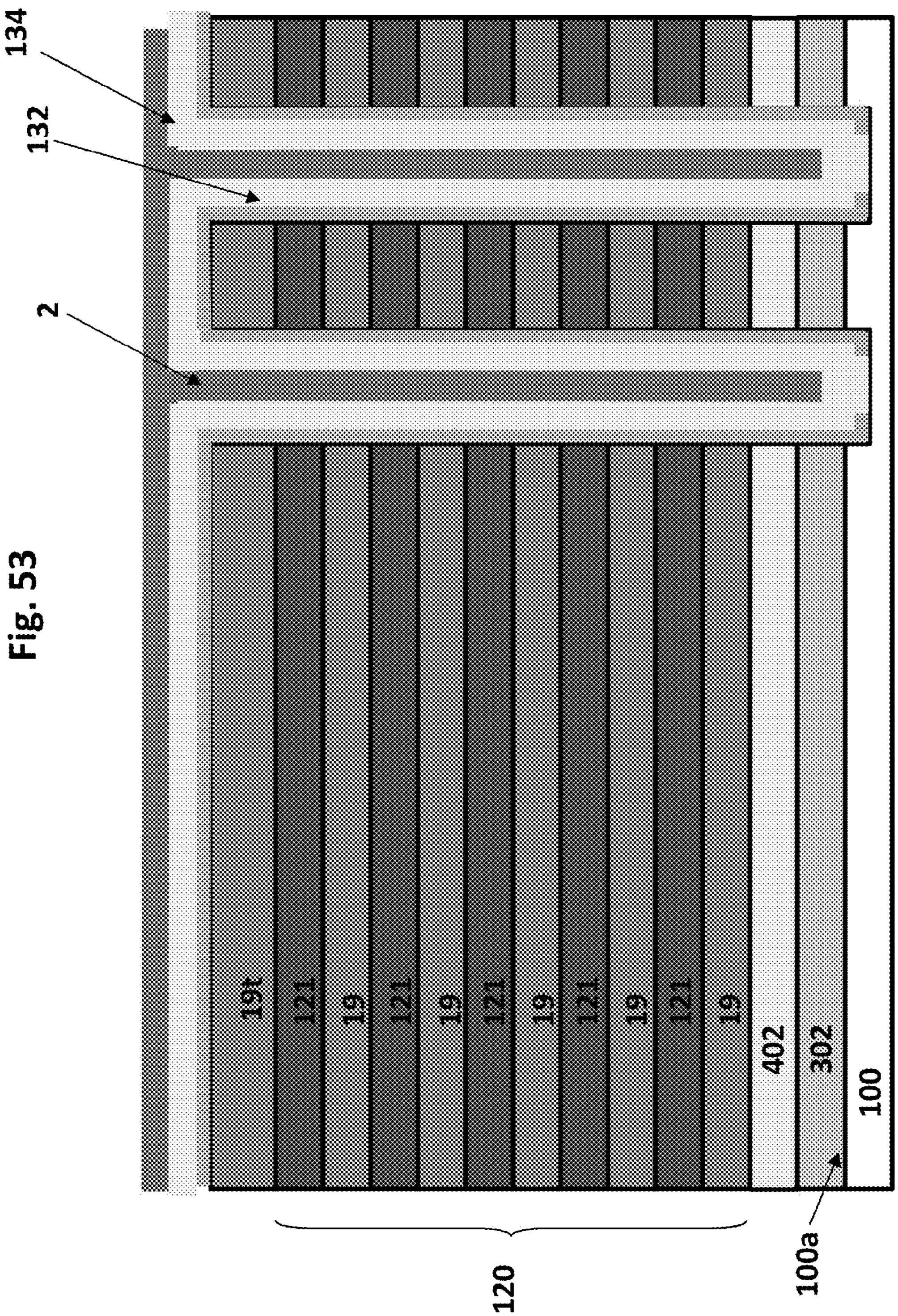
Figure 54:
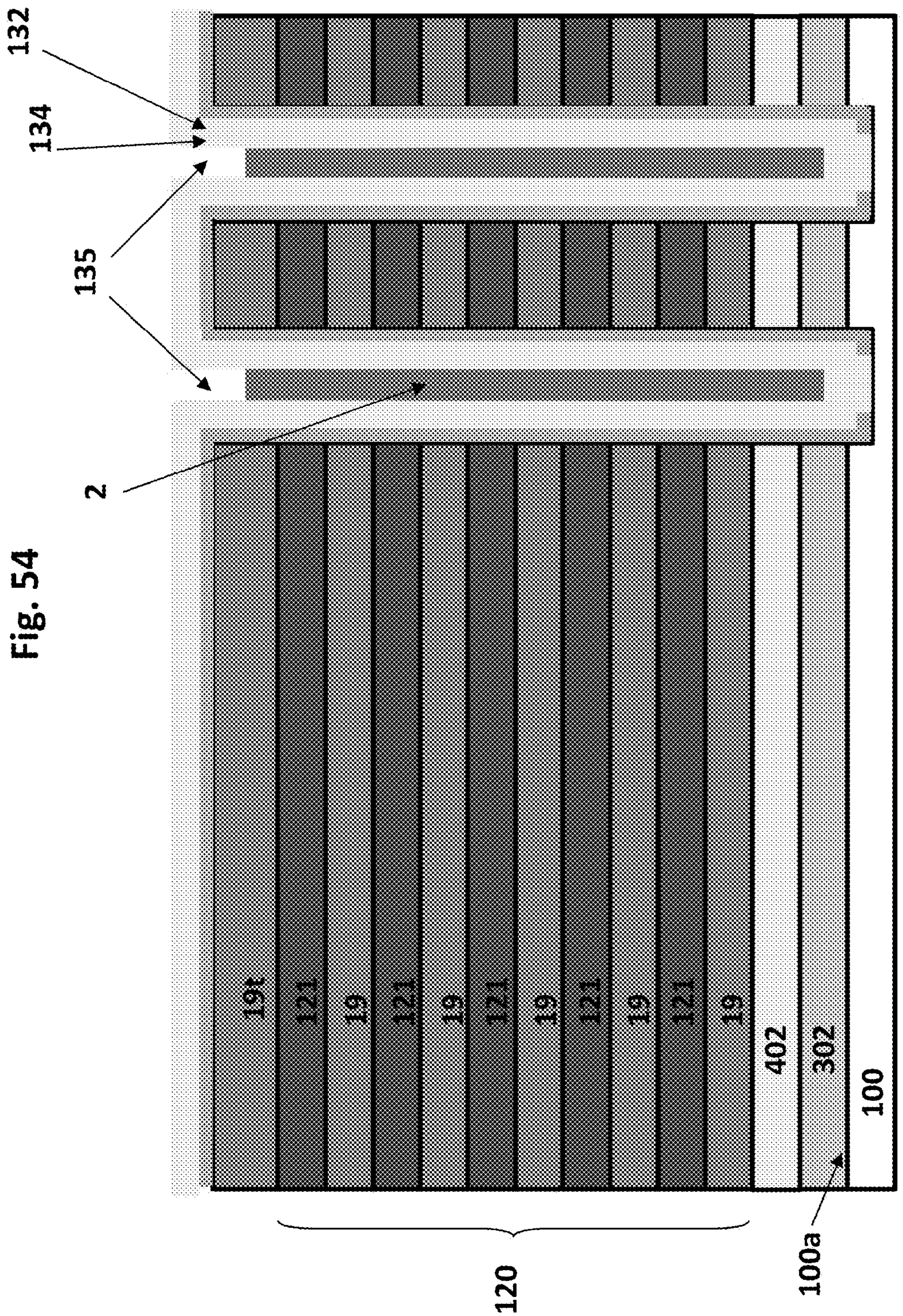

The optional core insulating layer 2, such as a silicon oxide layer is then deposited in the openings 81 and over the stack 120, as shown in FIG. 53. Layer 2 is also shown in FIGS. 1A and 1B. The core insulating layer 2 is then recessed from the top of the openings 81 by selective etchback to form recesses 135 in the top of the openings 81, as shown in FIG. 54.

Figure 55:
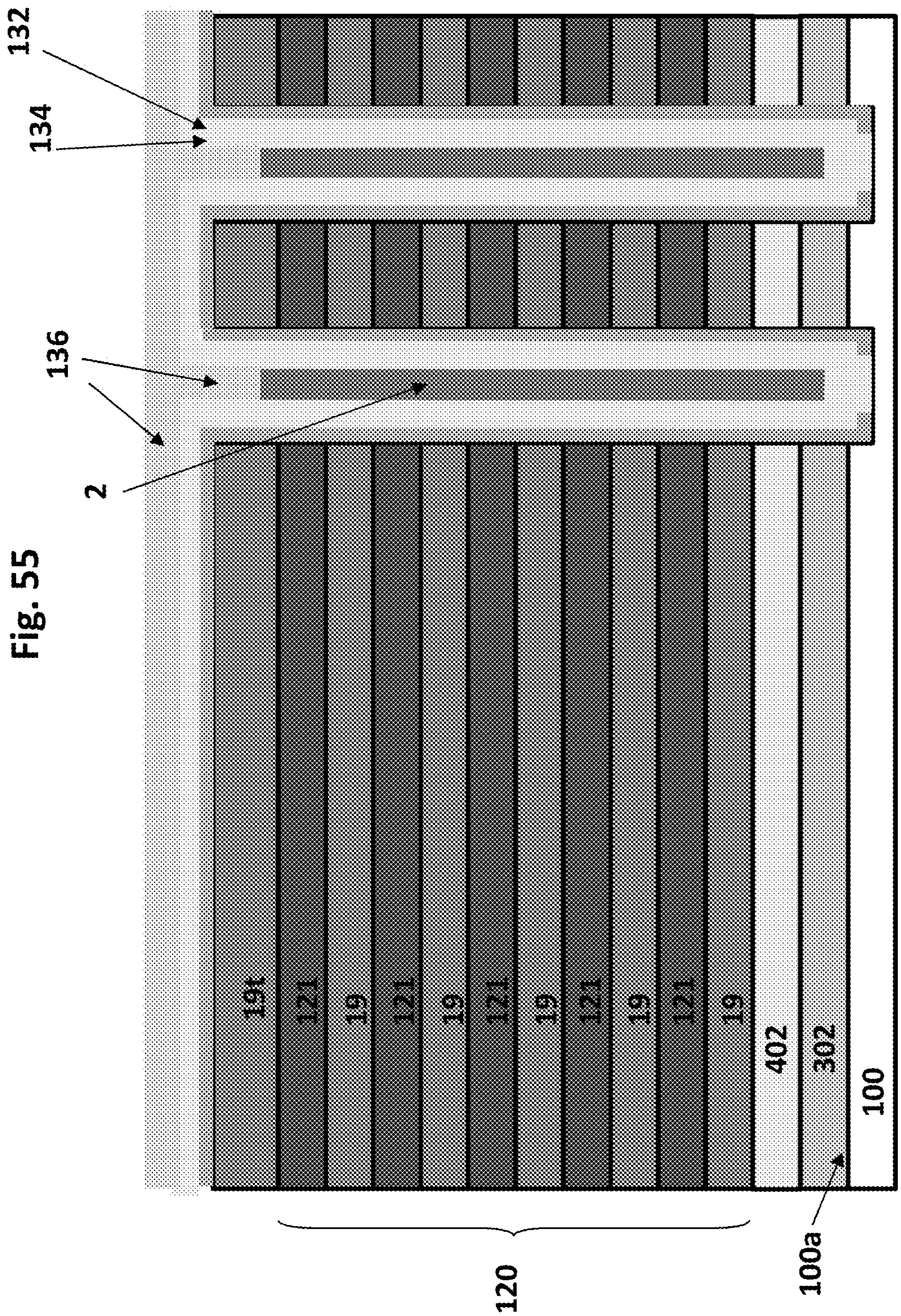

The recesses 135 are then filled by a semiconductor cap layer 136 which is deposited conformally over layer 134 on the stack 120 and in the recesses 135, as shown in FIG. 55. The cap layer 136 comprises a channel semiconductor material, such as amorphous silicon or polysilicon. Layer 136 preferably comprises the same material as layers 132 and 134. Layer 136 completely fills the recesses 135 and contacts layer 134 on the sidewalls of the recesses 135 in the openings 81.

Figure 56:
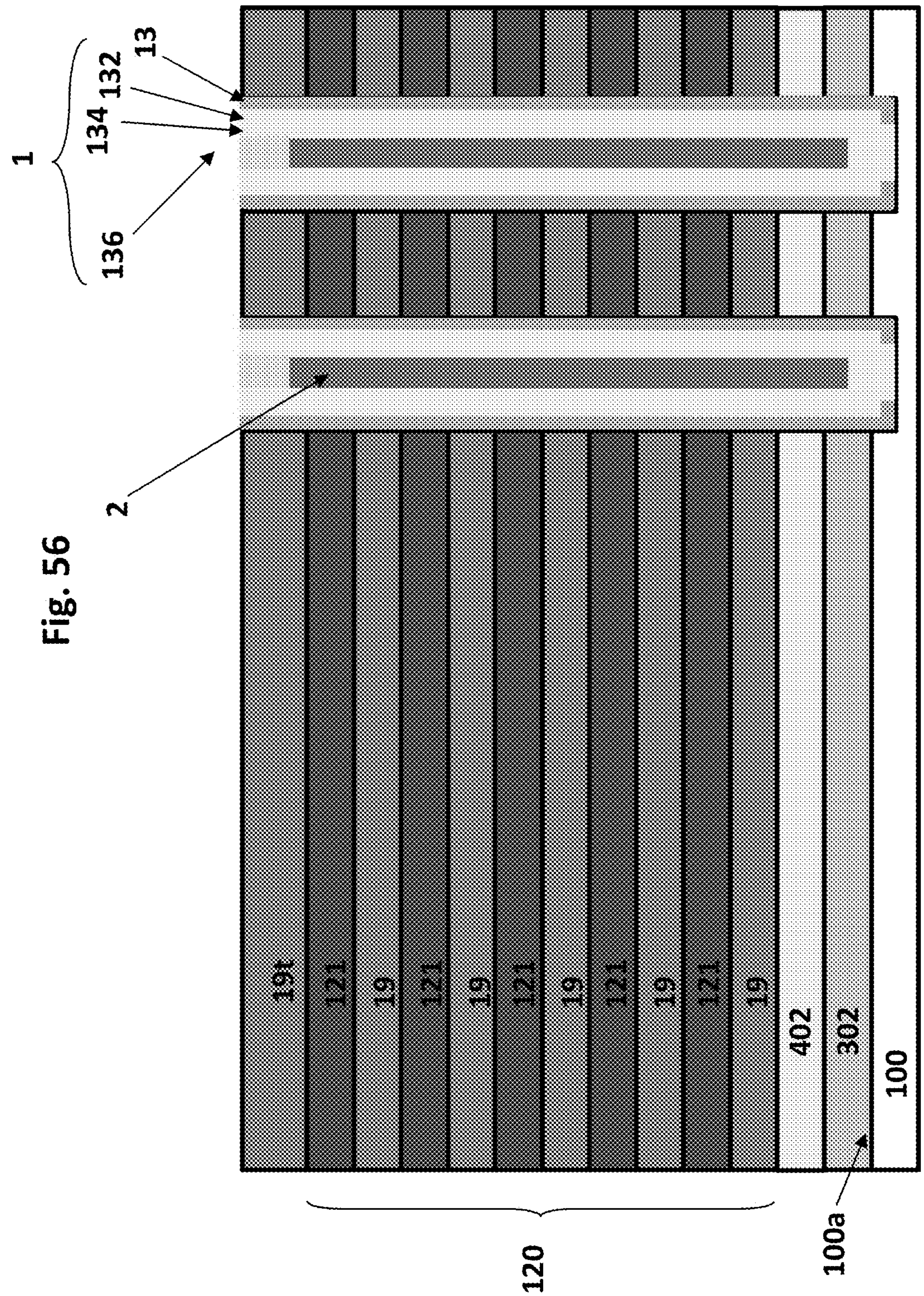

As shown in FIG. 56, the semiconductor channel layers 132, 134 and 136 are then planarized by etch back or CMP to remove these layers from the top of the stack 120 to expose the upper silicon oxide layer 19*t* of the stack. The channel layers 132, 134 and 136 remain in the openings 81 and together form the above described channel 1 in the memory device levels 70.

Thus, as shown in FIG. 56, the channel 1 of the embodiment of FIGS. 12-19 is composed of three sublayers 132, 134, 136. Sublayer 132 comprises an outer hollow cylinder or hollow inverse truncated cone which contacts the memory film 13 with its outer surface. Sublayer 132 does not contact the substrate 100.

Sublayer 134 comprises an inner hollow cylinder or hollow inverse truncated cone which contacts sublayer 132 with its outer surface. Sublayer 134 contacts the core insulating layer 2 with its inner surface in the lower portion of the opening 81 and contacts sublayer 136 with its inner surface in the upper portion of the opening 81. Preferably, sublayer 134 completely fills the extension portion 81*a* of the opening 81 and contacts the substrate 100.

Sublayer 136 comprises a filled cylinder or filled inverse truncated cone which is located only in the upper portion of the opening 81. Sublayer 136 contacts sublayer 134 with its outer surface. Sublayer 136 also contacts the top of the core insulating layer 2 with its bottom surface.

Figure 57:
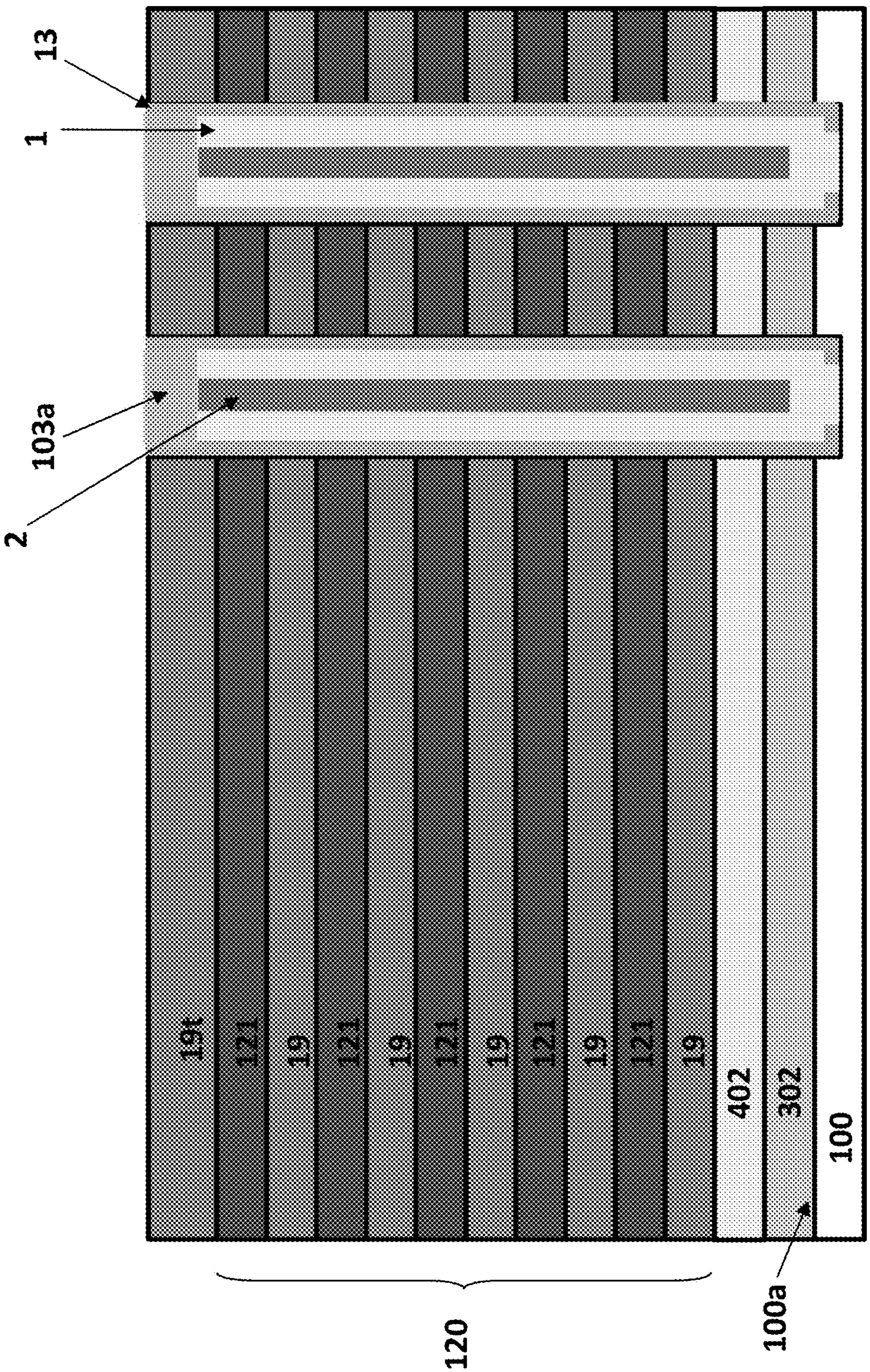

As shown in FIG. 57, a top portion of the channel 1 is doped to form a doped drain region 103*a*.

A support column which supports the stack layers after the sacrificial layers 121 are removed are then formed, using the steps as illustrated in FIGS. 21-23 above.

Figure 58:
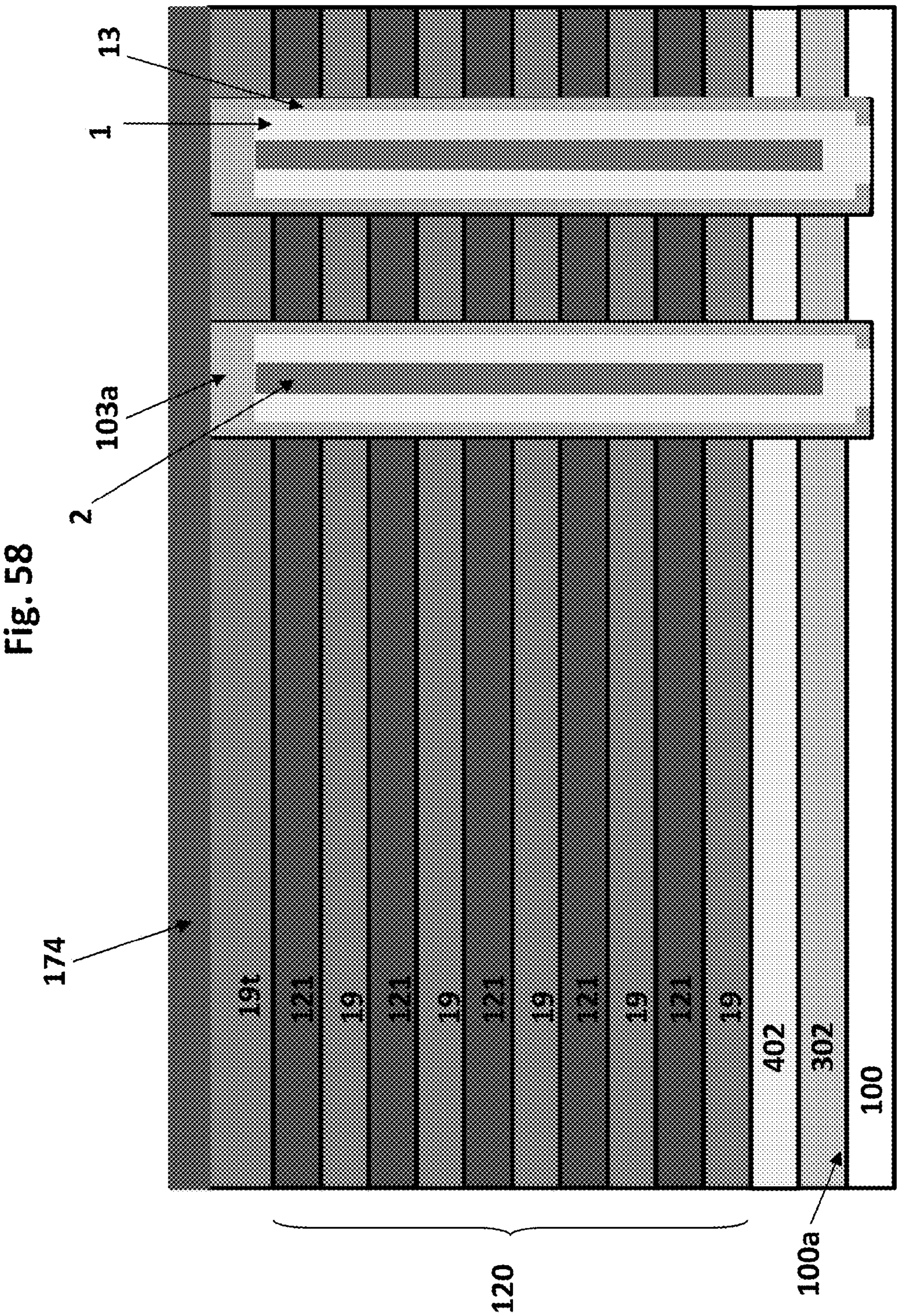

FIG. 58 shows the same cross sectional view as FIG. 57 after the formation of the column(s) 173 and layer 174. The view in FIG. 58 is in or out of the plane of the drawing in FIG. 23, such that the column 173 is not visible in FIG. 58.

FIGS. 59-75 illustrate a method of forming the trenches 84 and the source electrode 202.

Figure 59:
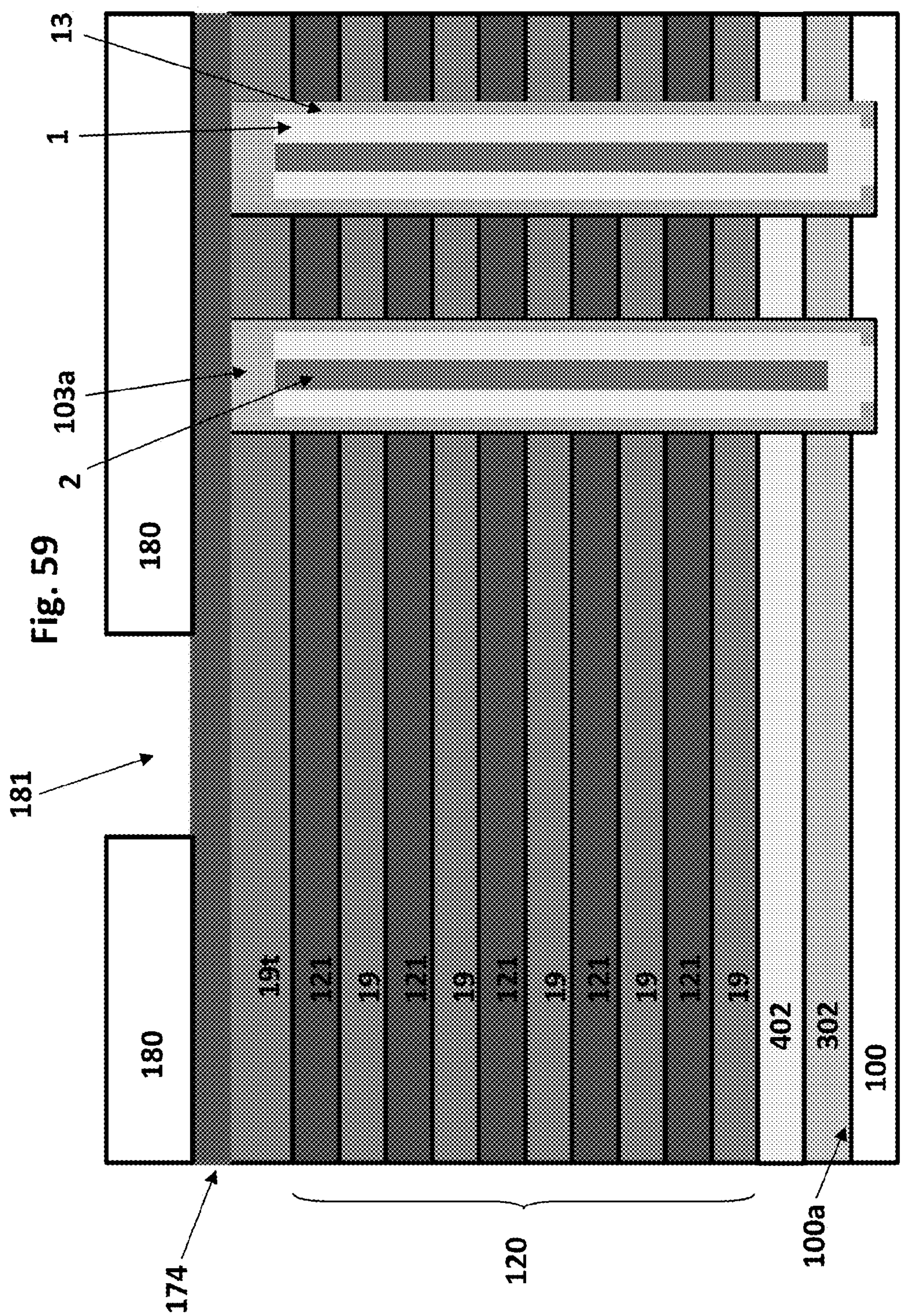

As shown in FIG. 59, a mask 180 is formed over layer 174. The mask 180 may be a photoresist and/or hard mask described above. At least one back side mask opening 181 is formed in the mask. Preferably, a plurality of openings 181 are formed in the mask 180.

Figure 60:
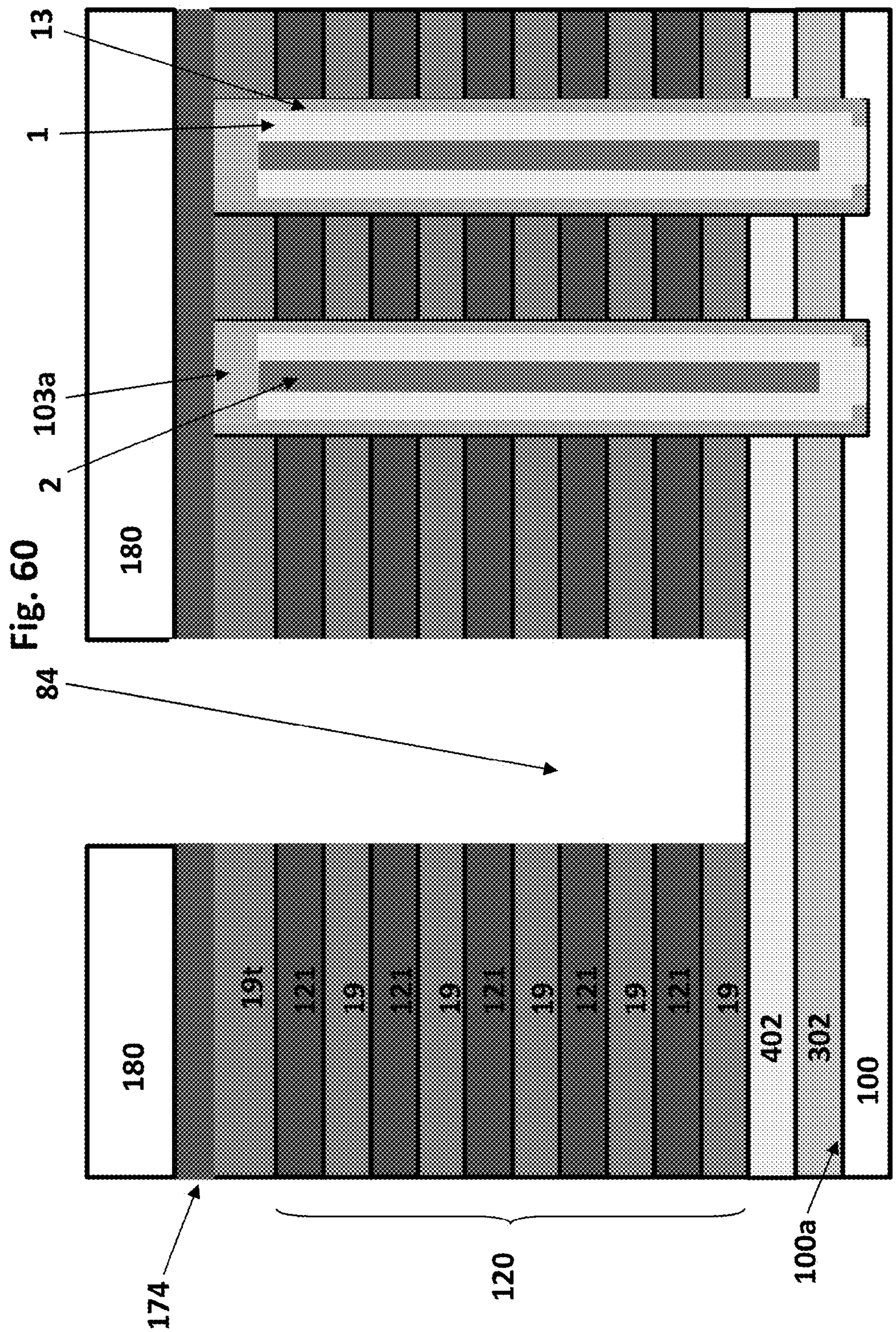
Figure 61:
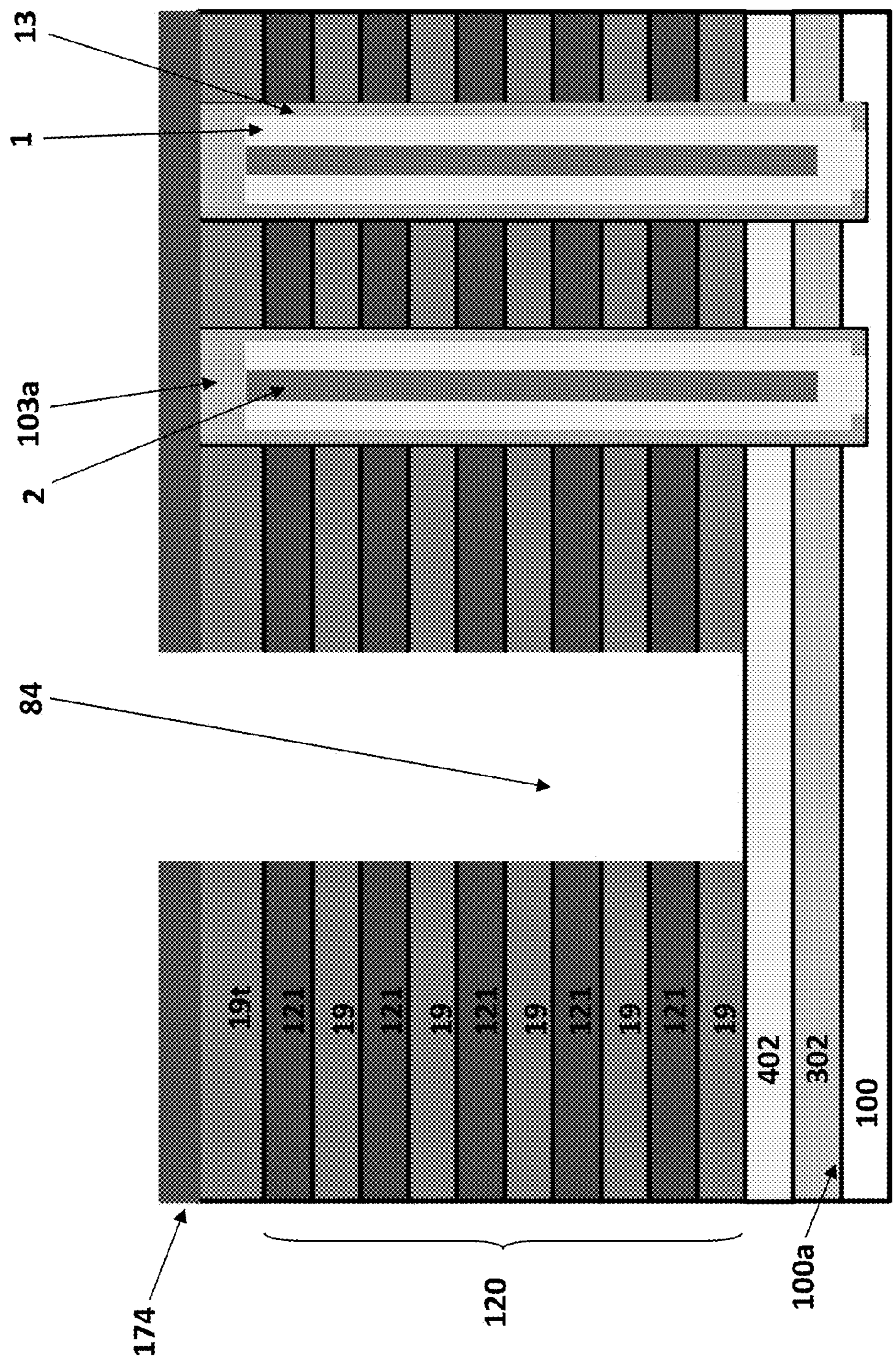

Then, as shown in FIG. 60, layer 174 and the stack 120 are etched through the openings 181 in the mask to form the back side openings (e.g., the trenches) 84 in the stack 120 extending to the etch stop layer 402 (i.e., trench 84 etch stops on the etch stop layer 402). Thus, the step of forming the back side openings 84 forms back side trenches which exposes the etch stop layer 402 (e.g., polysilicon). The mask 180 may then be removed, as shown in FIG. 61.

Figure 62:
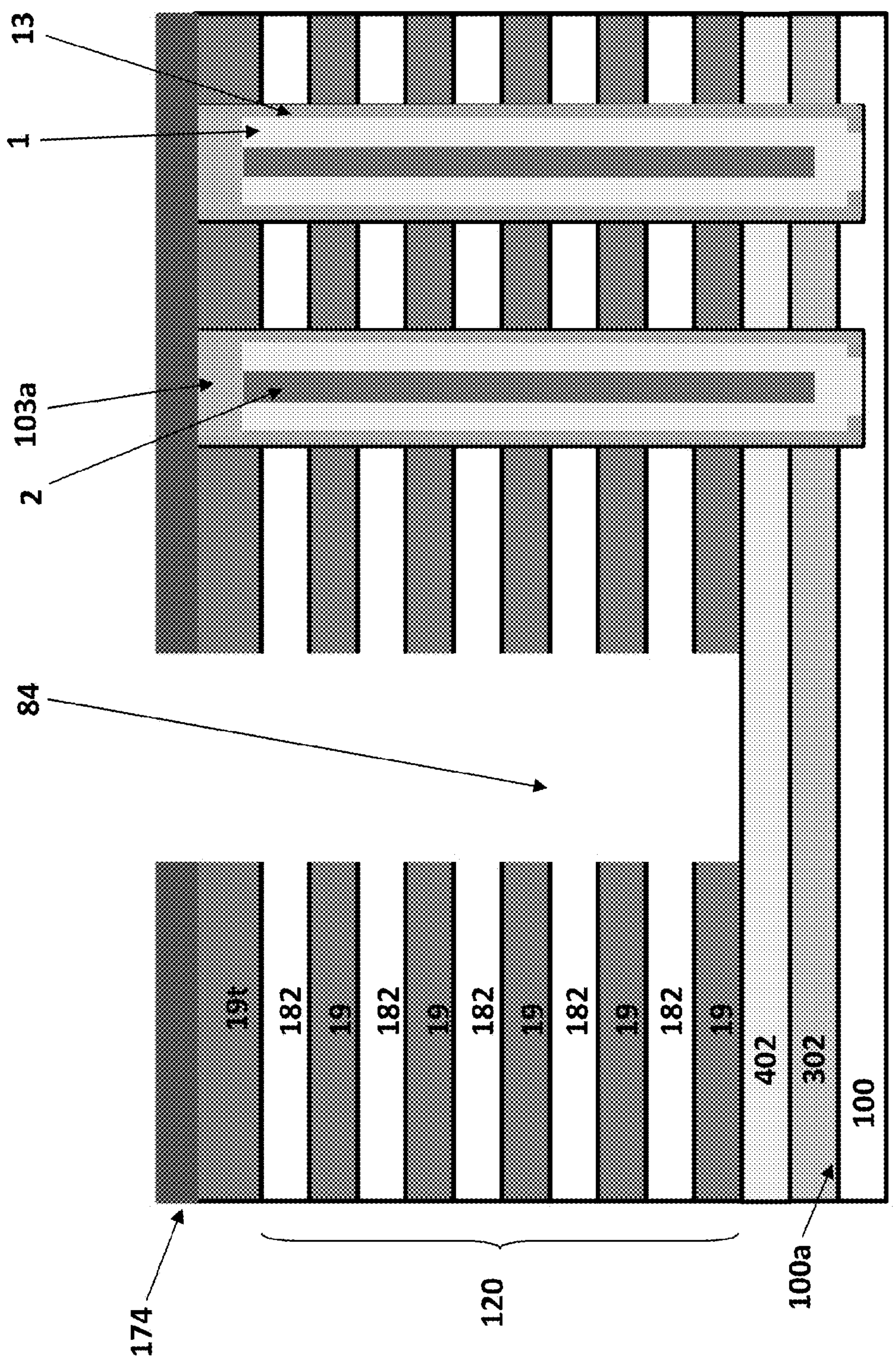

Then, at least a portion of the sacrificial second material layers 121 are removed through the back side openings 84 to form back side recesses 182 between the first material layers 19, as shown in FIG. 62. Layers 121 may be removed by selective etching, such as a silicon nitride selective etching which removes silicon nitride layers 121 but does not remove the silicon oxide layers 174, 19 and 7 or the silicon regions. The selective etch may stop on the oxide blocking dielectric, such as a silicon oxide blocking dielectric 7 which forms the outer part of the memory film 13, and/or the etch stop layer 402 (e.g., polysilicon). The support column 173 described above supports the spaced apart layers 19 of the stack 120 and prevents layers 19 from collapsing on each other.

Figure 63:
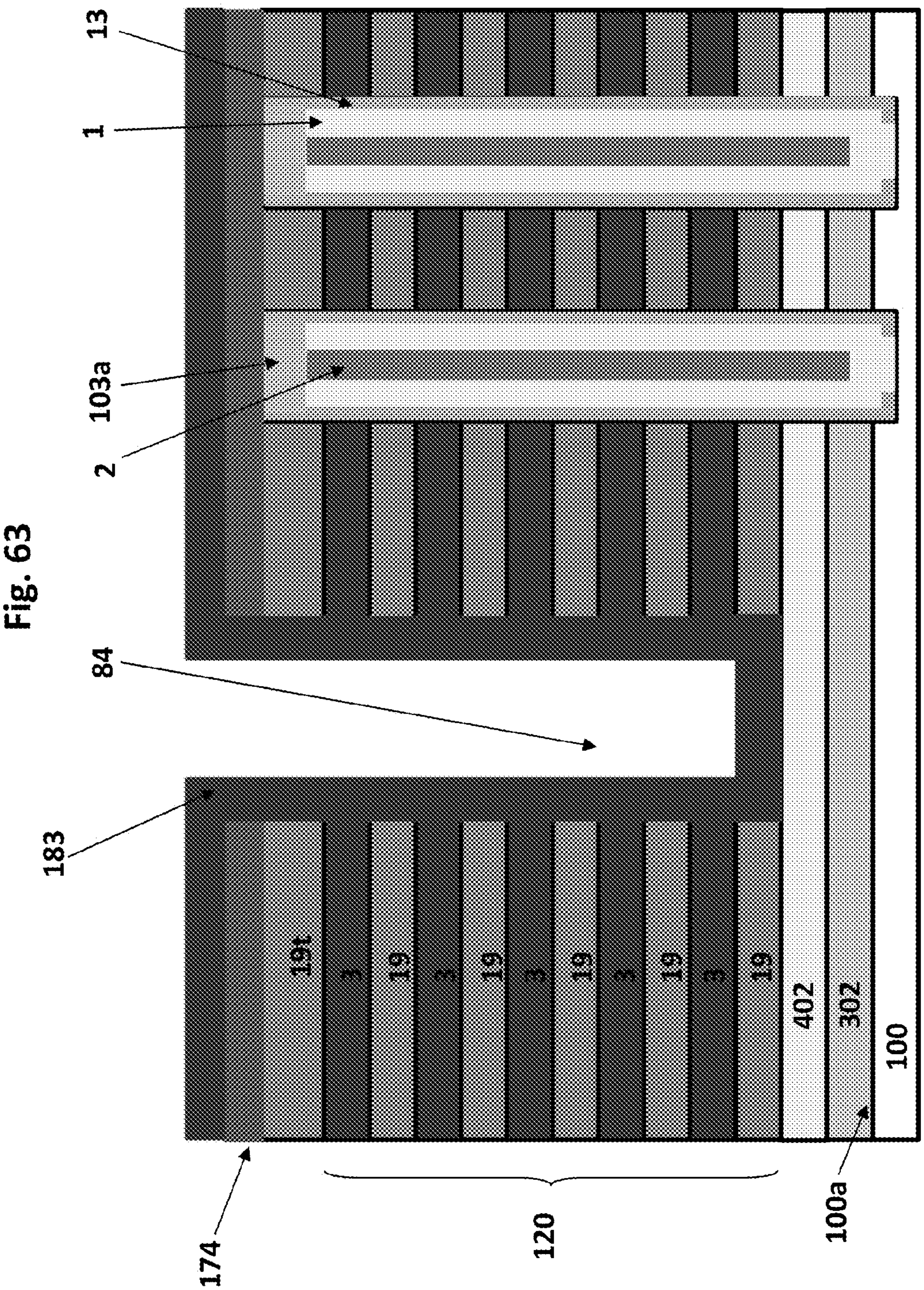

Metal or metal alloy control gate electrodes 3 are then formed in the back side recesses 182 through the back side openings 84, as shown in FIG. 63. A portion 183 of the metal or metal alloy control gate material partially or fully fills the back side openings (e.g., trenches) 84 and is located over layer 174. The control gate electrode 3 material may comprise any suitable materials described above. For example, the material may comprise a TiN liner and tungsten gate material.

Figure 64:
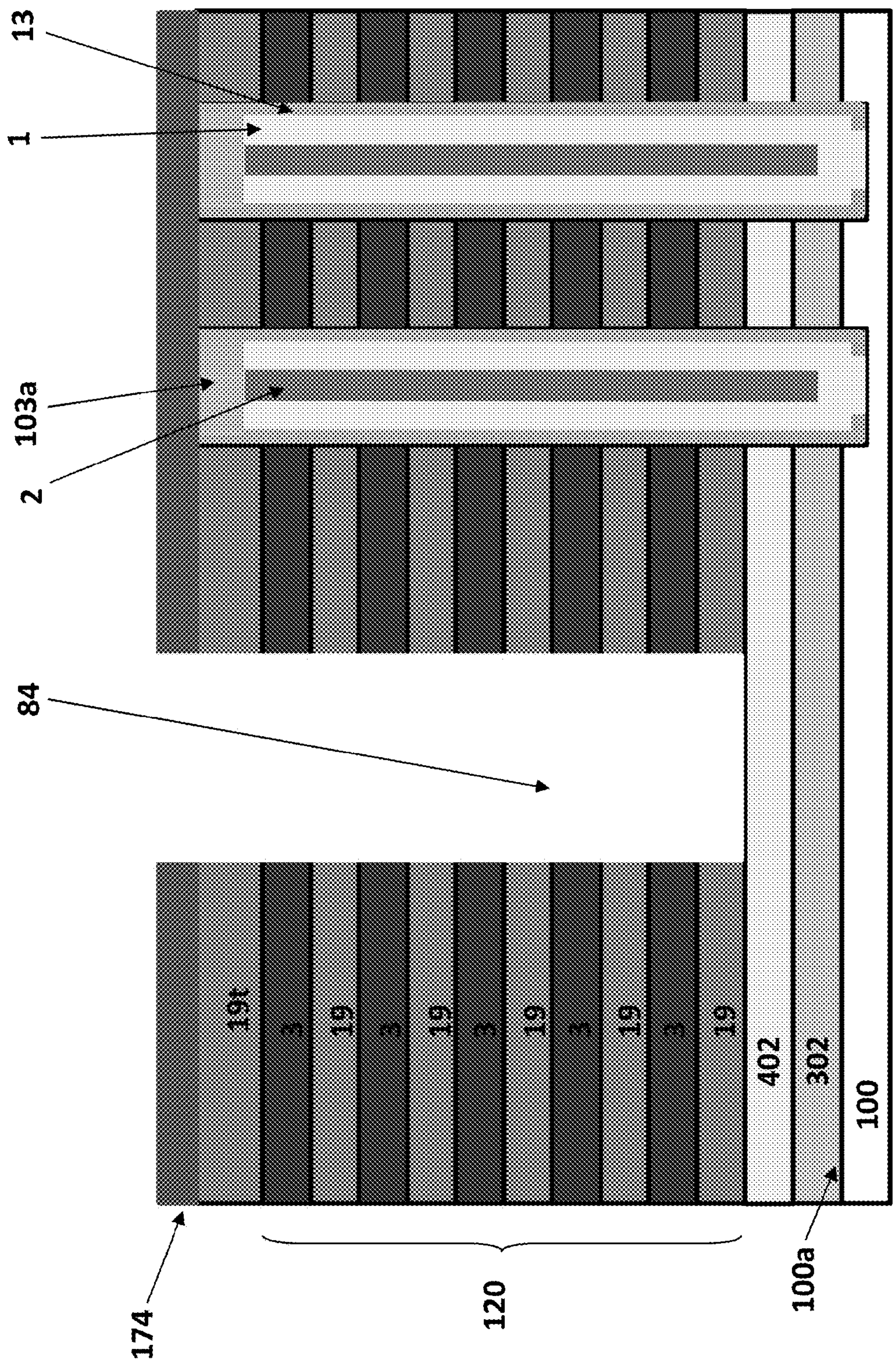

Then, as shown in FIG. 64, the portion 183 of the metal or metal alloy control gate material is removed by anisotropic etching from the back side openings (e.g., trenches) 84 and from over layer 174 without removing the control gate electrodes 3 to complete the formation of the control gate electrodes 3. Select gate electrodes (not shown for clarity) may be formed above and below the control gate electrodes at the same time or during a different step.

Figure 65:
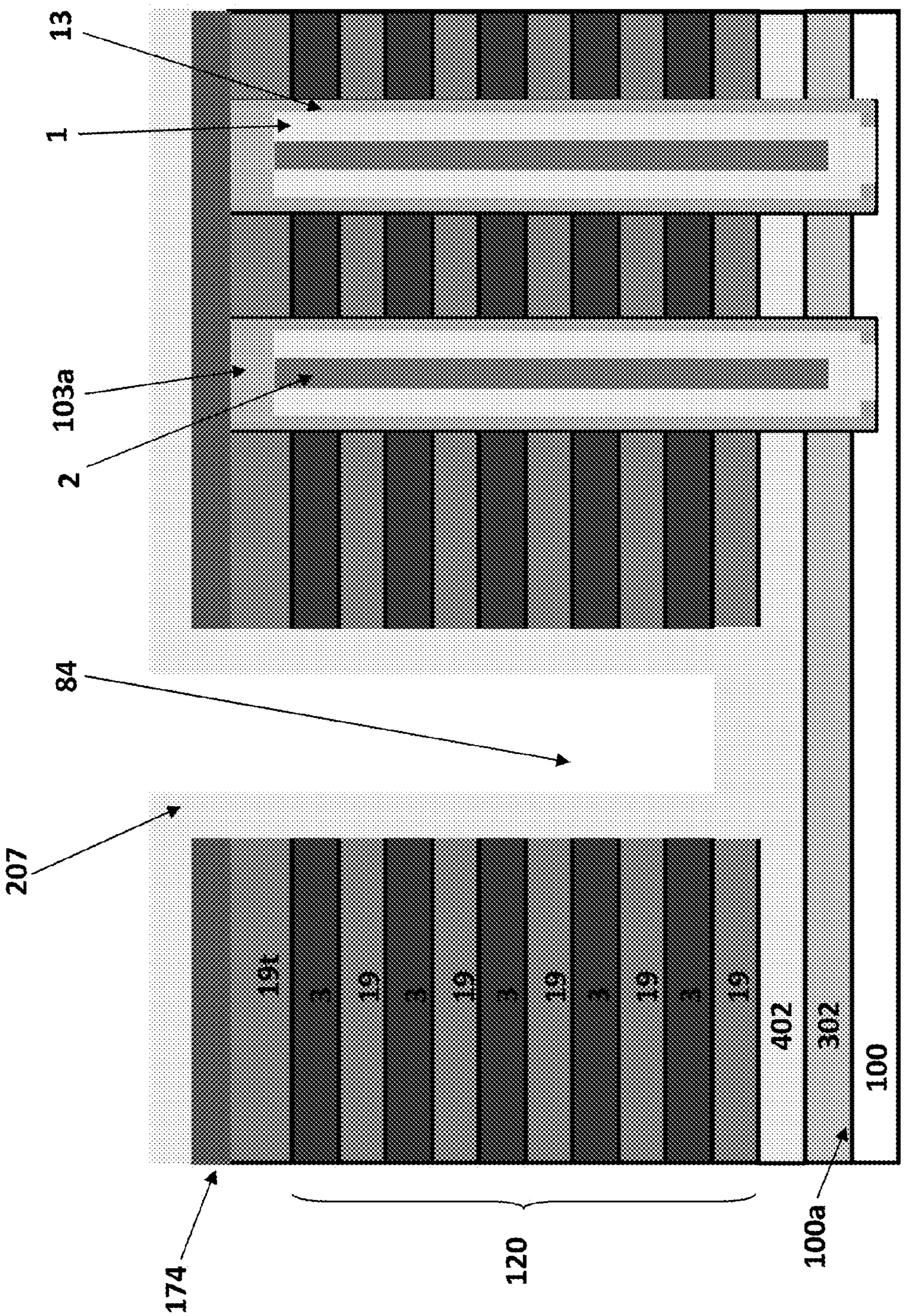
Figure 66:
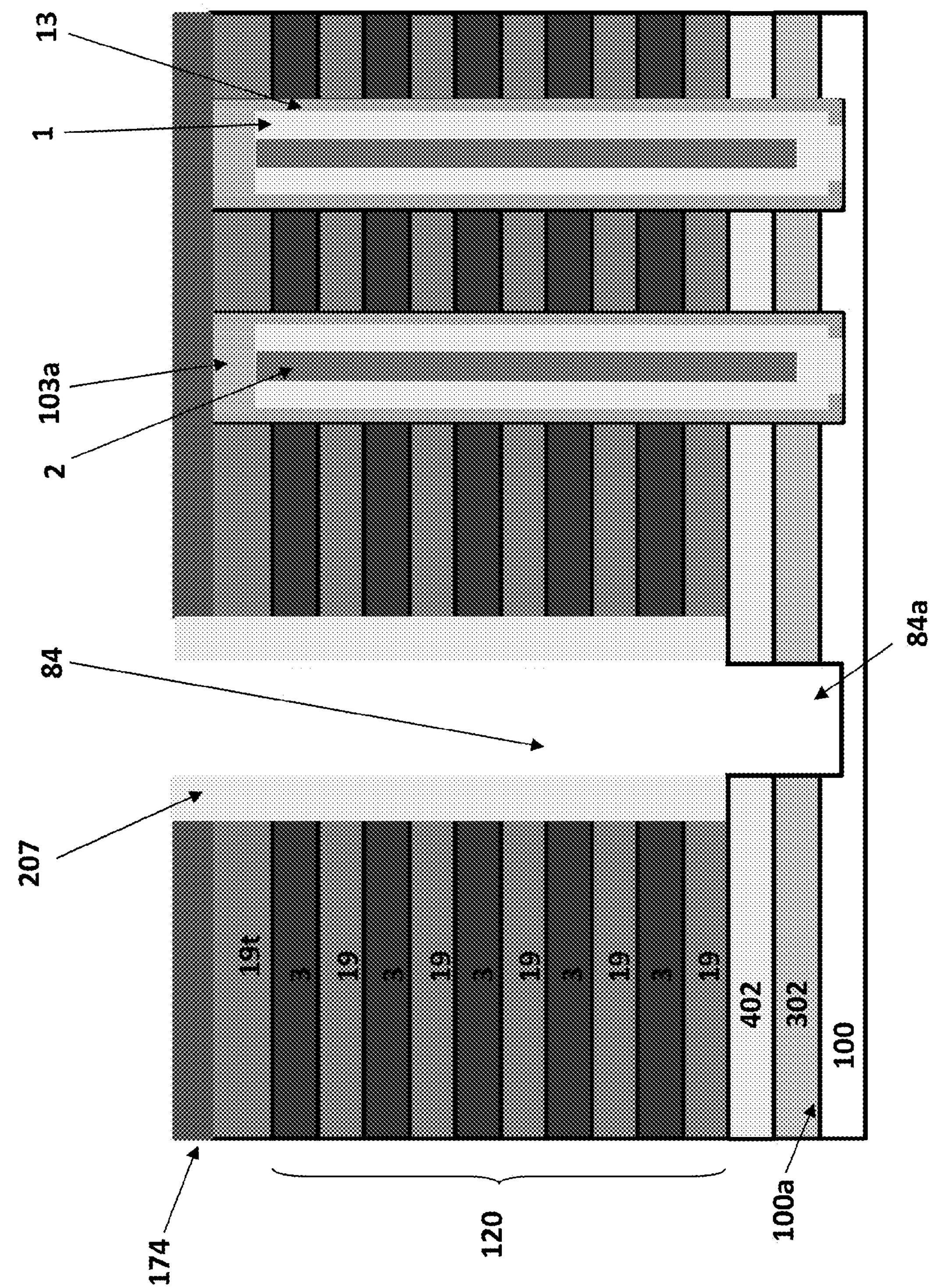

A protective layer 207, such as a polysilicon or amorphous silicon layer, is formed on sidewalls and bottom of the back side trenches 84, as shown in FIG. 65. Layer 207 is also formed over layer 174. The protective layer 207, etch stop layer 402, sacrificial layer 302, and part of the substrate 100 are then removed from the bottom 84*a* of the back side trench 84 by anisotropic etching (e.g., by RIE spacer etch) or a masked etch without removing the insulating layer from the sidewalls of the trench 84, as shown in FIG. 66. This etching step exposes the substrate 100 through the bottom 84*a* of the trench 84. If a mask is used, the protective layer 207 remains over the layer 174.

Figure 67:
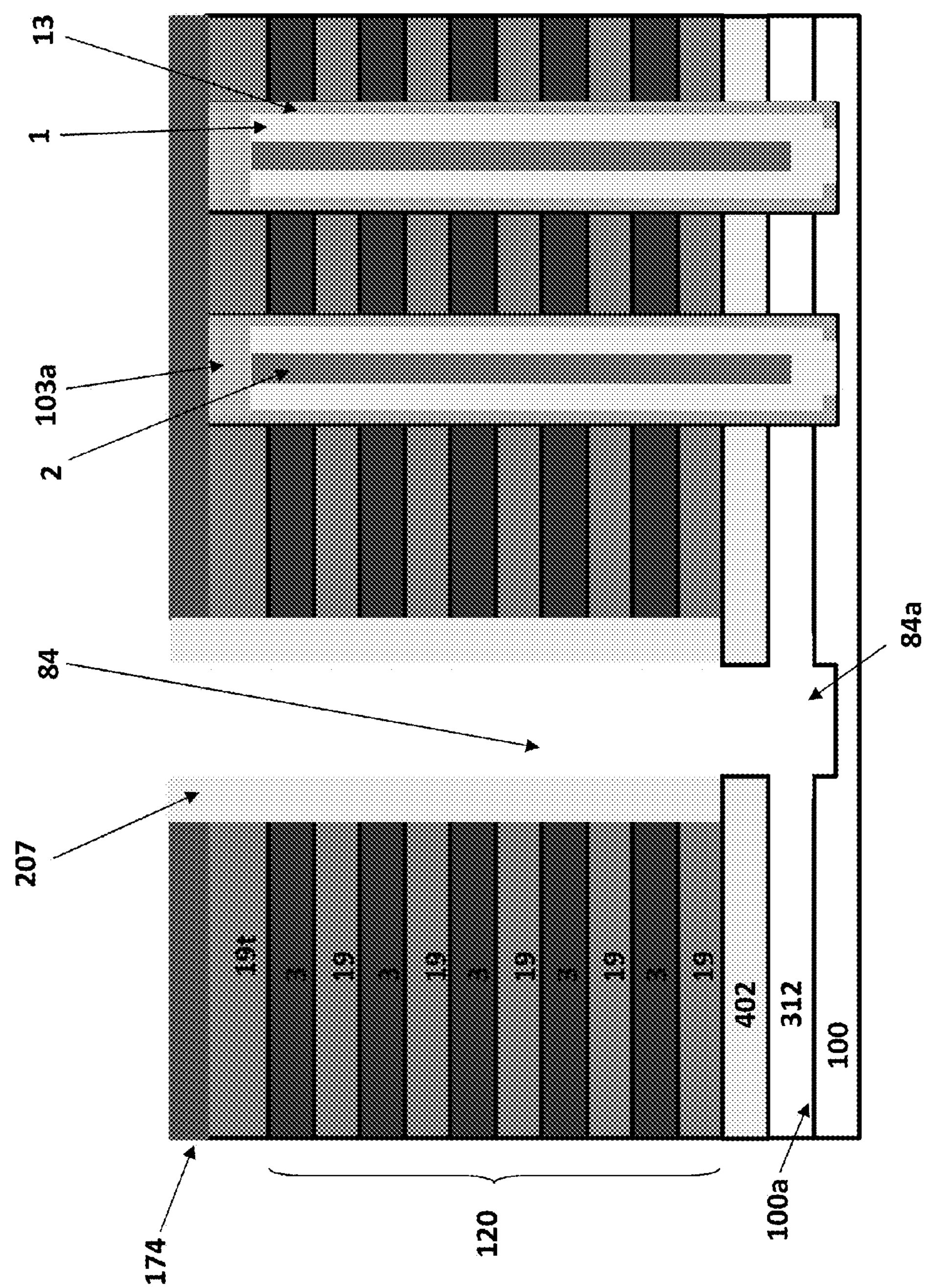

The sacrificial layer 302 is then removed through the back side openings 84 to form source line recesses 312 between the substrate 100 and the etch stop layer 402, as shown in FIG. 67. Sacrificial layer 302 may be removed by selective etching, such as a selective wet etch, e.g., a silicon nitride selective etching which removes the silicon nitride sacrificial layer 302 but does not remove the silicon oxide layers 174, 19 and 7 or the silicon regions (e.g. polysilicon etch stop layer 402, protective layer 207, or the substrate 100). The selective etch may stop on the oxide blocking dielectric, such as a silicon oxide blocking dielectric 7 which forms the outer part of the memory film 13, and/or the etch stop layer 402. The support column 173 described above and the memory film 13 support the etch stop layer 402 and prevents the etch stop layer 402 and the stack 120 from collapsing on the substrate 100.

Figure 68A:
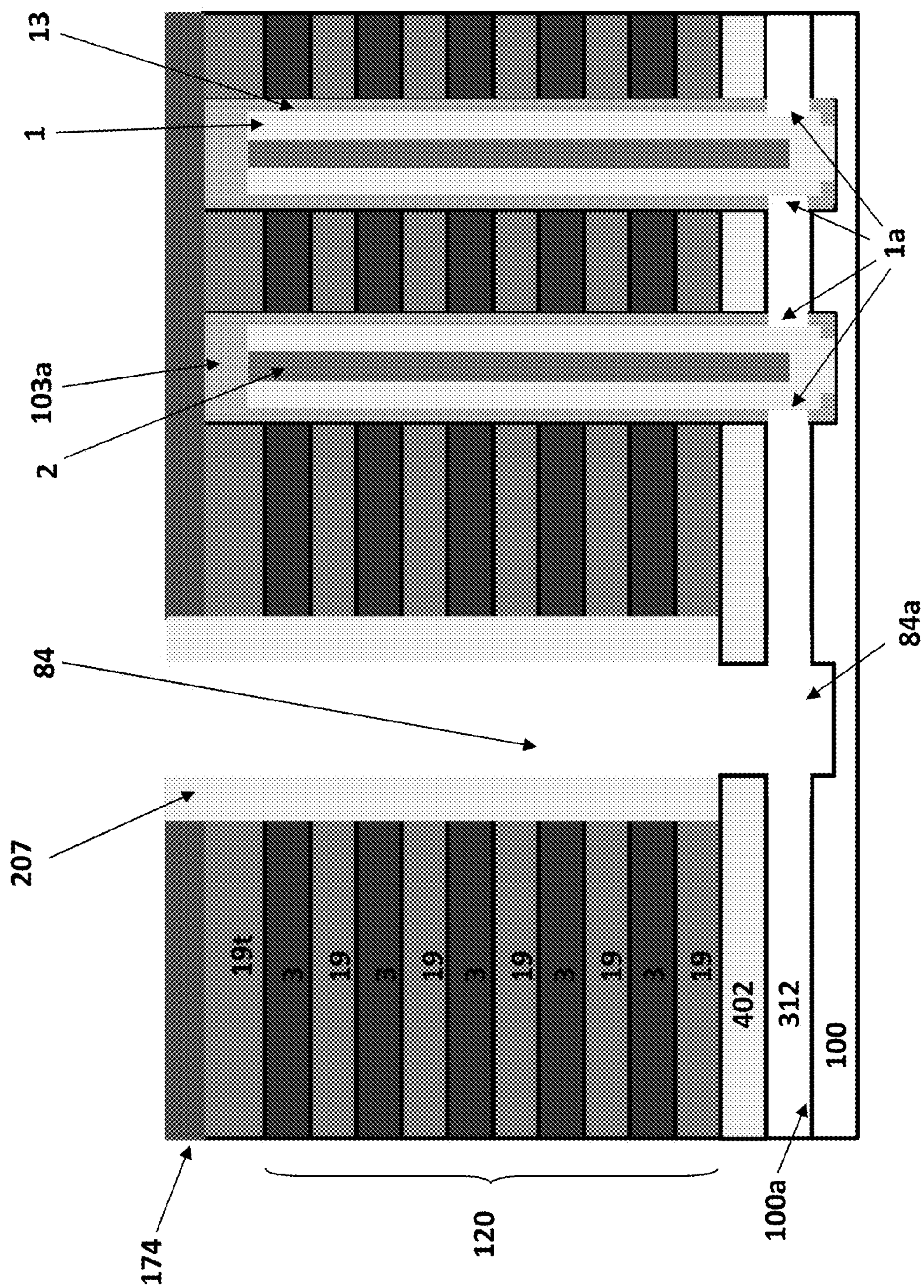
Figure 68B:
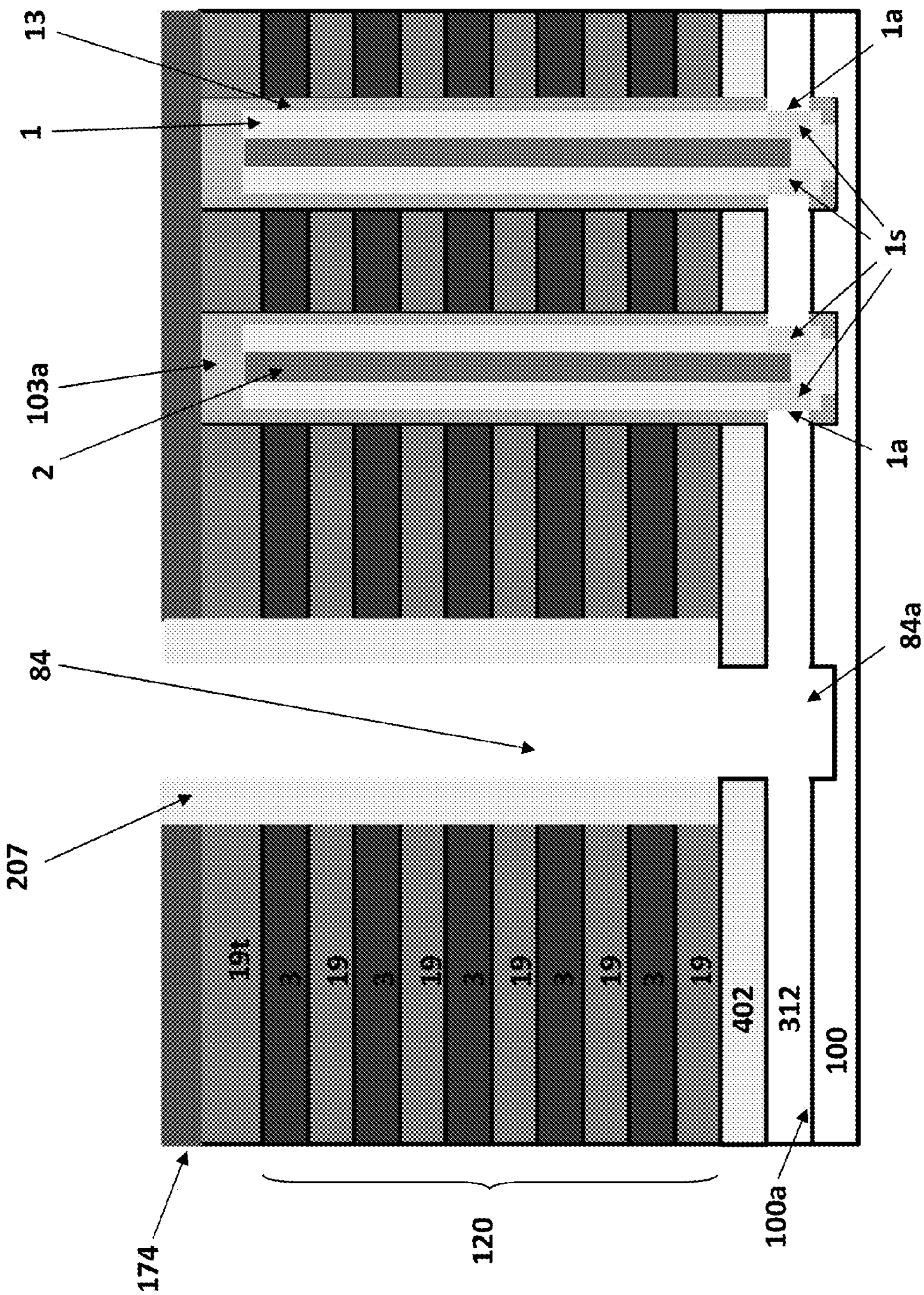

The memory film 13 is also removed through the back side openings 84 to expose at least a sidewall 1*a* of the channel 1, as shown in FIG. 68A. The memory film 13 can be removed in the same step as removing the sacrificial layer 302, or the memory film 13 can be removed in a separate step. In one embodiment, an isotropic wet etch is used to remove both the sacrificial layer 302 and memory film 13 in the same step.

Figure 79:
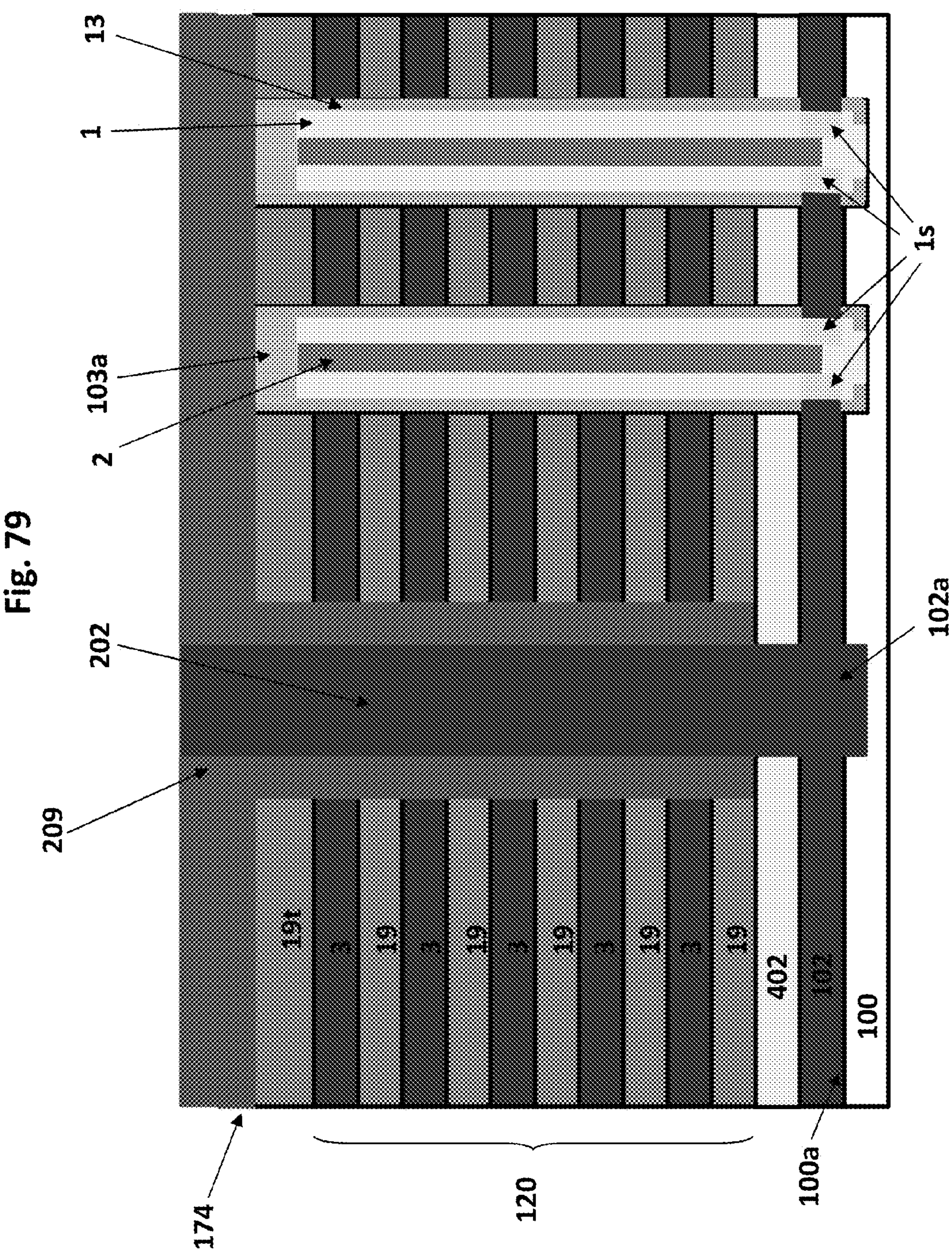

In some embodiments, the exposed sidewall 1*a* of the channel 1 is doped n-type (e.g. opposite type to the p-type channel regions) using n-type plasma doping to form n-type doped source regions 1*s* in the sidewall 1*a*, followed by a post-doping annealing process, as shown in FIG. 68B. The plasma doping method includes providing a plasma of the n-type dopant of source regions 1*s* through the source line recess 312 and the back side opening 84 to the channel sidewall 1*a*. The source line 102 will be formed subsequently to contact the source regions 1*s*, as shown in FIG. 79 and described below.

Figure 78:
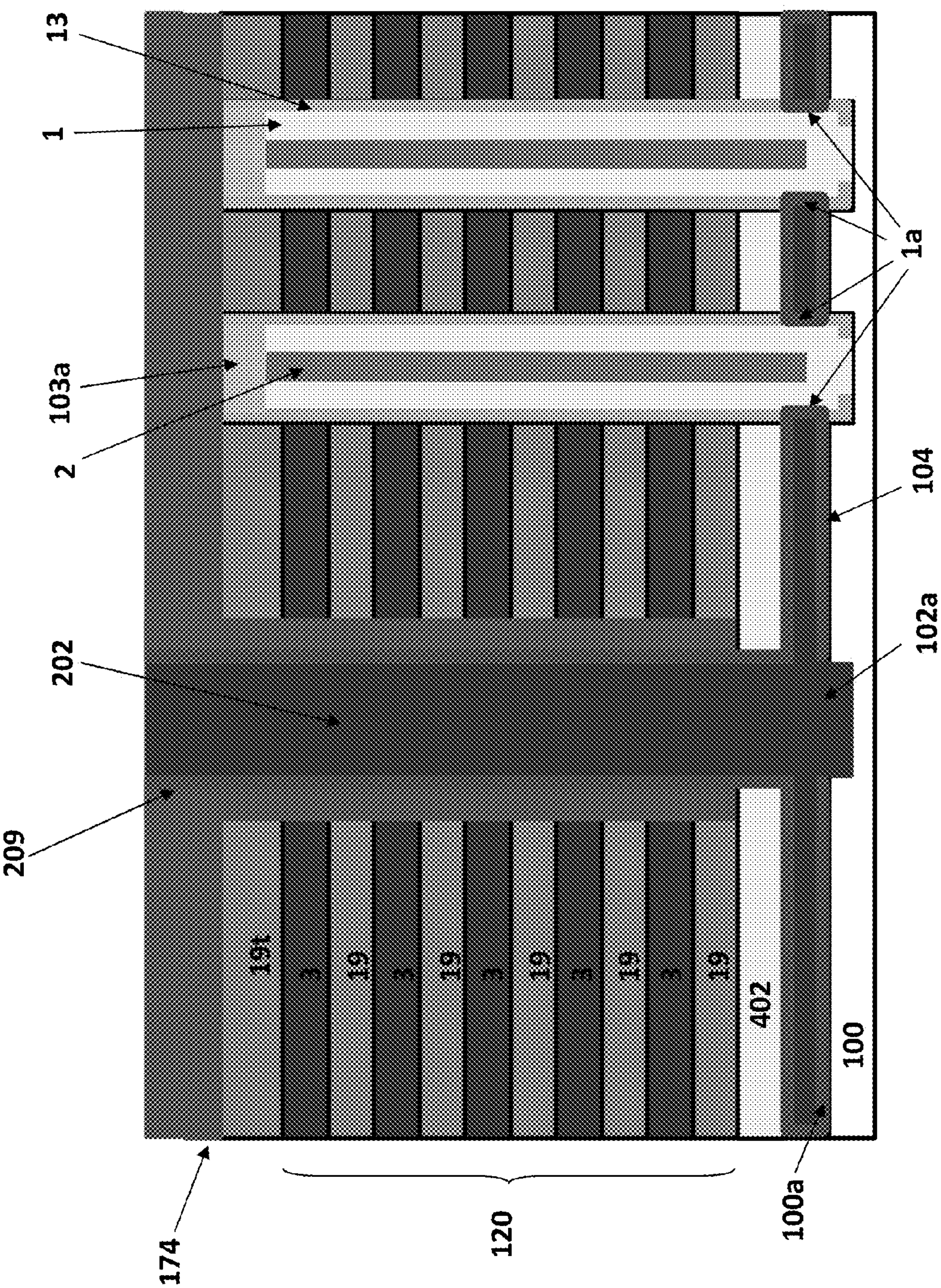

In further embodiments, n-type doped amorphous silicon contact layer 104 is deposited into the source line recess 312 and back side opening 84 prior to forming the source line 102 to further reduce the contact resistance of the source line, as shown in FIG. 78. The metal source line 102 is then deposited over the amorphous silicon contact layer 104 into the source line recess 312 and the back side opening 84 as shown in FIG. 78. In some embodiments, a thermal anneal is performed after depositing the source line 102 to form an alloy (e.g. metal silicide) between the silicon contact layer 104 and the metal source line 102. In one embodiment, the source line 102 is tungsten and the thermal anneal forms a $WSi_x$ source line 102. The entire silicon contact layer 104 and/or the entire metal source line 102 may be consumed during the reaction and converted to $WSi_x$. Alternatively, only part of the silicon contact layer 104 and/or metal source line 102 are consumed and converted to metal silicide, and some metal (e.g. tungsten) and/or silicon remain in the final device to form a source line 102 that contains a metal silicide and one or both of silicon and/or metal. The remaining amorphous silicon of the silicon contact layer 104 may be partially or wholly converted to polycrystalline silicon during the thermal treatment.

Figure 69:
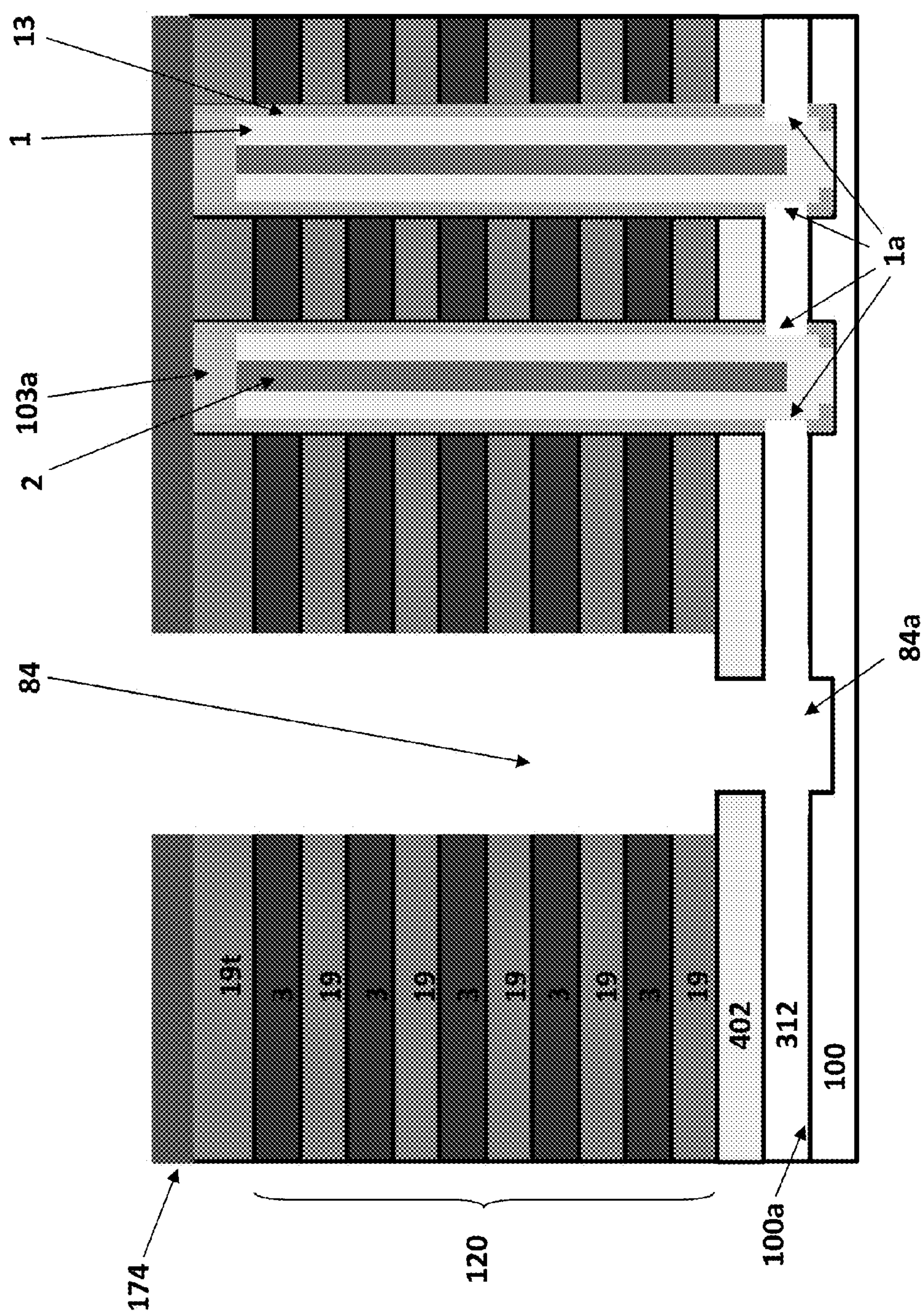

The protective layer 207 is then removed from the back side opening 84, as shown in FIG. 69. The protective layer 207 covering the silicon oxide layer 174 would be removed in this step if the protective layer 207 was masked in the etch step illustrated in FIG. 66. In one embodiment, the protective layer 207 is amorphous silicon, and is removed with an amorphous silicon spacer removal etch.

Figure 70:
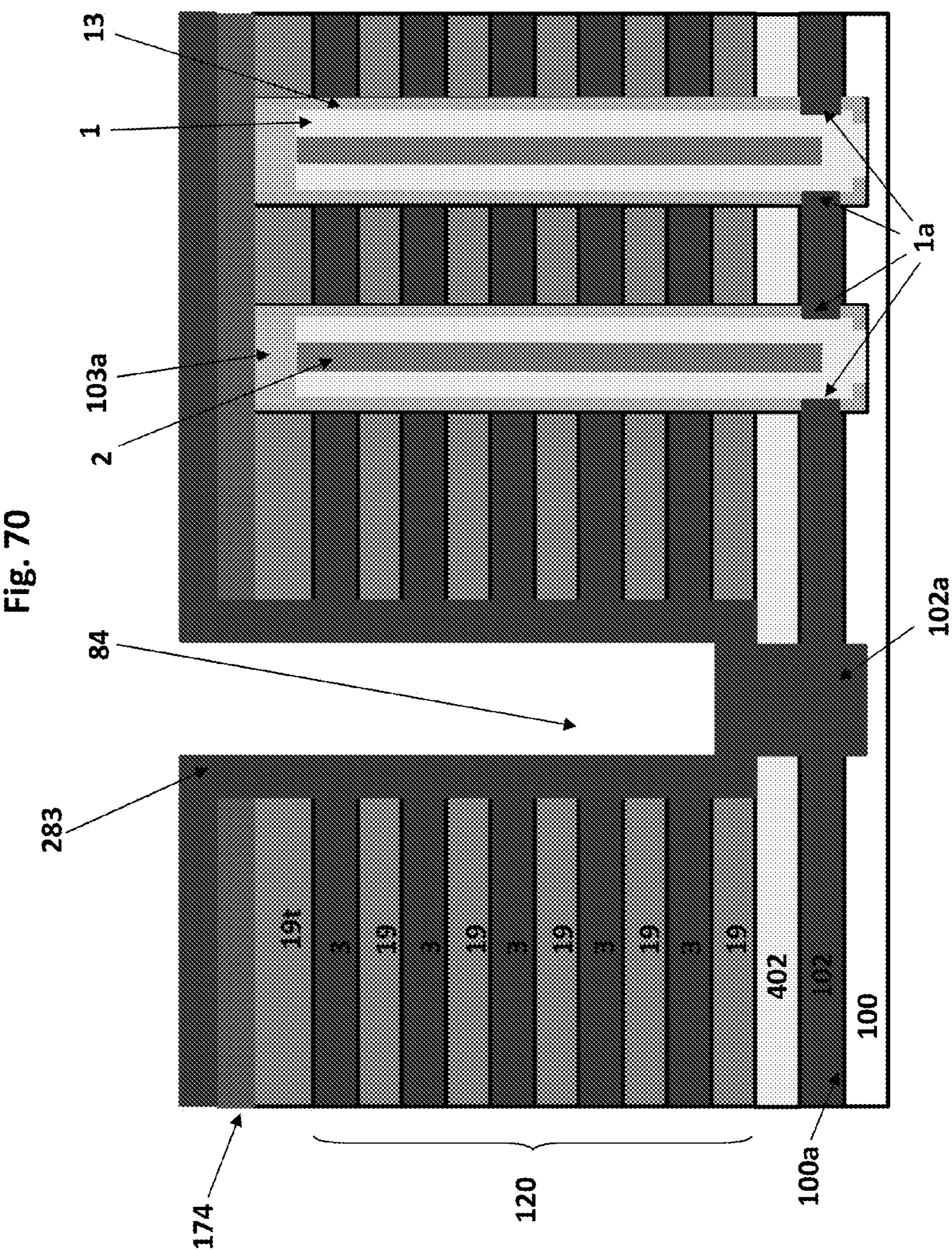

Metal or metal alloy source line 102 is then formed in the source line recess 312 through the back side openings 84, as shown in FIG. 70. A portion 283 of the metal or metal alloy source line material partially or fully fills the back side openings (e.g., trenches) 84 and is located over layer 174. A portion 102*a* of the metal or metal alloy source line material fills the bottom 84*a* of the trench 84. The source line 102 material may comprise any suitable materials described above with respect to FIG. 2. For example, the material may comprise a TiN liner and tungsten gate material, ruthenium, or other low resistive metal.

Figure 71:
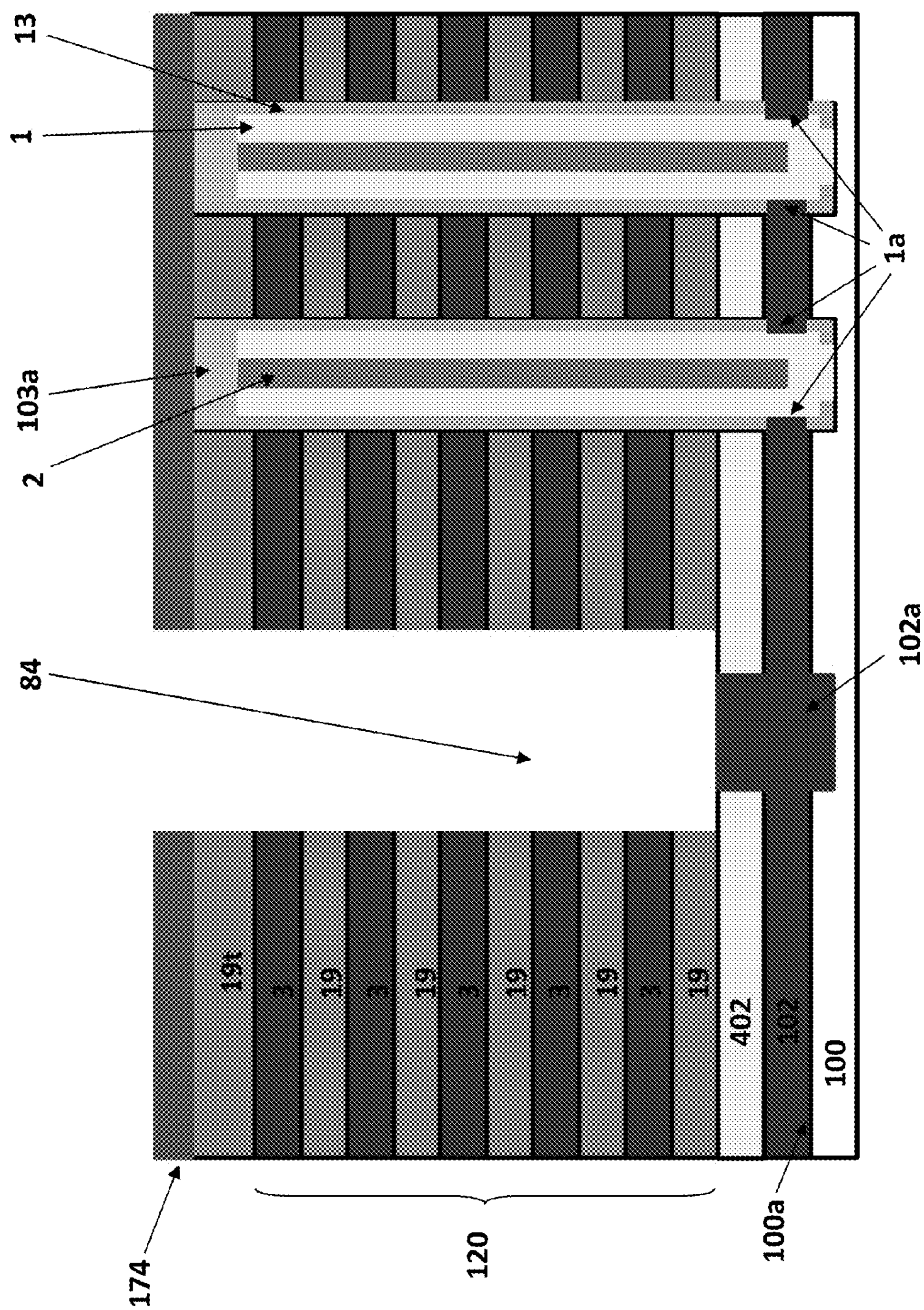

Then, as shown in FIG. 71, the portion 283 of the metal or metal alloy source line material is removed by anisotropic etching from the back side openings (e.g., trenches) 84 and from over layer 174 without removing the source line 102 or the portion 102*a*.

Figure 72:
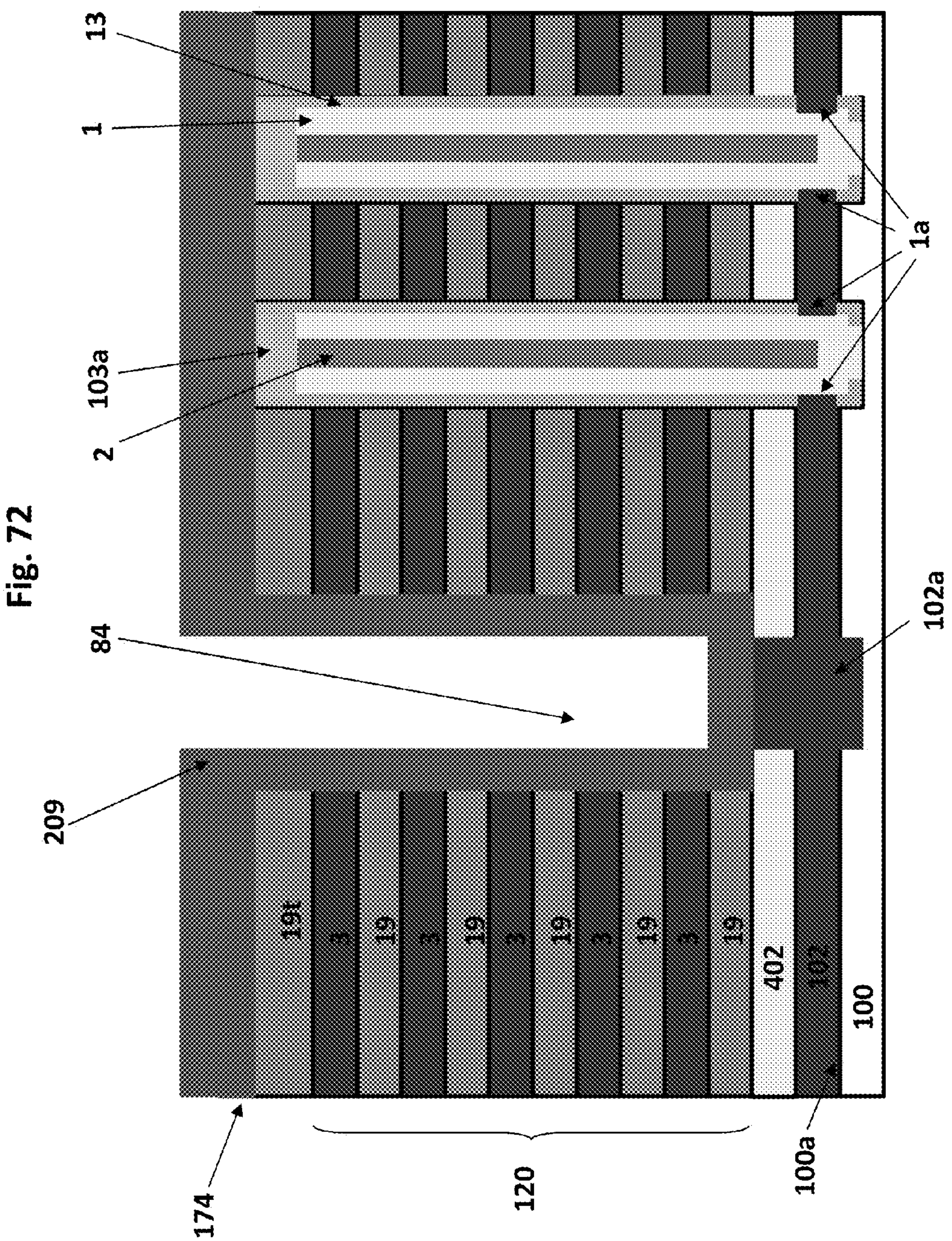
Figure 73:
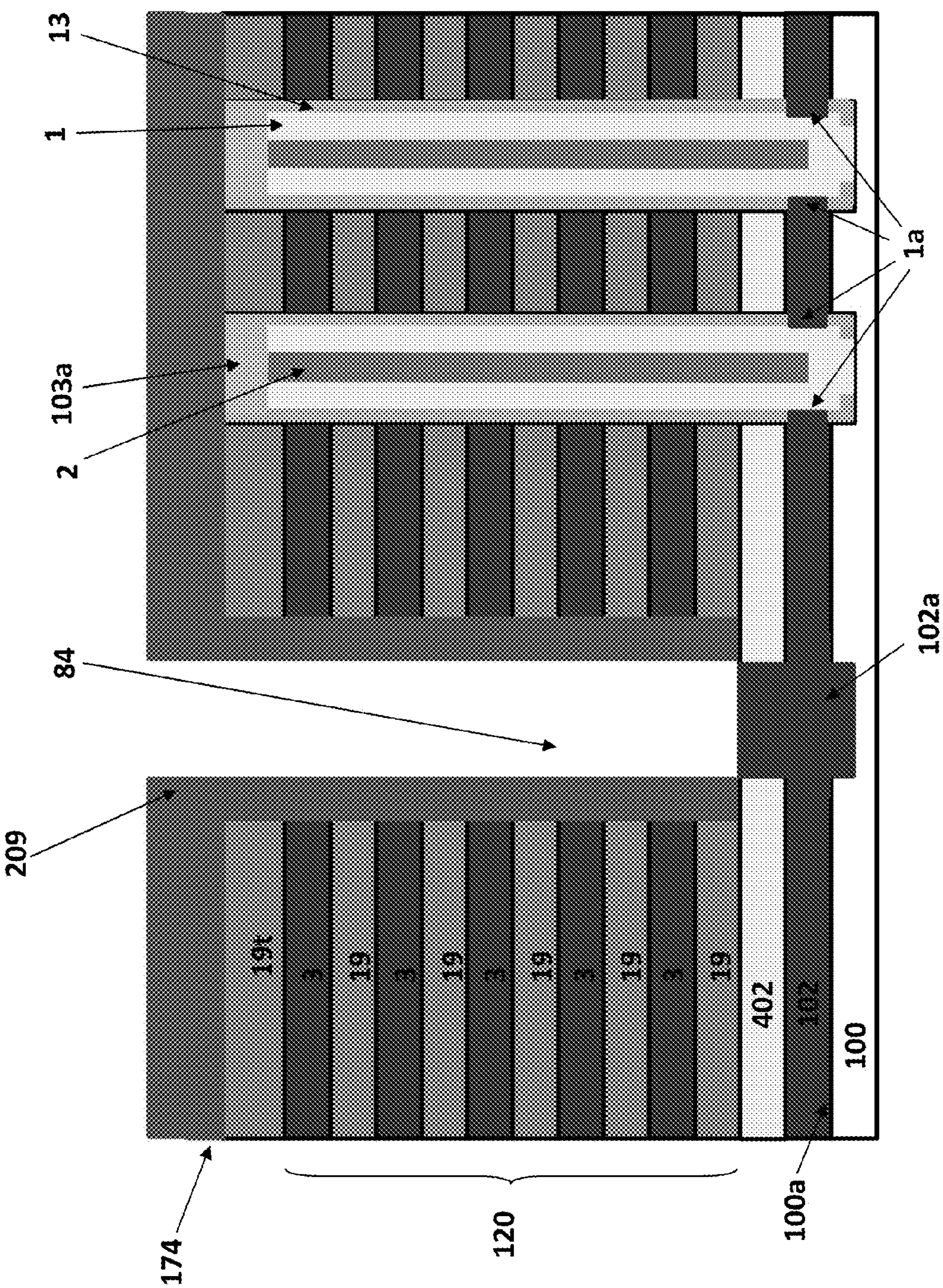

An insulating layer 209, such as a silicon oxide layer, is formed on sidewalls and bottom of the back side trenches 84, as shown in FIG. 72. Layer 209 is also formed over layer 174. The insulating layer 209 is then removed from the bottom 84*a* of the back side trench 84 by anisotropic etching (e.g., by RIE spacer etch) without removing the insulating layer from the sidewalls of the trench 84, as shown in FIG. 73. This etching step exposes the portion 102*a* of the source line 102 through the bottom 84*a* of the trench 84. In some embodiments, a portion of the layer 209 over the layer 174 is removed, for example if this portion is unmasked.

Figure 74:
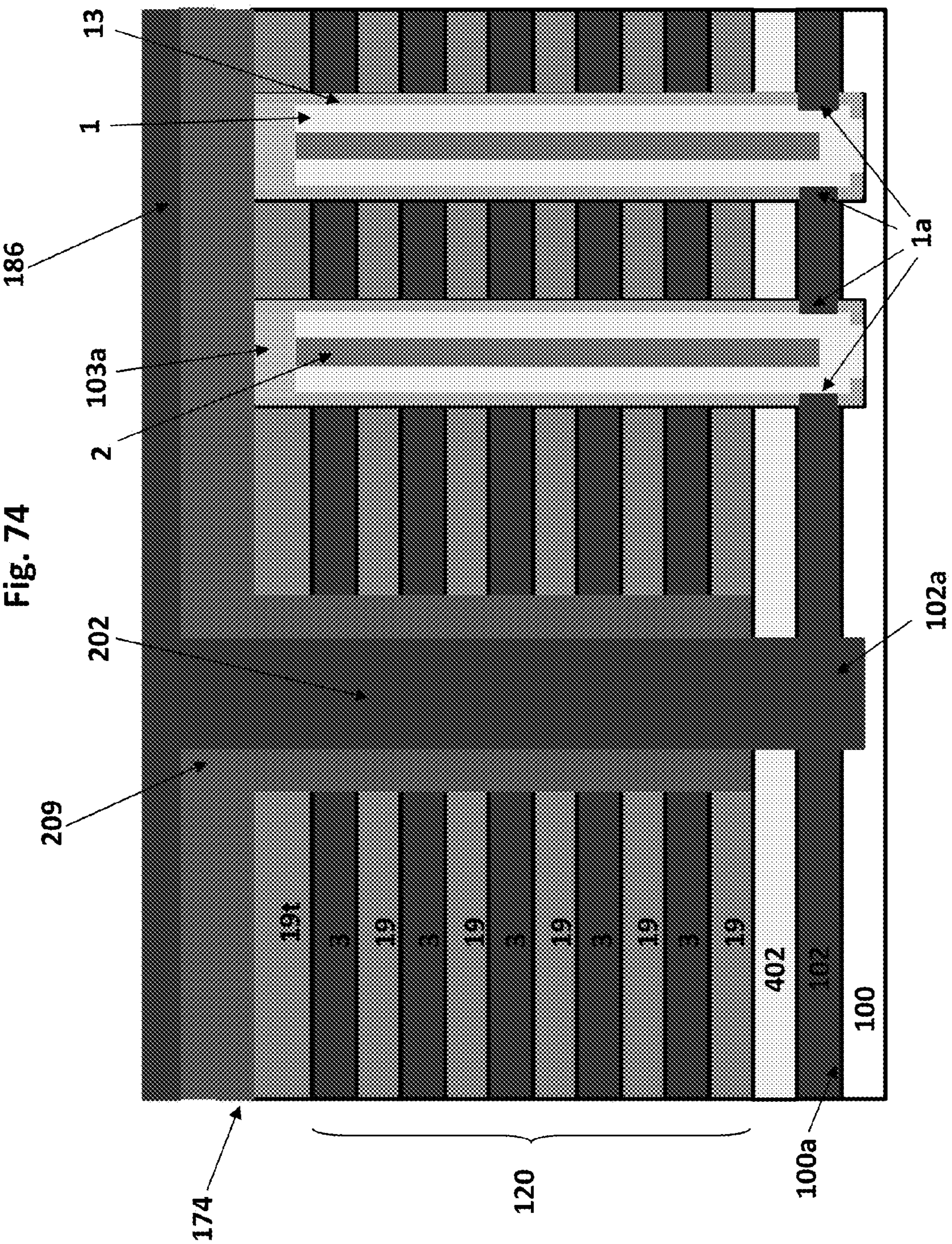

The source electrode 202 is then formed in the back side trench 84 in contact with the portion 102*a* of the source line 102, as shown in FIG. 74. The source electrode 202 may be formed by depositing any suitable metal or metal alloy layers, such as TiN, ruthenium, and/or tungsten over layer 209 and/or layer 174 in the trenches 84. A portion 186 of the source electrode material located over the device is removed by CMP or etching to leave the source electrode 202 in the dielectrically insulated trenches 84, as shown in FIG. 75.

Figure 75:
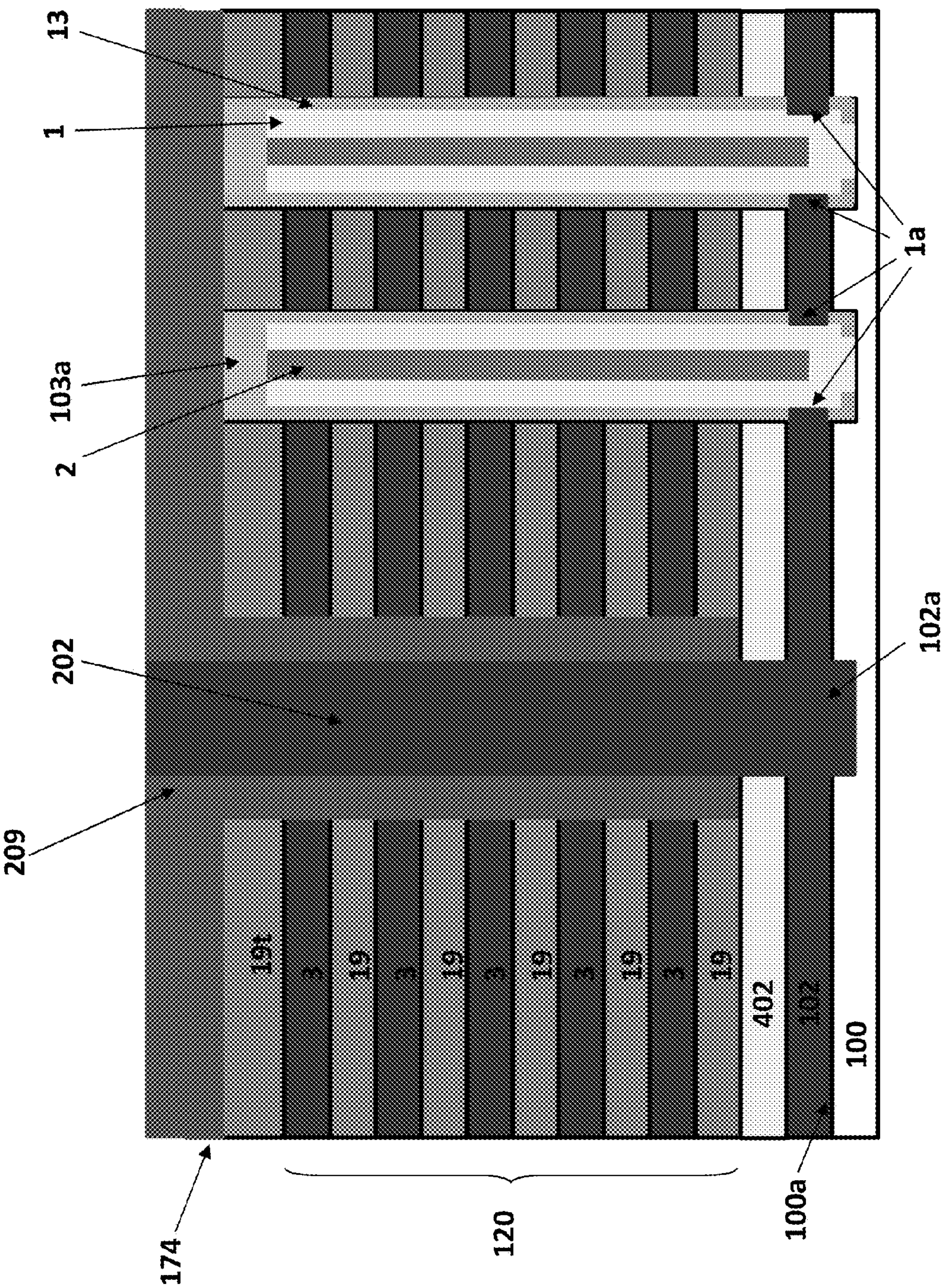
Figure 76:
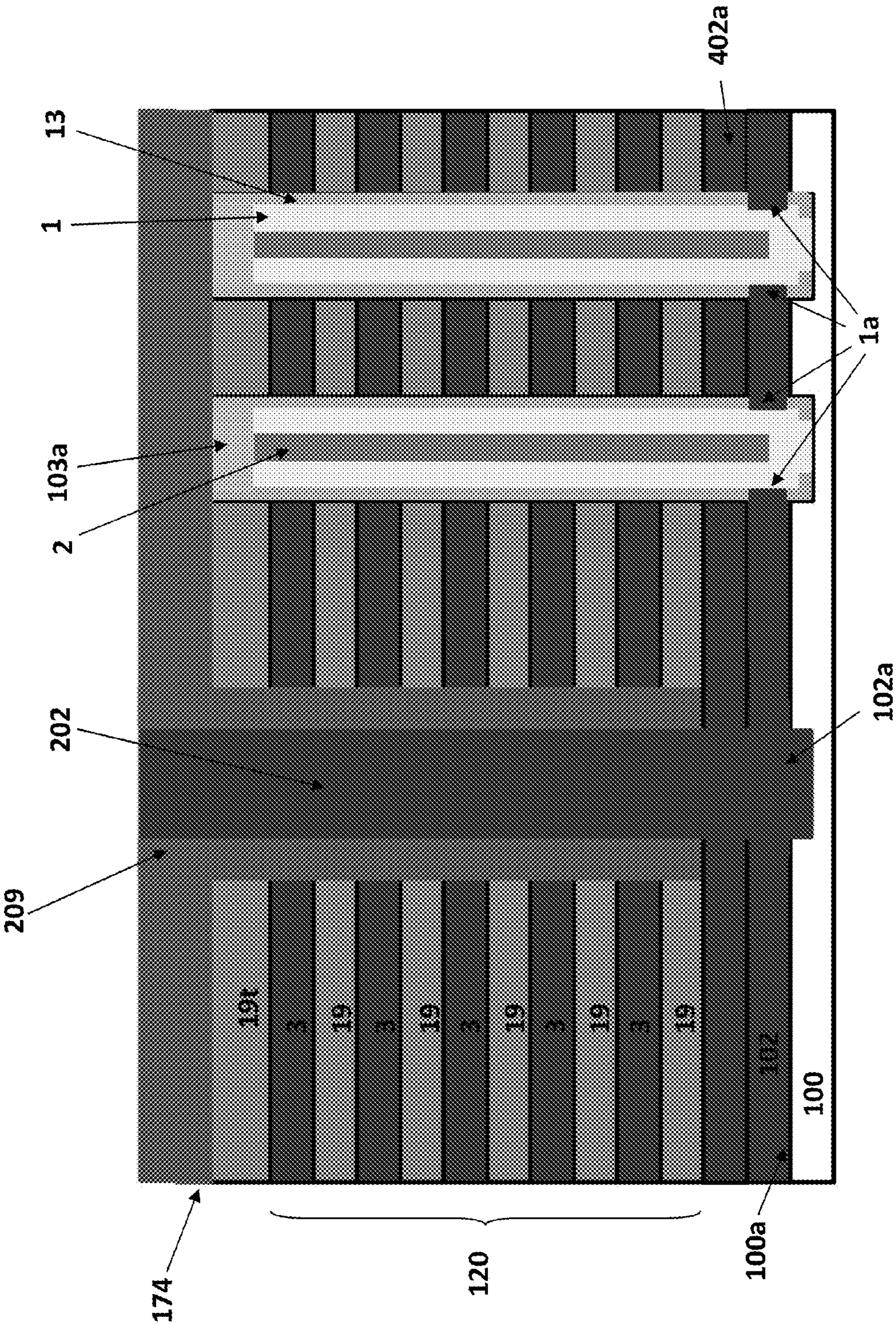

As shown in FIG. 75, the etch stop layer 402 remains as part of the NAND memory cell. In an alternative embodiment, the etch stop layer 402 (e.g., polysilicon) may be removed and replaced with a metal or metal alloy material, for example tungsten or ruthenium. Starting from the device shown in FIG. 70, the portion 102*a* of the source line 102 in the bottom portion 84*a* of the trench 84 is subject to an anisotropic etch to form a trough that exposes at least a portion of the etch stop layer 402. The polysilicon etch stop layer 402 is then removed, for example by a polysilicon selective wet etch, to form a void. The void and trench 84 can then be filled with a metal or metal alloy, for example tungsten or ruthenium 402*a*. FIG. 76 shows such a device after undergoing the steps illustrated in FIGS. 72-74. Openings are then formed to the drain regions 103*a*. Drain lines 103 and drain electrodes (i.e., bit lines) 203 may then be formed in contact with the drain regions 103*a* through the openings as shown in FIGS. 2B and 2C.

While formation of a portion of one memory block 400 is shown in FIGS. 5 to 76, it should be understood that the same method may be used to form one or more than one memory blocks 400 shown in FIGS. 4A, 4B, and 4C. The method to form the rest of the memory block 400 includes forming a second back side 84 trench, forming a second source electrode 202 in the second back side trench, and forming at least one row of front side memory openings 81, such as an least a 4×4 array of front side memory openings, between the first back side trench and the second back side trench. The method also includes forming a blocking dielectric 7 in each of the memory openings 81, forming a charge storage region 9 over the blocking dielectric in each of the memory openings, and forming a blocking dielectric 11 over the charge storage region in each of the memory openings. The method also includes removing the blocking dielectric, the charge storage region and the tunnel dielectric from the bottom of each of the memory openings 81, forming a semiconductor channel in each of the memory openings having a bottom side 1*b* and/or a sidewall 1*a* in contact with the source line 102.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a semiconductor device, comprising:

forming a conductive source line that extends substantially parallel to a major surface of a substrate;

forming a stack of alternating layers of a first material and a second material over the conductive source line;

etching the stack to form a plurality of memory openings in the stack to expose the conductive source line, wherein the plurality of memory openings extend substantially perpendicular to the major surface of the substrate;

forming a plurality of charge storage regions;

forming a tunnel dielectric over the charge storage regions; and forming a plurality of semiconductor channels over the tunnel dielectric in the respective plurality of memory openings in contact with the conductive source line.

2. The method of claim 1, wherein:

the substrate comprises a single crystal silicon substrate;

the semiconductor channel comprises amorphous silicon or polysilicon having a first conductivity type;

the conductive source line comprises a doped upper portion of the single crystal silicon substrate or a doped polysilicon layer having a second conductivity type and a higher doping concentration than the semiconductor channel;

the first material comprises silicon oxide; and the second material comprises silicon nitride.

3. The method of claim 1, further comprising forming a blocking dielectric in the plurality of memory openings prior to forming the plurality of charge storage regions such that the plurality of charge storage regions are formed on the blocking dielectric.

4. The method of claim 1, further comprising an insulating layer located between a silicon portion of the substrate and the conductive source line.

5. The method of claim 1, wherein the conductive source line acts as an etch stop layer during the step of etching the stack.

6. The method of claim 1, wherein the tunnel dielectric and the plurality of charge storage regions are formed in the plurality of memory openings.

7. The method of claim 6, wherein forming the plurality of semiconductor channels comprises:

forming a first semiconductor layer of a first conductivity type in the plurality of memory openings;

removing at least the tunnel dielectric and the first semiconductor layer from a bottom of the plurality of memory openings to expose the conductive source line; and forming a second semiconductor layer of the first conductivity type in the memory openings in contact with the conductive source line.

8. The method of claim 7, further comprising:

forming an insulating layer over the first semiconductor layer and second semiconductor layer in the plurality of memory opening;

recessing a top portion of the semiconductor channel and the insulating layer from an upper part of the plurality of memory openings; and forming a plurality of drain regions of the second conductivity type in the upper part of the plurality of memory openings above the recessed semiconductor channel.

9. The method of claim 8, further comprising:

etching the stack to form at least one first source electrode opening in the stack to expose the conductive source line, and removing the second material layers from the stack to form a plurality of recesses between the first material layers in the stack, wherein the first material layers comprise insulating layers.

10. The method of claim 9, further comprising forming a blocking dielectric on the first material layers and the charge storage regions exposed in the plurality of recesses, and forming a plurality of control gate electrodes in the plurality of recesses.

11. The method of claim 10, further comprising:

forming an insulating layer on side walls of the first source electrode opening; and forming a first source electrode in the first source electrode opening in contact with the conductive source line.

12. A method of making a semiconductor device, comprising:

forming a sacrificial source line that extends substantially parallel to a major surface of a substrate;

forming a stack of alternating layers of a first material and a second material over the sacrificial source line;

etching the stack to form a plurality of memory openings in the stack to expose the sacrificial source line, wherein the plurality of memory openings extend substantially perpendicular to the major surface of the substrate;

forming a plurality of charge storage regions;

forming a tunnel dielectric over the charge storage regions;

forming a plurality of semiconductor channels over the tunnel dielectric in the respective plurality of memory openings in contact with the sacrificial source line;

removing the sacrificial source line to form a source line recess; and forming a conductive source line in the source line recess in contact with the plurality of semiconductor channels.

13. The method of claim 12, further comprising forming a plurality of epitaxial silicon pillars prior to forming the stack of alternating layers of the first material and the second material, wherein the plurality of memory openings in the stack are located over the plurality of pillars.

14. The method of claim 12, further comprising forming an amorphous silicon contact layer in the source line recess prior to forming the conductive source line.

15. The method of claim 12, further comprising forming an etch stop layer over the sacrificial source line such that the stack of alternating layers of the first material and the second material is formed over the etch stop layer.

16. The method of claim 15, wherein the sacrificial source line comprises silicon nitride, the etch stop layer comprises polysilicon and the conductive source line comprises tungsten or ruthenium.

17. The method of claim 15, wherein:

the plurality of memory openings extend through the sacrificial source line into the substrate; and removing the sacrificial source line further removes the tunnel dielectric and the plurality of charge storage regions to expose one or more side portions of the plurality of semiconductor channels in the source line recess.

18. The method of claim 17, further comprising plasma doping the exposed one or more side portions of the plurality of semiconductor channels to form doped source regions.

19. The method of claim 17, further comprising:

etching the stack to form at least one first source electrode opening in the stack to expose the etch stop layer; and removing the second material layers from the stack to form a plurality of recesses between the first material layers in the stack, wherein the first material layers comprise insulating layers.

20. The method of claim 19, further comprising forming a blocking dielectric on the first material layers and the charge storage regions exposed in the plurality of recesses prior to forming the plurality of control gate electrodes.

21. The method of claim 19, further comprising forming a blocking dielectric in the plurality of memory openings prior to forming the plurality of charge storage regions in the plurality of memory openings.

22. The method of claim 19, further comprising forming a plurality of control gate electrodes in the plurality of recesses through the first source electrode opening.

23. The method of claim 19, further comprising:

forming a sacrificial masking layer on side walls and bottom of the first source electrode opening;

removing the sacrificial masking layer from the bottom of the first source electrode opening to expose the etch stop layer while retaining portions of the sacrificial masking layer on the side walls of the first source electrode opening;

extending the first source electrode opening though the etch stop layer to or through the sacrificial source line;

removing the sacrificial source line through the first source electrode opening to form the source line recess;

forming a conductive source line in the source line recess through first source electrode opening;

forming an insulating layer on side walls and bottom of the first source electrode opening;

removing the insulating layer from the bottom of the first source electrode opening to expose the conductive source line; and forming a source electrode in the first source electrode opening in contact with the conductive source line.

24. The method of claim 23, wherein the first source electrode opening extends through the sacrificial source line into the substrate.

25. The method of claim 23, wherein:

the plurality of semiconductor channels extend in the respective memory openings through the sacrificial source line into the substrate; and only the one or more side portions of the plurality of semiconductor channels contact the conductive source line.

* * * * *